United States Patent
Naito

(10) Patent No.: US 11,094,808 B2
(45) Date of Patent: Aug. 17, 2021

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 83 days.

(21) Appl. No.: 16/391,334

(22) Filed: Apr. 23, 2019

(65) Prior Publication Data

US 2019/0252533 A1 Aug. 15, 2019

Related U.S. Application Data

(63) Continuation of application No. PCT/JP2017/038825, filed on Oct. 26, 2017.

(30) Foreign Application Priority Data

May 31, 2017 (JP) .............................. JP2017-107702

(51) Int. Cl.
*H01L 29/739* (2006.01)
*H01L 29/10* (2006.01)
(Continued)

(52) U.S. Cl.
CPC ...... *H01L 29/7397* (2013.01); *H01L 21/8234* (2013.01); *H01L 27/06* (2013.01);
(Continued)

(58) Field of Classification Search
None
See application file for complete search history.

(56) References Cited

U.S. PATENT DOCUMENTS

2005/0263853 A1 12/2005 Tomomatsu
2007/0114598 A1 5/2007 Hotta
(Continued)

FOREIGN PATENT DOCUMENTS

JP H1197715 A 4/1999
JP H11251573 A 9/1999
(Continued)

OTHER PUBLICATIONS

International Search Report for International Patent Application No. PCT/JP2017/038825, issued/mailed by the Japan Patent Office on Dec. 12, 2017.
(Continued)

*Primary Examiner* — Alexander G Ghyka

(57) ABSTRACT

A semiconductor device includes a first trench section provided from an upper surface of a semiconductor substrate to inside the semiconductor substrate; a base region of a second conductivity type in direct contact with the first trench section between the upper surface of the semiconductor substrate and a drift region; a first accumulation region of a first conductivity type that is provided between the base region and the drift region and that has a higher doping concentration than the drift region; a second accumulation region of a first conductivity type that is provided at a position deeper than the first accumulation region and that has a higher doping concentration than the drift region; and an intermediate region of a second conductivity type that is provided between the first accumulation region and the second accumulation region, where the second accumulation region has a first opening section.

34 Claims, 33 Drawing Sheets

(51) Int. Cl.
  *H01L 29/861* (2006.01)
  *H01L 21/8234* (2006.01)
  *H01L 27/06* (2006.01)
  *H01L 29/78* (2006.01)
  *H01L 29/40* (2006.01)
  *H01L 29/06* (2006.01)

(52) U.S. Cl.
  CPC ........ *H01L 29/1095* (2013.01); *H01L 29/739* (2013.01); *H01L 29/78* (2013.01); *H01L 29/8613* (2013.01); *H01L 29/0623* (2013.01); *H01L 29/407* (2013.01)

(56) References Cited

U.S. PATENT DOCUMENTS

| | | |
|---|---|---|
| 2007/0267663 A1 | 11/2007 | Harada |
| 2008/0197379 A1 | 8/2008 | Aono |
| 2010/0090248 A1 | 4/2010 | Kouno |
| 2011/0140180 A1 | 6/2011 | Kitagawa |
| 2012/0146091 A1 | 6/2012 | Tanabe |
| 2016/0172471 A1 | 6/2016 | Hirabayashi |
| 2016/0293595 A1 | 10/2016 | Narazaki |
| 2017/0025410 A1 | 1/2017 | Cheng |
| 2017/0047319 A1 | 2/2017 | Naito |

FOREIGN PATENT DOCUMENTS

| | | |
|---|---|---|
| JP | 2005210047 A | 8/2005 |
| JP | 2005347289 A | 12/2005 |
| JP | 2007311627 A | 11/2007 |
| JP | 2008205015 A | 9/2008 |
| JP | 2008251620 A | 10/2008 |
| JP | 2010118642 A | 5/2010 |
| JP | 2010232627 A | 10/2010 |
| JP | 2011134861 A | 7/2011 |
| JP | 2011146682 A | 7/2011 |
| JP | 2012138567 A | 7/2012 |
| JP | 2014197702 A | 10/2014 |
| JP | 2015135954 A | 7/2015 |
| JP | 2016115766 A | 6/2016 |
| JP | 2016197678 A | 11/2016 |
| WO | 2016063683 A1 | 4/2016 |

OTHER PUBLICATIONS (ISA/237) Written Opinion of the International Search Authority for International Application No. PCT/JP2017/038825, issued/mailed by the International Bureau of WIPO on Dec. 12, 2017.

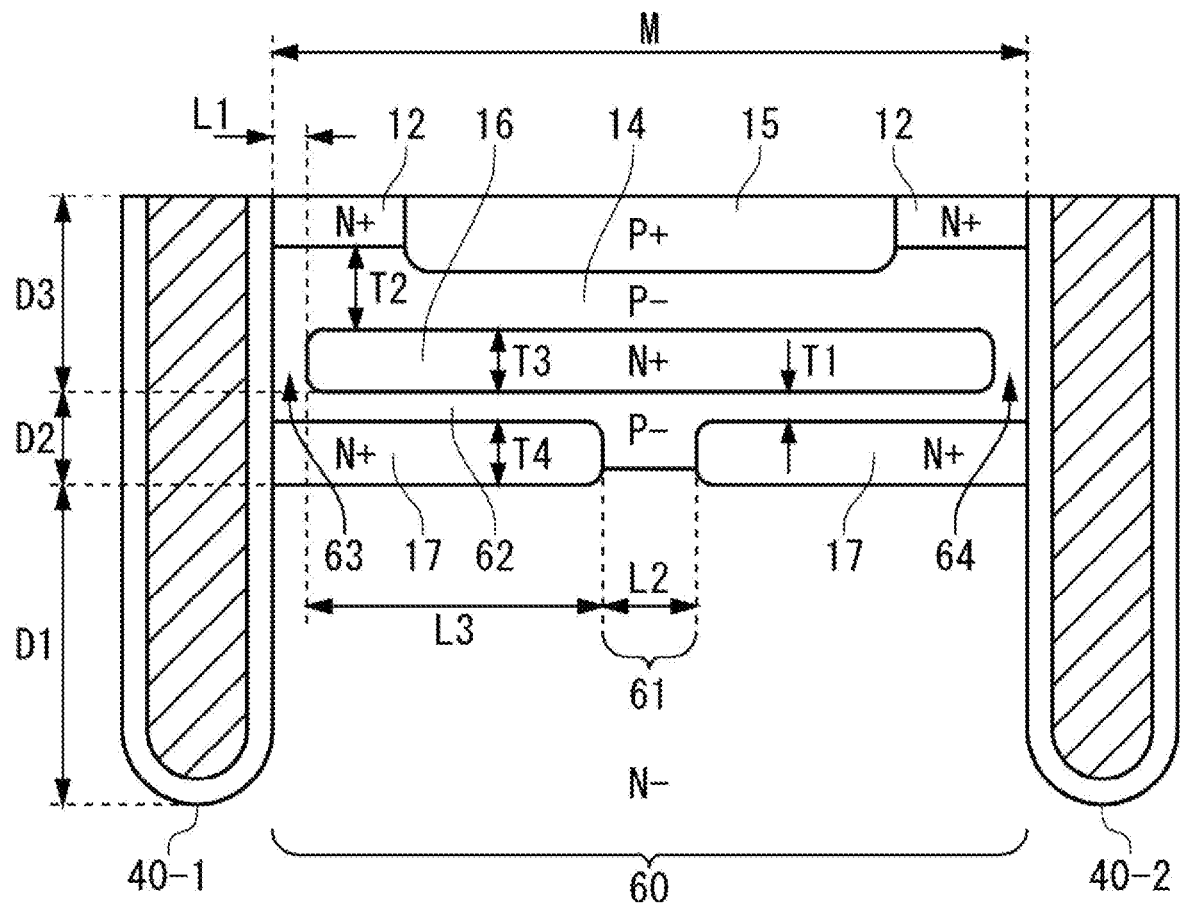
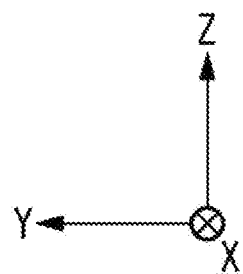
FIG. 4

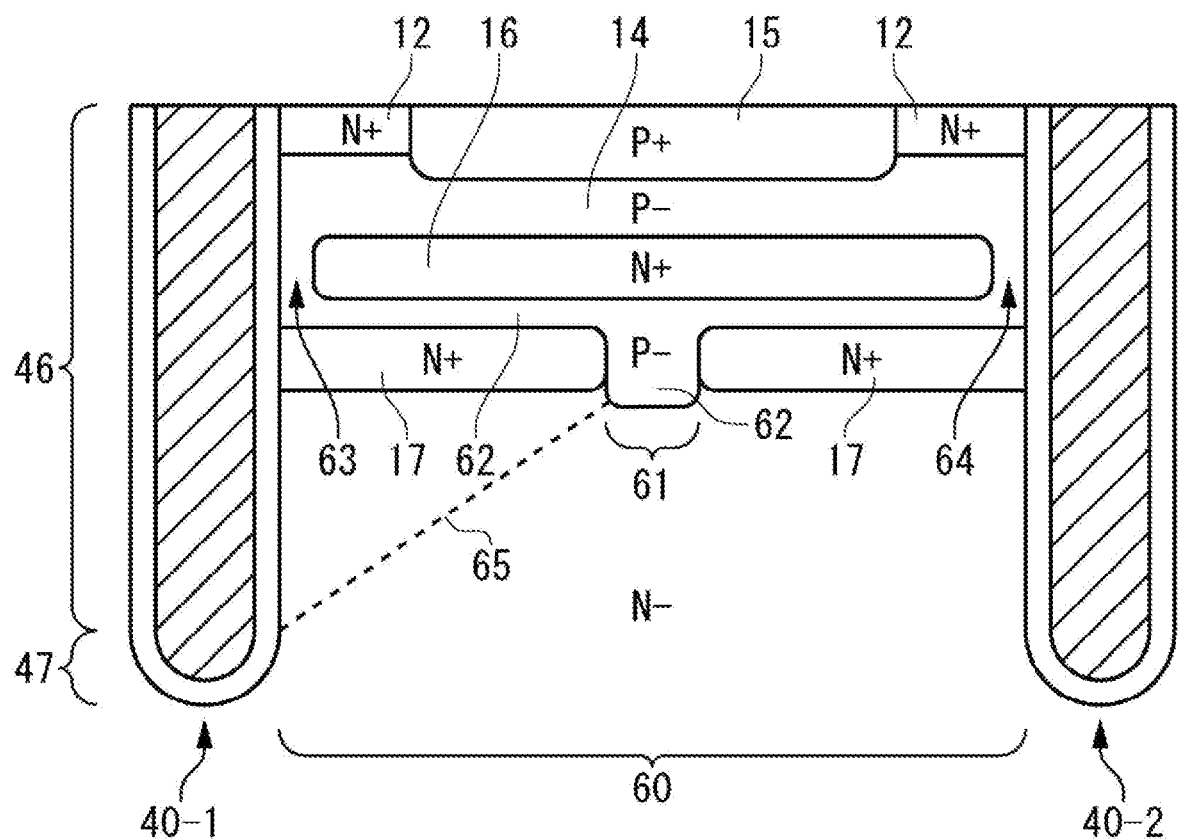
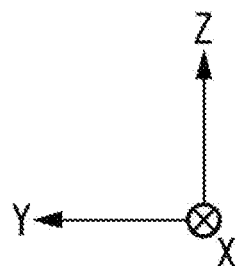
FIG. 5

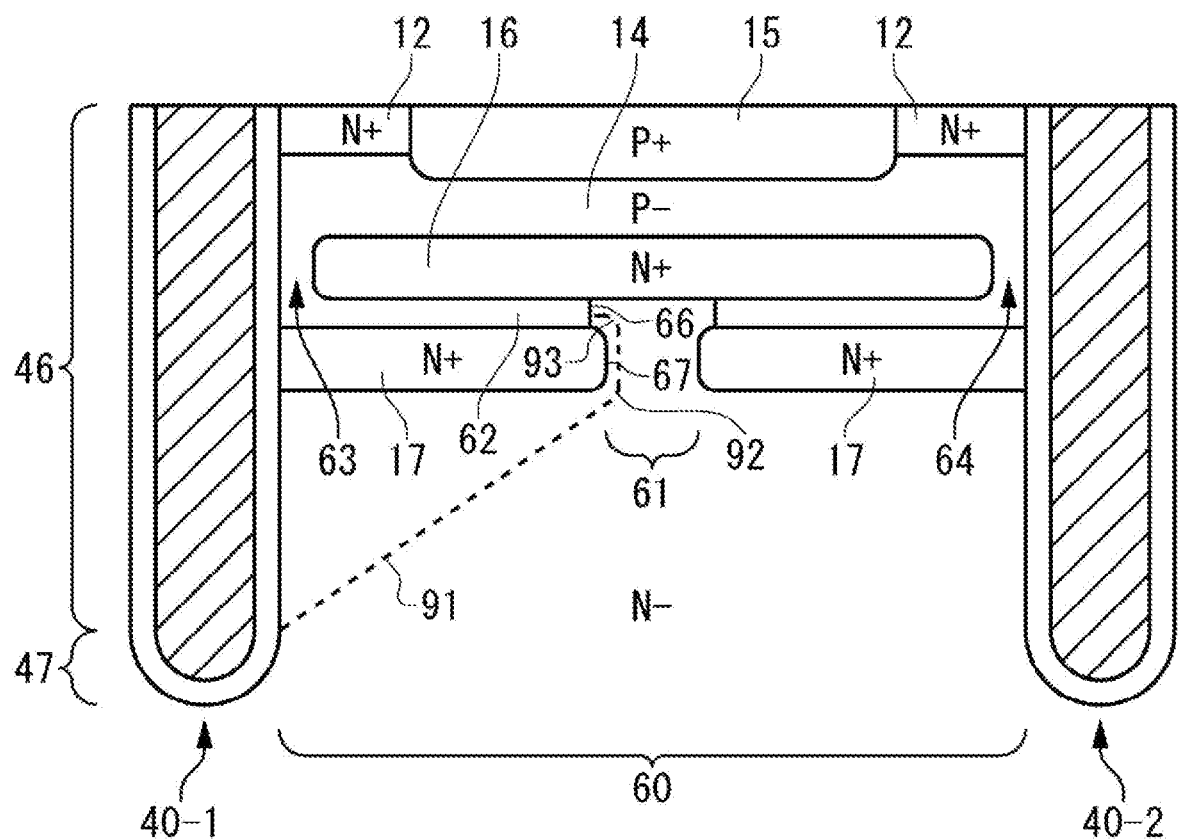
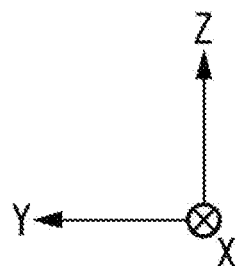
FIG. 6

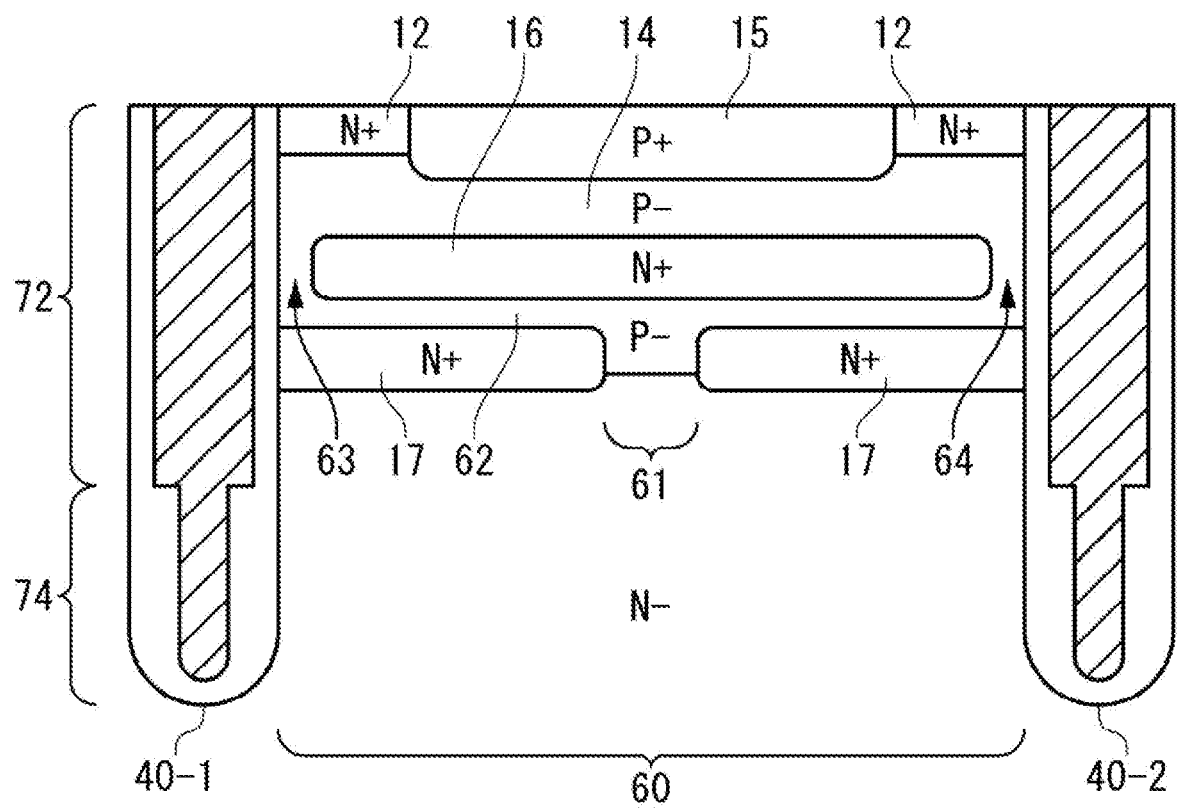
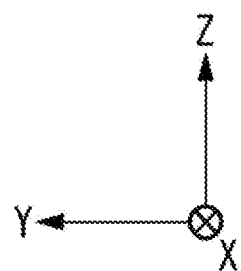
FIG. 13

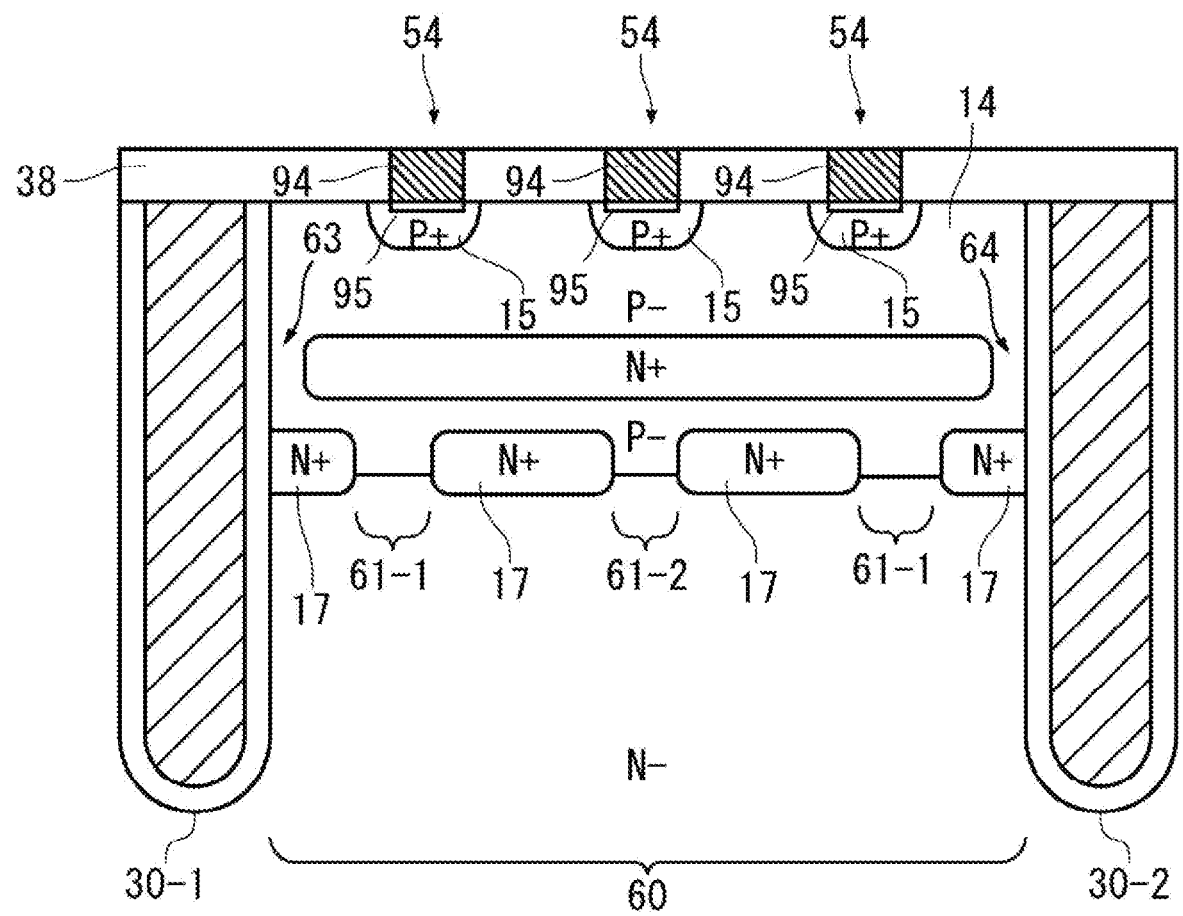
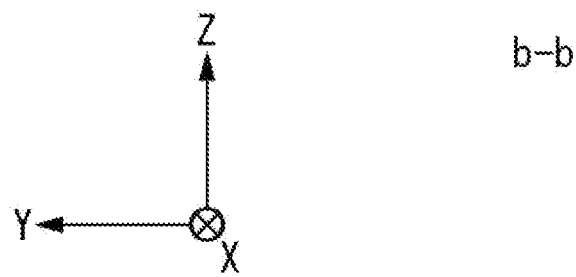
FIG. 24

SEMICONDUCTOR DEVICE

The contents of the following Japanese patent applications are incorporated herein by reference:
NO. 2017-107702 filed on May 31, 2017, and
NO. PCT/JP2017/038825 filed on Oct. 26, 2017.

BACKGROUND

1. Technical Field

The present invention relates to a semiconductor device.

2. Related Art

Conventionally, a configuration of a semiconductor device such as an insulated gate bipolar transistor (IGBT) has been known, in which a high-concentration N type region is provided below a P type base region that serves as a channel (for example, refer to Patent document 1). Also, a reverse conducting IGBT (RC-IGBT) including an n+ source layer and a trench on a front surface side has been known (for example, refer to Patent document 2). [Patent document 1] Japanese Unexamined Patent Application Publication No. 2014-197702 [Patent document 2] Japanese Unexamined Patent Application Publication No. H11-97715

SUMMARY

It is preferable that a semiconductor device has excellent characteristics such as breakdown voltage and the like.

To solve the above-described issue, in one aspect of the present invention, a semiconductor device is provided, including a semiconductor substrate having a drift region of a first conductivity type. The semiconductor device may include a first trench section provided from an upper surface of the semiconductor substrate to inside the semiconductor substrate. The semiconductor device may include a base region of a second conductivity type provided in direct contact with the first trench section between the upper surface of the semiconductor substrate and the drift region. The semiconductor device may include a first accumulation region of a first conductivity type that is provided between the base region and the drift region and that has a higher doping concentration than the drift region. The semiconductor device may include a second accumulation region of a first conductivity type that is provided at a position deeper than the first accumulation region and that has a higher doping concentration than the drift region. The semiconductor device may include an intermediate region of a second conductivity type that is provided between the first accumulation region and the second accumulation region. The second accumulation region may have a first opening section provided at a position deeper than the first accumulation region.

A first gap may be present between the first accumulation region and the first trench section. The second accumulation region may overlap the first gap in a depth direction of the semiconductor substrate. The first opening section may be provided at a position so as not to overlap the first gap.

The semiconductor device may include a second trench section that is provided from the upper surface of the semiconductor substrate to inside the semiconductor substrate and that faces the first trench section. A second gap may be present between the first accumulation region and the second trench section. The second accumulation region may overlap the second gap in a depth direction of the semiconductor substrate. The first opening section may be provided at a position so as not to overlap the second gap in the depth direction of the semiconductor substrate.

The first trench section may be a gate trench section. The semiconductor device may include an emitter region of a first conductivity type, that is provided in direct contact with the first trench section between the upper surface and the base region of the semiconductor substrate and that has a higher doping concentration than the drift region.

A region sandwiched between the first trench section and the second trench section inside the semiconductor substrate may be set as a mesa section. A direction connecting the first trench section and the second trench section may be set as a mesa width direction. In the mesa width direction, a width of the first opening section may also be smaller than a width of the second accumulation region.

The first opening section may be arranged such that a middle in the mesa width direction of the mesa section is positioned within the first opening section. The intermediate region may overlap the first opening section in the depth direction of the semiconductor substrate. The intermediate region may also be provided inside the first opening section.

The intermediate region may be provided passing through the first opening section and protruding downward beyond the second accumulation region. The intermediate region may be arranged so as not to overlap the first opening section in the depth direction of the semiconductor substrate. The first accumulation region may have a second opening section in a region overlapping the first opening section.

In the mesa width direction, when L1 refers to a width of the first gap and M refers to a width of the mesa section, the following relational expression may be satisfied: $0<L1/M≥0.1$. The first trench section may be provided extending along a predetermined extension direction in the upper surface of the semiconductor substrate. The first trench section may have an upper portion that has a side wall formed in a straight-line shape on a cross section perpendicular to the extension direction. The first trench section may have a lower portion that is provided below the upper portion and that has a side wall formed in a curved shape. When X refers to a distance of the shortest path connecting the upper end of the lower portion of the first trench section and the intermediate region not passing through the second accumulation region in the cross section perpendicular to the extension direction and M refers to a width of the mesa section, the following relational expression may be satisfied: $M/2<X$.

When L1 refers to the width of the first gap and L2 refers to the width of the first opening section in the mesa width direction, the following relational expression may be satisfied: $L1<L2$. When L3 refers to a distance between the first gap and the first opening section in the mesa width direction and M refers to the width of the mesa section, the following relational expression may be satisfied: $0.9×M/2≥L3$.

The width of the first opening section in the mesa width direction may be larger than a thickness of the intermediate region in a depth direction perpendicular to the upper surface of the semiconductor substrate. A thickness of the base region provided below the emitter region in the depth direction perpendicular to the upper surface of the semiconductor substrate may be larger than the thickness of the intermediate region.

A thickness of the first accumulation region in the depth direction perpendicular to the upper surface of the semiconductor substrate may be larger than the thickness of the intermediate region. The thickness of the second accumulation region in the depth direction perpendicular to the upper surface of the semiconductor substrate may be larger than the thickness of the intermediate region.

The semiconductor substrate may include a transistor section including a gate trench section, and a diode section in which a diode is formed. The diode section may have a plurality of dummy trench sections provided from the upper surface of the semiconductor substrate to inside the semiconductor substrate. When the mesa section refers to a region sandwiched between the dummy trench sections inside the semiconductor substrate of the diode section, the mesa section of the diode section may have a base region, a first accumulation region, a second accumulation region and an intermediate region.

The semiconductor substrate may include a boundary mesa section arranged between the transistor section and the diode section. The boundary mesa section may have a base region, a first accumulation region, a second accumulation region and an intermediate region. The width of the first opening section in the boundary mesa section may be larger than the width of the first opening section in any of the mesa sections of the transistor section. The width of the first opening section in the mesa section of the diode section may be larger than the width of the first opening section in the mesa section of the transistor section.

The semiconductor device may include a collector electrode arranged on the lower surface of the semiconductor substrate. The semiconductor device may include a collector region of a second conductivity type that is provided inside the semiconductor substrate of the transistor section and that is electrically connected to the collector electrode. The semiconductor device may include a cathode region of a first conductivity type that is provided inside the semiconductor substrate of the diode section and that is electrically connected to the collector electrode. The semiconductor device may include, inside the semiconductor substrate, a floating region of a second conductivity type that is formed above the cathode region and that is not in contact with the collector electrode.

The floating region may have a third opening section. The third opening section may be positioned so as to overlap the first opening section that is provided in the second accumulation region of the diode section. The number of the first opening sections provided in the second accumulation region of the diode section may be larger than the number of the first opening sections provided in the second accumulation region of the transistor section.

A region sandwiched between two dummy trench sections inside the semiconductor substrate may be set as the mesa section. A direction connecting two dummy trench sections may be set as the mesa width direction. In the second accumulation region of the diode section, a plurality of first opening sections may be arranged along the mesa width direction.

A width of the first opening section that is, among the plurality of first opening sections arranged along the mesa width direction in the second accumulation region of the diode section, closest to the dummy trench section may be larger than a width of the first opening section that is farthest from the dummy trench section.

On the upper surface of the semiconductor substrate in the mesa section of the diode section, the contact region of a second conductivity type along a direction perpendicular to the mesa width direction and an adjusting region having hole mobility that is smaller than the contact region may be alternately arranged. The first opening section that is, among the plurality of first opening sections arranged along the mesa width direction in the second accumulation region of the diode section, closest to the dummy trench section may be discretely arranged along a direction perpendicular to the mesa width direction so as to overlap the contact region.

The semiconductor substrate may further include a diode section in which a diode is formed. The diode section may have the base region. The diode section may have the first accumulation region. The diode section may have the second accumulation region. The diode section may have the intermediate region. The diode section may have a pillar region of a second conductivity type that is in contact with the base region, that is formed from the upper surface of the semiconductor substrate to the drift region, and that has a higher doping concentration than the base region.

On the upper surface of the semiconductor substrate, the pillar region may be sandwiched between the high concentration regions having a higher doping concentration than the drift region. A doping concentration distribution of the pillar region in the depth direction of the semiconductor substrate may have a plurality of peaks.

A depth position at which the doping concentration distribution of the pillar region takes a local minimum value may not overlap the second accumulation region. A peak value of the doping concentration of the pillar region may be equal to or more than $5.0 \times 10^{17}/\text{cm}^3$ and be equal to or less than $1.0 \times 10^{20}/\text{cm}^3$.

The summary clause does not necessarily describe all necessary features of the embodiments of the present invention. The present invention may also be a sub-combination of the features described above.

BRIEF DESCRIPTION OF THE DRAWINGS

FIG. 4 is an enlarged view of a Y-Z cross section of the mesa section 60.

FIG. 5 is an enlarged view of another example of the Y-Z cross section of the mesa section 60.

FIG. 6 is an enlarged view of another example of the Y-Z cross section of the mesa section 60.

FIG. 13 is an enlarged view of another example of the Y-Z cross section of the mesa section 60.

FIG. 24 is a drawing showing another example of the cross section taken along line b-b of the semiconductor device 100.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side of a direction parallel to the depth direction of the semiconductor substrate is referred to as an "upper" side and the other side thereof is referred to as a "lower" side. One surface of two main surfaces of a substrate, a layer or another member is referred to as an upper surface and the other surface thereof is referred to as a lower surface. The "upper" and "lower" directions are not limited to the direction of gravity or directions for mounting to the substrate and the like at the time of the implementation of the semiconductor device.

In the present specification, technical matters may be described by using orthogonal coordinate axes of X axis, Y axis and Z axis. In the present specification, a plane parallel to the upper surface of the semiconductor substrate is set as an X-Y plane, and a depth direction perpendicular to the upper surface of the semiconductor substrate is set as the Z axis.

Although each embodiment shows an example in which a first conductivity type is N type and a second conductivity type is P type, the first conductivity type may also be the P type and the second conductivity type may also be the N type. In this case, the conductivity types of a substrate, a layer, a region and the like in each embodiment are respectively of the opposite polarity.

In the present specification, the doping concentration refers to a concentration of impurities transformed to donors or acceptors. In the present specification, a concentration difference of the donors and acceptors may be the doping concentration. Also, a peak value of the doping concentration distribution in a doping region may be the doping concentration in the doping region.

Figure 1:
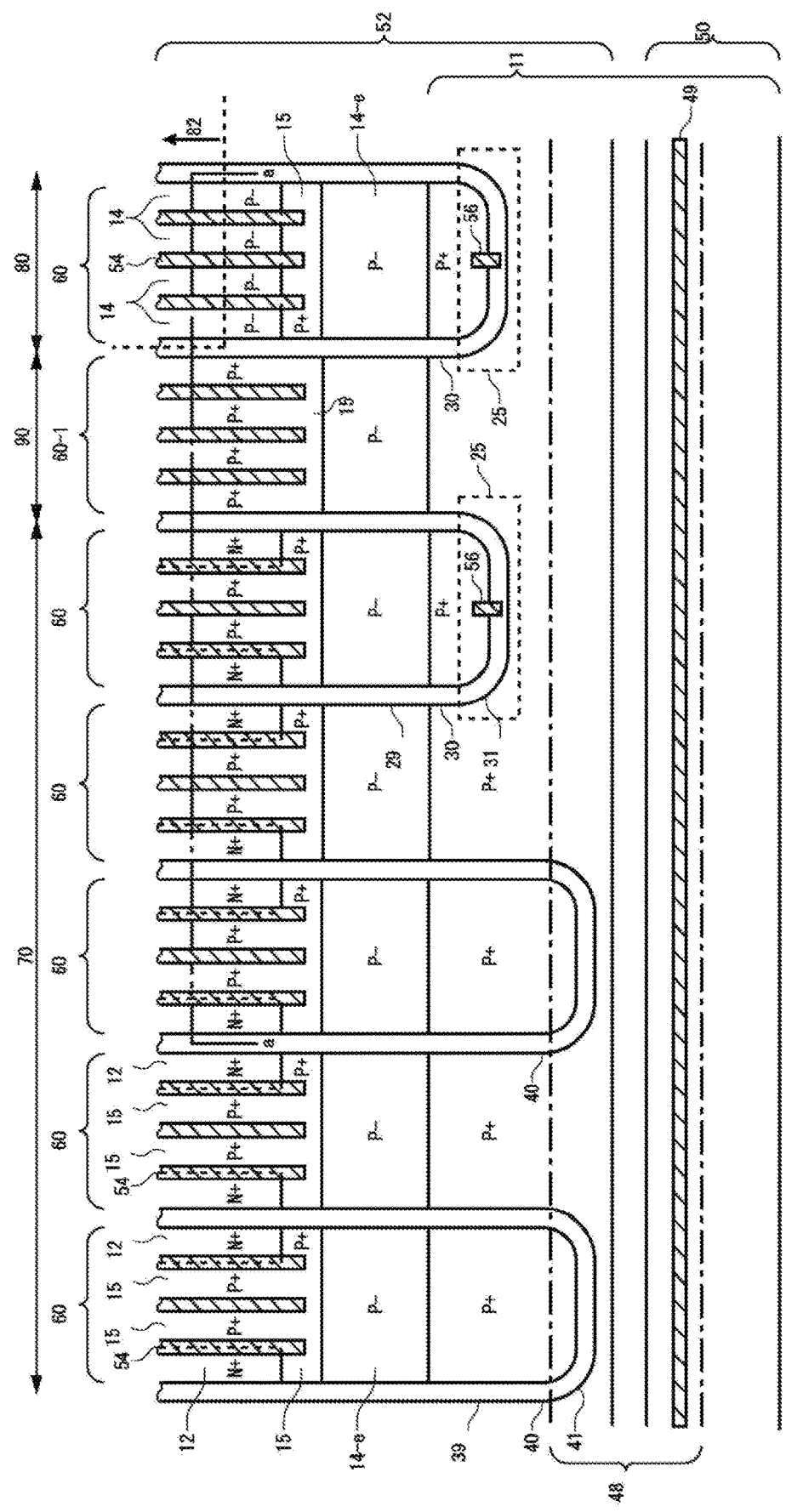
FIG. 1 is a drawing partially showing an upper surface of a semiconductor device 100 according to an embodiment of the present invention.

FIG. 1 is a drawing partially showing an upper surface of the semiconductor device 100 according to an embodiment of the present invention. The semiconductor device 100 of the present example is a semiconductor chip that includes a transistor section 70 and a diode section 80. The transistor section 70 includes a transistor such as an IGBT. The diode section 80 includes a diode, such as a Free Wheel Diode (FWD), provided adjacent to the transistor section 70 on the upper surface of the semiconductor substrate. In FIG. 1, an upper surface of the chip around an end portion of the chip is shown, and other regions are omitted.

The transistor section 70 and the diode section 80 on the upper surface of the semiconductor substrate may be alternately arrayed along a predetermined array direction (the Y-axis direction in the example of FIG. 1). Also, the semiconductor device 100 may further include a boundary section 90 arranged on a boundary between the transistor section 70 and the diode section 80 on the upper surface of the semiconductor substrate.

Although FIG. 1 shows an active region of the semiconductor substrate in the semiconductor device 100, the semiconductor device 100 may have an edge termination structure section surrounding the active region. The active region refers to a region in which current flows if the semiconductor device 100 is controlled to be turned on. The edge termination structure section relaxes an electric field concentration on the upper surface side of the semiconductor substrate. The edge termination structure section has, for example, a guard ring, a field plate, a resurf and a structure of combination thereof.

The semiconductor device 100 of the present example includes a gate trench section 40, a dummy trench section 30, a well region 11, an emitter region 12, a base region 14 and a contact region 15, which are provided inside the semiconductor substrate and are exposed on the upper surface of the semiconductor substrate. Also, the semiconductor device 100 of the present example includes an emitter electrode 52 and a gate metal layer 50 which are provided above the upper surface of the semiconductor substrate. The emitter electrode 52 and the gate metal layer 50 are provided apart from each other.

Although an interlayer dielectric film is formed between the emitter electrode 52 and the gate metal layer 50, and the upper surface of the semiconductor substrate, the interlayer dielectric film is omitted in FIG. 1. In the interlayer dielectric film of the present example, a contact hole 56, a contact hole 49 and a contact hole 54 are formed passing through the interlayer dielectric film.

The emitter electrode 52 is in contact with the emitter region 12, the contact region 15 and the base region 14 on the upper surface of the semiconductor substrate through the contact hole 54. Also, the emitter electrode 52 is connected to the dummy conductive section within the dummy trench section 30 through the contact hole 56. A connecting section 25 formed of a material having conductivity, such as polysilicon doped with impurities, may be provided between the emitter electrode 52 and the dummy conductive section. An insulating film, such as an oxide film, is formed between the connecting section 25 and the upper surface of the semiconductor substrate.

The gate metal layer 50 is in contact with the gate runner 48 through the contact hole 49. The gate runner 48 is formed of polysilicon doped with impurities, and the like. The gate runner 48 is connected to a gate conductive section within the gate trench section 40 on the upper surface of the semiconductor substrate. The gate runner 48 is not connected to the dummy conductive section within the dummy trench section 30. The gate runner 48 of the present example is formed from below the contact hole 49 to an edge portion of the gate trench section 40. An insulating film, such as an oxide film, is formed between the gate runner 48 and the upper surface of the semiconductor substrate. On the edge portion of the gate trench section 40, the gate conductive section is exposed on the upper surface of the semiconductor substrate and is in contact with the gate runner 48. Note that although in FIG. 1, the emitter electrode 52 and the gate runner 48 are partially overlapped with each other in a planar view, the emitter electrode 52 and the gate runner 48 are electrically insulated from each other by sandwiching an insulating film that is not shown in the drawing.

The emitter electrode 52 and the gate metal layer 50 are formed of materials including metal. For example, at least a partial region of each electrode is formed of aluminum or aluminum-silicon alloy. Each electrode may have barrier metal formed of titanium, titanium compound or the like on a lower layer of the region formed of aluminum and the like, or may also have a plug formed of tungsten and the like within the contact hole.

One or more gate trench sections 40 and one or more dummy trench sections 30 are arrayed at a predetermined interval along a predetermined array direction (the Y-axis direction in the present example) on the upper surface of the semiconductor substrate. The transistor section 70 of the present example has a plurality of gate trench sections 40 continuously arrayed. The transistor section 70 of the present example has a dummy trench section 30 in a region in direct contact with the boundary section 90 or the diode section 80. In the transistor section 70, the dummy trench section 30 is not provided in a region that is not in direct contact with the boundary section 90 or the diode section 80. That is, in the present example, in each of the transistor sections 70, the dummy trench section 30 is not provided between the gate trench sections 40. The dummy trench section 30 may be provided between the gate trench section 40 of the transistor section 70 and the boundary section 90 or the diode section 80. In another example of the transistor section 70, one or more gate trench sections 40 and one or more dummy trench sections 30 may also be alternately formed along the array direction.

In the boundary section 90 and the diode section 80, a plurality of dummy trench sections 30 are continuously arrayed at a predetermined interval. In the boundary section 90 or the diode section 80, the trench section adjacent to the transistor section 70 may also be the gate trench section 40.

The gate trench section 40 may have two extension portions 39 that extend along an extension direction (the X-axis direction in the present example) parallel to the upper surface of the semiconductor substrate and perpendicular to the array direction, and a connected portion 41 that is connected to the two extension portions 39. It is preferable that at least a part of the connected portion 41 is formed in a curved shape. By connecting end portions of two extension portions 39 of the gate trench section 40, the electric field concentration on the end portions of the extension portions 39 can be relaxed. The gate runner 48 may be connected to the gate conductive section provided inside the gate trench section 40 in the connected portion 41 of the gate trench section 40.

The dummy trench section 30 may have a U shape on the upper surface of the semiconductor substrate 10, similar to the gate trench section 40. That is, the dummy trench section 30 of the present example has two extension portions 29 that extend along the extension direction, and a connected portion 31 that is connected to the two extension portions 29. In another example, the dummy trench section 30 may not have the connected portion 31 but also have a straight-line shape extending in the extension direction. Note that in the present specification, the extension portions (31, 29) in the straight-line shape of each of the trench sections are set as one trench section.

The emitter electrode 52 is formed above the gate trench section 40, the dummy trench section 30, the well region 11, the emitter region 12, the base region 14 and the contact region 15. The well region 11 is of a second conductivity type (P+ type in the present example) and is formed from the end portion of the active region on the side in which the gate metal layer 50 is provided in a predetermined range. A diffusion depth of the well region 11 may be greater than a depth of the gate trench section 40 and a depth of the dummy trench section 30. Partial regions of the gate trench section 40 and the dummy trench section 30 on the gate metal layer 50 side are formed in the well region 11. A bottom of an end of the dummy trench section 30 in the extension direction may be covered by the well region 11.

A region sandwiched between the respective trench sections is referred to as a mesa section 60. The mesa section 60 may be a portion of the semiconductor substrate sandwiched between two trench sections adjacent to each other, and may be a portion from the upper surface of the semiconductor substrate to a depth of a deepest bottom of each trench section. In the present specification, the mesa section 60 in the boundary section 90 may be referred to as a boundary mesa section 60-1. A base region 14 is formed in the mesa section 60. The base region 14 is of a second conductivity type with a lower doping concentration than the well region 11. The base region 14 of the present example is P− type. In the present example, a base region 14-e is arranged in two end portions of each mesa section 60 in the X-axis direction (only one of the end portions in the X-axis direction is shown in FIG. 1).

On the upper surface of the mesa section 60, the contact region 15 of a second conductivity type with a higher doping concentration than the base region 14 is selectively formed. The contact region 15 of the present example is P+ type. Also, on the upper surface of the mesa section 60 of the transistor section 70, the emitter region 12 of a first conductivity type with a higher doping concentration than the semiconductor substrate is selectively formed. The emitter region 12 of the present example is N+ type. In the present example, on the upper surface of each of the mesa sections 60, a region in direct contact with the base region 14-*e* is the contact region 15.

The emitter region 12 is provided in direct contact with the gate trench section 40 on the upper surface of the mesa section 60. Also, a partial emitter region 12 may also be provided in direct contact with the dummy trench section 30.

The contact region 15 of the transistor section 70 may be provided in direct contact with the emitter region 12 on the upper surface of the mesa section 60. Each of the emitter region 12 and the contact region 15 has a portion exposed from an insulating film by the contact hole 54.

The emitter region 12 and the contact region 15 in transistor section 70 of the present example are provided in a stripe shape extending in the extension direction (the X-axis direction) of the trench section on the upper surface of the semiconductor substrate. The stripe shape indicates that a length in the extension direction (the X-axis direction) of the trench section is longer than a width in the array direction (the Y-axis direction) of the trench section. The length and the width may refer to the maximum length and the maximum width in the X-axis direction and the Y-axis direction. The stripe shape may refer to a shape in which the length is two or more times as large as the width, may refer to a shape in which the length is four or more times as large as the width, or may also refer to a shape in which the length is 10 or more times as large as the width.

In the example of FIG. 1, in each mesa section 60 of the transistor section 70, the emitter region 12 in a stripe pattern is provided in direct contact with the extension portion 39 of the gate trench section 40. That is, the emitter region 12 in the stripe pattern is arranged on both ends of each mesa section 60 in the Y-axis direction. The contact region 15 is arranged while being sandwiched between the emitter regions 12. Note that in the X-axis direction, the contact region 15 may be provided between the emitter region 12 and the base region 14-*e*.

In each of the mesa sections 60, a plurality of contact holes 54 may be provided. As one example, in each mesa section 60 of the transistor section 70, any contact hole 54 is arranged such that a P-N junction portion between the contact region 15 and the emitter region 12 is exposed from the insulating film. In the present example, because two P-N junction portions are formed on the upper surface of each of the mesa sections 60 of the transistor section 70, the contact hole 54 corresponding to each of the P-N junction portions is arranged. Also, in the mesa section 60, the contact hole 54 that causes the contact region 15 to be exposed from the insulating film may also be provided. In the present example, the contact hole 54 is provided in a position that faces a middle of the contact region 15 in the Y-axis direction.

On the mesa section 60 of the diode section 80 in the present example, the emitter region 12 is not formed. On the mesa section 60 of the diode section 80, the contact region 15 or the base region 14 is formed from one dummy trench section 30, which sandwiches the mesa section 60, to the other dummy trench section 30. That is, on the upper surface of the semiconductor substrate, a width, in the Y-axis direction, of the mesa section 60 of the diode section 80 is equal to a width, in the Y-axis direction of the contact region 15 or the base region 14 provided on the mesa section 60 of the diode section 80. In the example of the diode section 80 of FIG. 1, the contact region 15 is arranged in a region in direct contact with the base region 14-*e* on the upper surface of the mesa section 60. Also, the base region 14 is arranged in a region in direct contact with the contact region 15 on the opposite side to the base region 14-*e* in the X-axis direction.

On an upper surface of the boundary mesa section 60-1 of the boundary section 90, the contact region 15 is provided in the entire region sandwiched between the base regions 14-*e*. An area of the contact region 15 exposed on the upper surface of one boundary mesa section 60-1 may be larger than an area of the contact region 15 exposed on the upper surface of one mesa section 60 of the diode section 80. Note that although FIG. 1 shows an example in which there is one boundary mesa section 60-1 on the boundary section 90, the boundary section 90 may also have a plurality of boundary mesa sections 60-1 arrayed in the Y-axis direction.

In the diode section 80, the contact hole 54 is formed above the contact region 15 and the base region 14. The contact hole 54 in the boundary mesa section 60-1 is formed above the contact region 15. No contact hole 54 is arranged above the base region 14-*e* and the well region 11 arranged on both ends of the mesa section 60 in the X-axis direction.

Note that the diode section 80 has a cathode region 82 of a first conductivity type in a region on a lower surface side of the semiconductor substrate. The cathode region 82 of the present example is N+ type. In FIG. 1, a range in which the cathode region 82 is formed is shown by the dashed line. The diode section 80 may be a region in which the cathode region 82 is projected on the upper surface of the semiconductor substrate. The region in which the cathode region 82 is projected on the upper surface of the semiconductor substrate may be apart from the contact region 15 in a +X-axis direction. In the region on the lower surface side of the semiconductor substrate, the collector region of a second conductivity type may be formed in the region in which the cathode region 82 is not formed. The transistor section 70 may be a region, in which the trench section or the mesa section is formed, among the region in which the collector region is projected on the upper surface of the semiconductor substrate.

Figure 2:
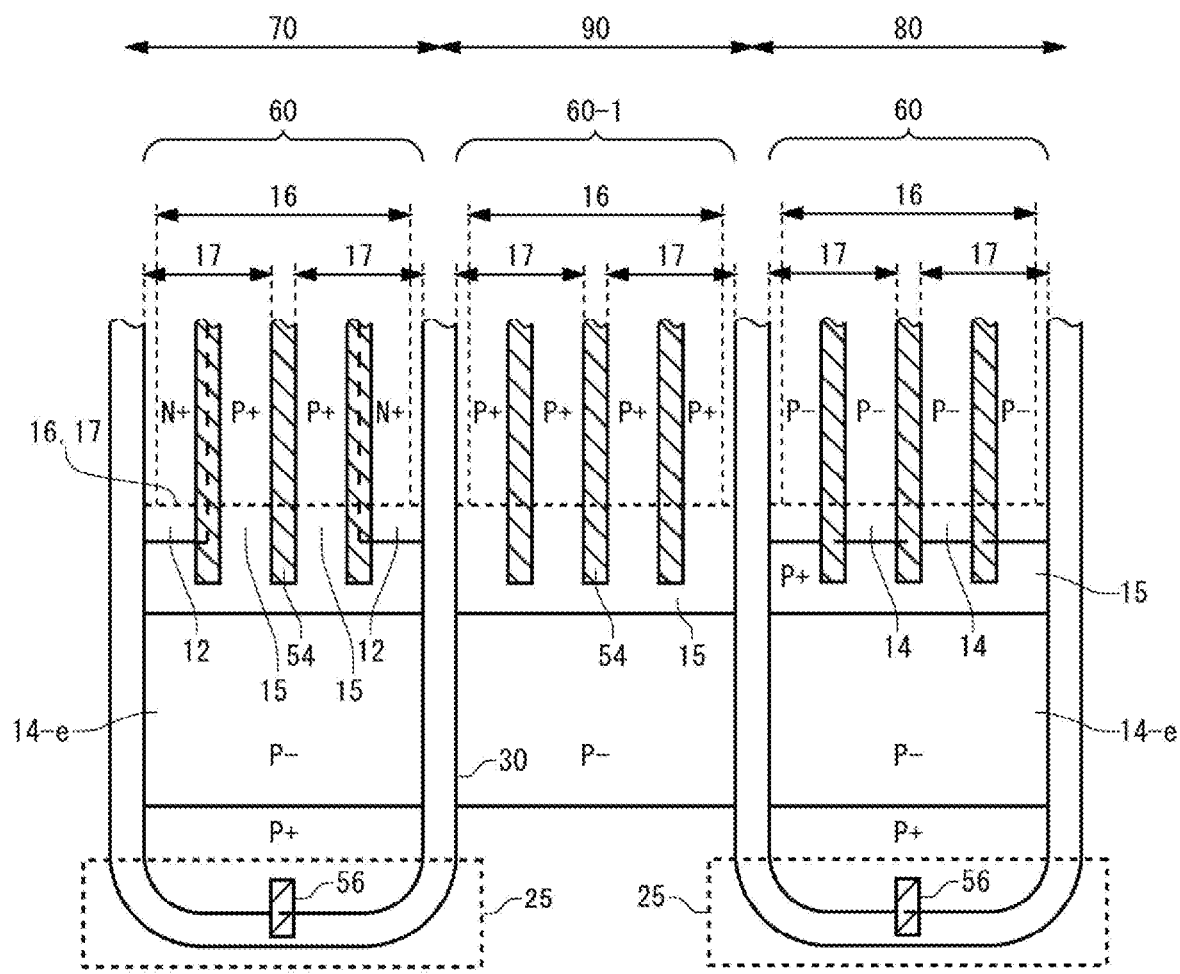
FIG. 2 is a top view showing an enlarged view of mesa sections 60 in a transistor section 70, a diode section 80 and a boundary section 90.

FIG. 2 is a top view showing an enlarged view of the mesa sections 60 in the transistor section 70, the diode section 80 and the boundary section 90. Although the mesa section 60 of the transistor section 70 shown in FIG. 2 is a mesa section 60 sandwiched between the dummy trench sections 30, the mesa section 60 in direct contact with the gate trench section 40 also has a similar structure.

In each of the mesa sections 60, a first accumulation region 16 of a first conductivity type and a second accumulation region 17 of a first conductivity type are provided inside the semiconductor substrate. The first accumulation region 16 and the second accumulation region 17 are formed at different depth positions inside the semiconductor substrate. The first accumulation region 16 and the second accumulation region 17 are not exposed on the upper surface of the semiconductor substrate. In FIG. 2, the range in which the first accumulation region 16 and the second accumulation region 17 are provided on a projection plane parallel to the upper surface of the semiconductor substrate is shown by the dashed line. The first accumulation region 16 and the second accumulation region 17 of the present example are arranged in the stripe pattern in a region sandwiched between two base regions 14-*e* arranged on both ends in the X-axis direction on the projection plane. As shown in FIG. 2, the first accumulation region 16 and the second accumulation region 17 are arranged such that the first accumulation region 16 and the second accumulation region 1 are partially overlapped with each other in the Z-axis direction.

Figure 3:
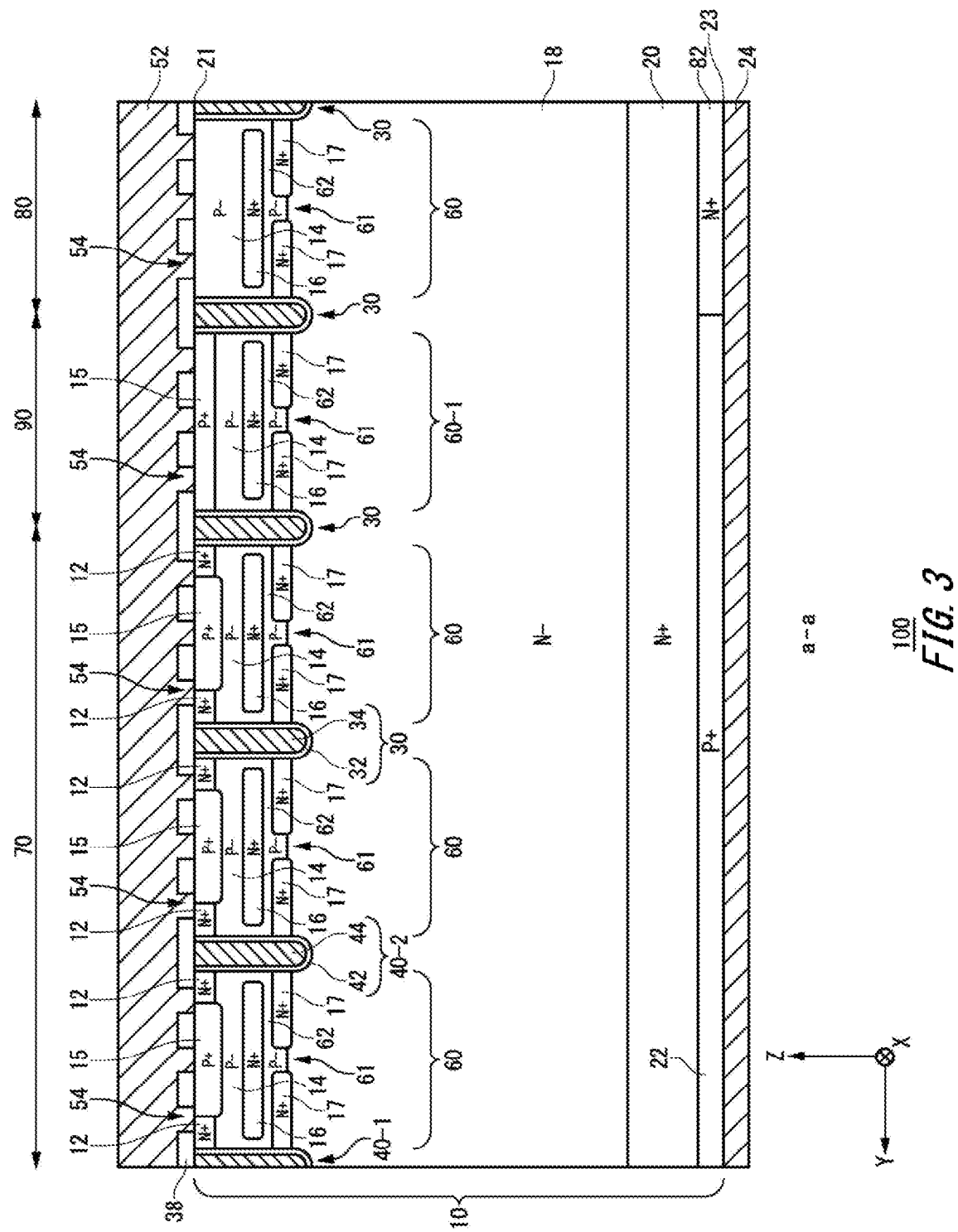
FIG. 3 is a drawing showing one example of a structure of the semiconductor device 100 on a cross section taken along line a-a of FIG. 1.

FIG. 3 is a drawing showing one example of a structure of the semiconductor device 100 at the cross section taken along line a-a of FIG. 1. The cross section taken along line a-a is the Y-Z plane passing through the emitter region 12 of the transistor section 70. The semiconductor device 100 of the present example has the semiconductor substrate 10, an interlayer dielectric film 38, an emitter electrode 52 and a collector electrode 24 at the cross section. The emitter electrode 52 is formed on the semiconductor substrate 10 and an upper surface of the interlayer dielectric film 38.

The collector electrode 24 is formed on a lower surface 23 of the semiconductor substrate 10. The emitter electrode 52 and the collector electrode 24 are formed of conductive materials such as metal. In the present specification, a direction connecting the emitter electrode 52 and the collector electrode 24 is referred to as a depth direction (the Z-axis direction).

The semiconductor substrate 10 may be a silicon substrate, may be a silicon carbide substrate, and may also be a nitride semiconductor substrate such as gallium nitride, and the like. The semiconductor substrate 10 of the present example is a silicon substrate. The semiconductor substrate 10 includes a drift region 18 of a first conductivity type. The drift region 18 of the present example is N− type. The drift region 18 may be a remaining region in which another doping region is not formed.

On the semiconductor substrate 10, the base region 14 of P− type is provided, which is provided between the upper surface 21 of the semiconductor substrate 10 and the drift region 18 and which has a lower doping concentration than the contact region 15. The gate trench section 40 and the dummy trench section 30 are provided from the upper surface 21 of the semiconductor substrate 10, passing through the base region 14, to the inside (in the present example, the drift region 18) of the semiconductor substrate 10.

As described above, the mesa section 60 is a region sandwiched between two trench sections inside the semiconductor substrate 10. The two trench sections provided facing to each other while sandwiching the mesa section 60 are one example of the first trench section and the second trench section. The first trench section may be the gate trench section 40 and may also be the dummy trench section 30. The second trench section may be the gate trench section 40 and may also be the dummy trench section 30.

At the cross section, in the mesa section 60 of the transistor section 70, the emitter region 12, the contact region 15, the base region 14, the first accumulation region 16, the second accumulation region 17 and the intermediate region 62 are provided. The base region 14 is provided in direct contact with at least the first trench section among two trench sections sandwiching the mesa section 60. The base region 14 of the present example is provided in direct contact with both of the two trench sections sandwiching the mesa section 60. The accumulation region is a region in which dopants (N type donors, in the present example) of the same conductivity type as that of the drift region 18 are accumulated in a higher concentration than the drift region 18.

The emitter region 12 is provided between the upper surface 21 of the semiconductor substrate 10 and the base region 14 inside the mesa section 60. The emitter region 12 of the present example is provided between the base region 14 and the upper surface 21 of the semiconductor substrate 10 in a region in direct contact with the gate trench section 40 or the dummy trench section 30.

The contact region 15 is provided between the upper surface 21 of the semiconductor substrate 10 and the base region 14 inside the mesa section 60. The contact region 15 of the present example is provided between the base region 14 and the upper surface 21 of the semiconductor substrate 10 in a region that is not in direct contact with the gate trench section 40 and the dummy trench section 30.

The first accumulation region 16 is an N+ type region having a higher doping concentration than the drift region 18. The first accumulation region 16 is provided between the base region 14 and the drift region 18. The first accumulation region 16 may be arranged, where a gap is present between the first accumulation region 16 and the first trench section (for example, the gate trench section 40). The first accumulation region 16 of the present example is arranged such that a gap is present between the first accumulation region 16 and each of the two trench sections arranged on both sides of the mesa section 60. A region of a second conductivity type is provided between the first accumulation region 16 and the trench section. In the present example, a P− type base region 14 is arranged between the first accumulation region 16 and the trench section.

The second accumulation region 17 is an N+ type region having a higher doping concentration than the drift region 18. The doping concentration of the second accumulation region 17 may be the same as, may be higher than or may also be lower than the doping concentration of the first accumulation region 16. The second accumulation region 17 is provided at a position deeper than the first accumulation region 16 when viewed from the upper surface of the semiconductor substrate 10 in the depth direction (the Z-axis direction) of the semiconductor substrate 10. The second accumulation region 17 of the present example is provided between the first accumulation region 16 and the drift region 18. The first accumulation region 16 and the second accumulation region 17 are arranged above a lower end of the trench section. Also, the second accumulation region 17 may overlap the gap between the first accumulation region 16 and the trench section in the depth direction (the Z-axis direction) of the semiconductor substrate 10. The second accumulation region 17 has a first opening section 61 arranged at a position deeper than the first accumulation region 16 when viewed from the upper surface of the semiconductor substrate 10. The first opening section 61 of the present example is provided at a position so as not to overlap the gap between the first accumulation region 16 and the trench section. The first opening section 61 passes through the second accumulation region 17.

The intermediate region 62 is provided between the first accumulation region 16 and the second accumulation region 17 in the depth direction (the Z-axis direction) of the semiconductor substrate 10. The intermediate region 62 may be in direct contact with each of two trench sections on both sides of the mesa section 60. The intermediate region 62 is a region of a second conductivity type. The doping concentration of the intermediate region 62 may be the same as the doping concentration of the base region 14. Also, when the first accumulation region 16 is formed by injecting N type impurities into the base region 14, a P type region remaining below the first accumulation region 16 may also be set as the intermediate region 62.

The drift region 18 and the intermediate region 62 are connected to each other via the first opening section 61 provided in the second accumulation region 17. As shown in FIG. 3, the junction between the drift region 18 and the intermediate region 62 may be arranged inside the first opening section 61. In another example, the junction between the drift region 18 and the intermediate region 62 may be arranged below the second accumulation region 17. In this case, the intermediate region 62 is formed in the whole inside of the first opening section 61. In another example, the junction between the drift region 18 and the intermediate region 62 may be arranged above the second accumulation region 17. In this case, the drift region 18 is formed in the whole inside of the first opening section 61.

The mesa section 60 of the diode section 80 at the cross section is not provided with the emitter region 12 and the contact region 15. The other structures are similar to the mesa section 60 of the transistor section 70. That is, in the mesa section 60 of the diode section 80, the base region 14, the first accumulation region 16, the second accumulation region 17 and the intermediate region 62 are provided. The base region 14 in the mesa section 60 of the diode section 80 is formed in a whole region between the first accumulation region 16 and the upper surface 21 of the semiconductor substrate 10 at the cross section.

The boundary mesa section 60-1 of the boundary section 90 at the cross section is not provided with the emitter region 12. The other structures are similar to the mesa section 60 of the transistor section 70. That is, in the boundary mesa section 60-1, the contact region 15, the base region 14, the first accumulation region 16, the second accumulation region 17 and the intermediate region 62 are provided. The contact region 15 in the boundary mesa section 60-1 is in direct contact with both of the two trench sections sandwiching the boundary mesa section 60-1.

By providing the first accumulation region 16 and the second accumulation region 17, injection enhancement effect (IE effect) can be enhanced and ON voltage can be reduced. Also, by arranging the first accumulation region 16 at a position apart from the trench section, transient collector-gate capacitance during reverse recovery of the diode section 80, and the like, can be reduced.

By arranging the second accumulation region 17 so as to cover the gap between the first accumulation region 16 and the trench section, carriers in a region in direct contact with the trench section can be suppressed from being excessively extracted. For this reason, the IE effect can be maintained while the collector-gate capacitance is reduced. Further, by providing the first opening section 61 in the second accumulation region 17, carriers can be accumulated in the region in direct contact with the trench section during a period in which the semiconductor device 100 is turned on, and the like, and the carriers can be extracted via the first opening section 61 during a period in which the semiconductor device 100 is turned off, and the like. For this reason, turn-off loss can be reduced while the IE effect is maintained. Note that at least one of the first accumulation region 16 and the second accumulation region 17 may not be provided in at least one of the diode section 80 and the boundary section 90.

In each of the transistor section 70, the diode section 80 and the boundary section 90, an N+ type buffer region 20 is formed below the drift region 18. The doping concentration of the buffer region 20 is higher than the doping concentration of the drift region 18. The buffer region 20 may serve as a field stop layer to prevent a depletion layer extending from the lower surface side of the base region 14 from reaching the P+ type collector region 22 and the N+ type cathode region 82.

In the transistor section 70, the P+ type collector region 22 is formed below the buffer region 20. In the diode section 80, the N+ type cathode region 82 is formed below the buffer region 20. In the boundary section 90, below the buffer region 20, the collector region 22 may be formed or the cathode region 82 may also be formed. In the boundary section 90 of the present example, the collector region 22 is formed.

The diode section 80 as one example is a region overlapping the cathode region 82 in a direction perpendicular to the lower surface 23 of the semiconductor substrate 10. Also, the transistor section 70 is a region, in which a predetermined unit configuration including the emitter region 12 and the contact region 15 is regularly arranged, among the regions overlapping the collector region 22 in a direction perpendicular to the lower surface 23 of the semiconductor substrate 10. The boundary section 90 is a region in which the emitter region 12 is not formed on the upper surface of the mesa section 60 and the contact region 15 is formed on most of the upper surface of the mesa section 60 (for example, half or more of the upper surface of the mesa section 60).

On the upper surface 21 of the semiconductor substrate 10, one or more gate trench section 40 and one or more dummy trench section 30 are formed. Each trench section passes through the base region 14 from the upper surface 21 of the semiconductor substrate 10 and reaches the drift region 18. In the region in which at least any one of the emitter region 12, the contact region 15, the first accumulation region 16, the second accumulation region 17 and the intermediate region 62 is provided, each trench section may also pass through these regions and reach the drift region 18. Although the trench section is described as passing through the doping region, the manufacturing process is not limited to be conducted in the order of forming the doping region and then forming the trench section. The configuration in which the doping region is formed in direct contact with the trench section after the trench section is formed is included in the configuration in which the trench section passes through the doping region.

The gate trench section 40 has a gate trench, a gate insulating film 42 and a gate conductive section 44 which are formed in the upper surface 21 of the semiconductor substrate 10. The gate insulating film 42 is formed covering an inner wall of the gate trench. The gate insulating film 42 may be formed by oxidizing or nitriding the semiconductor on the inner wall of the gate trench. The gate conductive section 44 is formed inside the gate trench and on an inner side relative to the gate insulating film 42. That is, the gate insulating film 42 insulates the gate conductive section 44 from the semiconductor substrate 10. The gate conductive section 44 is formed of a conductive material such as polysilicon.

The gate conductive section 44 includes, in the depth direction, a region that sandwiches the gate insulating film 42 and faces at least the base region 14. The gate trench section 40 at the cross section is covered by the interlayer dielectric film 38 on the upper surface of the semiconductor substrate 10. If a predetermined voltage is applied to the gate conductive section 44, a channel is formed at a surface layer of the interface of the base region 14 in contact with the gate trench, due to an inversion layer of electrons.

The dummy trench section 30 may have the same structure as that of the gate trench section 40 at the cross section. The dummy trench section 30 has a dummy trench, a dummy insulating film 32 and a dummy conductive section 34 which are formed on the upper surface side of the semiconductor substrate 10. The dummy insulating film 32 is formed covering the inner wall of the dummy trench. The dummy conductive section 34 is formed inside the dummy trench and is formed on an inner side relative to the dummy insulating film 32. The dummy insulating film 32 insulates the dummy conductive section 34 from the semiconductor substrate 10. The dummy conductive section 34 may be formed of the same material as that of the gate conductive section 44. For example, the dummy conductive section 34 is formed of a conductive material such as polysilicon. The dummy conductive section 34 may have the same length as the gate conductive section 44 in the depth direction. The dummy trench section 30 at the cross section is covered by the interlayer dielectric film 38 on the upper surface 21 of the semiconductor substrate 10. Note that a bottom of the dummy trench section 30 and the gate trench section 40 may be in a downwardly convex curved surface shape (a curved shape at the cross section).

FIG. 4 is an enlarged view of the Y-Z cross section of the mesa section 60. FIG. 4 shows the mesa section 60 in the transistor section 70. In the present example, the first trench section is the gate trench section 40-1 and the second trench section is the gate trench section 40-2.

A first gap 63 is present between the first accumulation region 16 and the gate trench sections 40-1. A second gap 64 is present between the first accumulation region 16 and the gate trench section 40-2. The base region 14 may be formed in the first gap 63 and the second gap 64. The base region 14 and the intermediate region 62 are connected to each other via the first gap 63 and the second gap 64.

The second accumulation region 17 overlaps both of the first gap 63 and the second gap 64 in the depth direction of the semiconductor substrate 10. The second accumulation region 17 of the present example is provided in contact with both of the gate trench section 40-1 and the gate trench section 40-2. The second accumulation region 17 is arranged so as to cover at least the whole first gap 63 and second gap 64.

The first opening section 61 is provided at a position so as not to overlap both of the first gap 63 and the second gap 64 in the depth direction of the semiconductor substrate 10. The first opening section 61 of the present example is arranged such that a middle in the mesa width direction of the mesa section 60 (that is, a direction connecting two trench sections; the Y-axis direction, in the present example) is positioned within the opening section. Accordingly, a distance between the first opening section 61 and the gate trench section 40 can be maximized and carriers accumulated in the vicinity of the gate trench section 40 can be suppressed from being extracted via the first opening section 61. For this reason, ON voltage of the semiconductor device 100 can be reduced.

In the mesa width direction, it is preferable that a width L2 of the first opening section 61 is smaller than a width (M−L2) of the second accumulation region 17. Note that a width of the mesa section 60 in the mesa width direction is set as M. Compared to the second accumulation region 17, if the width L2 of the first opening section 61 becomes large, the carriers accumulated in the vicinity of the gate trench section 40 becomes to be easily extracted from the first opening section 61. For this reason, the ON voltage is increased. The width L2 of the first opening section 61 may be equal to or less than half of, may be equal to or less than ¼ of, or may also be equal to or less than 1/10 of the width (M−L2) of the second accumulation region 17. Also, the width L2 of the first opening section 61 may be equal to or less than 1 µm, may be equal to or less than 0.5 µm, and may also be equal to or less than 0.3 µm.

The intermediate region 62 may overlap the first opening section 61 in the depth direction of the semiconductor substrate 10. That is, an intermediate region 62 may be arranged such that a partial region of the intermediate region 62 can be seen when viewing the first opening section 61 in the Z-axis direction from the lower surface 23 side of the semiconductor substrate 10. Accordingly, during the turned-off period and the like, the carriers are easily extracted from the first opening section 61. As shown in FIG. 4, the intermediate region 62 may be provided inside the first opening section 61 as well.

Also, it is preferable that the following relational expression is satisfied in a case where a width of the first gap 63 is set as L1. 0<L1/M≥0.1. The width of the second gap 64 may be the same as the width of the first gap 63. To reduce the gate-collector capacitance, the first accumulation region 16 and the gate trench section 40 may be arranged slightly apart from each other. Also, if the width L1 of the first gap 63 is set large, the carrier accumulation effect in the vicinity of the gate trench section 40 is reduced. An upper limit of L1/M may be 0.05, and may also be 0.025. A lower limit of L1/M may be 0.01, and may also be 0.02. As one example, the mesa width M of the mesa section 60 is approximately equal to or more than 1 µm and equal to or less than 10 µm. The width L1 of the first gap 63 may be equal to or less than 0.5 µm, may be equal to or less than 0.3 µm and may also be equal to or less than 0.1 µm.

Also, the width of the first gap 63 and the width L2 of the first opening section 61 may satisfy a relation of L1<L2. If the width L2 pf the first opening section 61 becomes too small, the carrier extracting efficiency is lowered. The width L2 may be 1.2 or more times as and may also be 1.5 or more times as large as the width L1. However, the following relation expression may also be satisfied: L2<L1.

In the mesa width direction, a distance between the first gap 63 and the first opening section 61 is set as L3. That is, the distance L3 is a distance in the Y axis from the end portion of the first gap 63 near the first opening section 61 to the end portion of the first opening section 61 near the first gap 63. The distance L3 in the present example is the width of the second accumulation region 17 that overlaps the first accumulation region 16. The distance L3 and the mesa width M may satisfy the following relational expression: 0.9×M/2≥L3. Accordingly, the first opening section 61 is arranged on an approximately middle of the mesa section 60, and the carriers accumulated in the vicinity of the gate trench section 40 can be suppressed from being extracted via the first opening section 61.

T1 refers to a thickness of the intermediate region 62 in the depth direction perpendicular to the upper surface 21 of the semiconductor substrate 10, T2 refers to a thickness of the base region 14 provided below the emitter region 12, T3 refers to a thickness of the first accumulation region 16 and T4 refers to a thickness of the second accumulation region 17. The width L2 of the first opening section 61 may be larger than the thickness T1 of the intermediate region 62. The width L2 may be two or more times as and may also be three or more times as large as the thickness T1. Because the intermediate region 62 is formed in the approximately whole mesa section 60 on the X-Y plane, the carriers can pass therethrough even if the thickness in the Z-axis direction is small. On the other hand, if the width L2 of the first opening section 61 is set too small, the carriers cannot be efficiently extracted from the drift region 18.

The thickness T2 of the base region 14 may be larger than the thickness T1 of the intermediate region 62. The thickness T2 of the base region 14 refers to a thickness of a region sandwiched between the emitter region 12 and the first accumulation region 16 in the depth direction. If the base region 14 is set too thin, a channel length becomes short and a variation of threshold voltage due to the position dispersion of each doping region becomes larger. The thickness T2 may also be two or more times as and may also be three or more times as large as the thickness T1.

The thickness T3 of the first accumulation region 16 may be larger than the thickness T1 of the intermediate region 62. The thickness T3 may be two or more times as and may also be four or more times as large as the thickness T1. The thickness T4 of the second accumulation region 17 may be larger than the thickness T1 of the intermediate region 62. The thickness T4 may be three or more times as and may also be five times or more as large as the thickness T1. Note that a position in which the doping concentration is twice as large as the doping concentration of the drift region 18 may be set as a boundary between the second accumulation region 17 and the drift region 18. By setting the thickness of each of the accumulation regions large, the carrier accumulation effect can be enhanced. The thickness T4 of the second accumulation region 17 may be larger than the thickness T3 of the first accumulation region 16. Accordingly, the carriers can be efficiently accumulated in the vicinity of the lower end of the trench section.

In the depth direction perpendicular to the upper surface 21 of the semiconductor substrate 10, a distance from the upper surface 21 of the semiconductor substrate 10 to the lower end of the first accumulation region 16 is set as D3, a distance from the lower end of the first accumulation region 16 to the lower end of the second accumulation region 17 is set as D2, and a distance from the lower end of the second accumulation region 17 to the lower end of the gate trench section 40 is set as D1. The distance D1 may be larger than a sum of the distance D2 and the distance D3. If the distance D1 becomes small, the carriers accumulated in the vicinity of the lower end of the gate trench section 40 is easily extracted via the first opening section 61 and the ON voltage is increased. The distance D1 may be 1.2 or more times as and may also be 1.5 or more times as large as the distance D2+D3. The distance D3 may be larger than the distance D2. The distance D3 may be 1.5 or more times as and may also be two or more times as large as the distance D2.

Note that the transistor section 70 of the present example is not provided with the dummy trench section 30 between the gate trench sections 40. That is, a plurality of gate trench sections 40 are continuously arrayed in the Y-axis direction so as not to sandwich the dummy trench section 30.

Generally, by alternately arraying one or more gate trench sections 40 and one or more dummy trench sections 30, the carrier accumulation effect can be generated. By changing a ratio of the dummy trench section 30 to the gate trench section 40, the characteristics, such as a switching speed, of the semiconductor device 100 can be adjusted. Also, by extending the depletion layer in the Y-axis direction, breakdown voltage of the semiconductor device 100 can be improved.

On the other hand, by providing the first accumulation region 16 and the second accumulation region 17 in the semiconductor device 100, the carrier accumulation effect can be generated. Also, by changing a width or the number of the first opening sections 61, the characteristics, such as the switching speed, of the semiconductor device 100 can be adjusted. Also, because the P-N junction between the intermediate region 62 and the drift region 18 is provided in the vicinity of the first opening section 61, the depletion layer can be extended from the first opening section 61. For this reason, similar to the dummy trench section 30, the depletion layer can be extended in the Y-axis direction.

That is, even if the dummy trench section 30 is not provided between the gate trench sections 40, a similar effect to the case where the dummy trench section 30 is provided between the gate trench sections 40 can be generated. Further, because the dummy trench section 30 may not be provided between the gate trench sections 40, man-hours of a screening test for testing whether the dummy insulating film 32 of the dummy trench section 30 has predetermined characteristics, and the like can be reduced.

In the example of FIG. 4, a partial region of the second accumulation region 17 has been provided at the position at the same depth as that of the base region 14 and another partial region has been provided at a position at the same depth as that of the drift region 18. In another example, the whole second accumulation region 17 may also be provided at a position at the same depth as that of the drift region 18.

Also, the first accumulation region 16 may also be formed within a range overlapping the first opening section 61 in the Z-axis direction. That is, both ends of the first accumulation region 16 in the Y-axis direction may be positioned so as to overlap the first opening section 61. In this case, the intermediate region 62 may be arranged between the first accumulation region 16 and the first opening section 61.

Also, the first accumulation region 16 may also be in contact with at least one gate trench section 40 of two gate trench sections 40 adjacent to each other. That is, the first gap 63 may be provided between the first accumulation region 16 and at least one gate trench section 40.

Also, at least a partial region of the first gap 63 and at least a partial region of the first opening section 61 may also be positioned so as to be overlapped with each other in the Z-axis direction. The whole region of one of the first gap 63 and the first opening section 61 may also be provided so as to overlap the other. In this case, both the first gap 63 and the first opening section 61 may be in contact with, both thereof may not be in contact with the gate trench section 40, and only one of the first gap 63 and the first opening section 61 may also be in contact with the gate trench section 40.

FIG. 5 is an enlarged view of another example of the Y-Z cross section of the mesa section 60. FIG. 4 shows the mesa section 60 in the transistor section 70. The gate trench section 40 of the present example has an upper portion 46 and a lower portion 47.

As shown in FIG. 1 and FIG. 2, the gate trench section 40 is provided extending along a predetermined extension direction (the X-axis direction) of the upper surface 21 of the semiconductor substrate 10. The upper portion 46 is a portion in which side walls are formed in the straight-line shape at a cross section (the Y-Z plane) perpendicular to the extension direction. Note that side walls of a portion in direct contact with the upper surface 21 of the semiconductor substrate 10 in the upper portion 46 may not be in the straight-line shape. The lower portion 47 is a portion that is provided below the upper portion 46 and has side walls formed in the curved shape. The lower portion 47 includes a lower end of the gate trench section 40. The upper end of the lower portion 47 (the boundary between the upper portion 46 and the lower portion 47) is a portion where an inclination of the side wall starts to change from an inclination of the side wall of the upper portion 46.

At the Y-Z cross section, a distance of the shortest path 65 that connects the upper end of the side wall of the lower portion 47 and the intermediate region 62 not passing through the second accumulation region 17 is set as X. The distance X may be larger than a half of the width M of the mesa section 60 (that is, the following relational expression may be satisfied: M/2<X). By setting the distance X from the vicinity of the lower end of the gate trench section 40 to the intermediate region 62 large, the carriers accumulated in the vicinity of the lower end of the gate trench section 40 can be suppressed from being extracted via the intermediate region 62. The distance X may be larger than 1.2 times of and may also be larger than 1.4 times of the half of the mesa width M Also, when the upper end of the lower portion 47 is not clear, a distance of the shortest path that connects the lower end of the gate trench section 40 and the intermediate region 62 may also be set as X. The lower end of the gate trench section 40 is the lowermost portion of the gate trench section 40. The lower end of the gate trench section 40 may be arranged on a middle of the gate trench section 40 in the Y-axis direction.

The intermediate region 62 of the present example is provided passing through the first opening section 61 and protruding downward beyond the second accumulation region 17. In this case, the carriers are easily extracted. A length in the depth direction of a portion of the intermediate region 62 protruding downward beyond the second accumulation region 17 may be smaller than or may also be larger than the thickness T1 of the intermediate region 62. According to the protruding length of the intermediate region 62, the carrier extracting efficiency and the ON voltage can be adjusted.

FIG. 6 is an enlarged view of another example of the Y-Z cross section of the mesa section 60. In the mesa section 60 of the present example, the arrangement of the intermediate region 62 is different from that of the mesa section 60 shown in FIG. 4 or FIG. 5. The other structures may be the same as that of the mesa section 60 shown in FIG. 4 or FIG. 5.

The intermediate region 62 of the present example is arranged so as not to overlap the first opening section 61 in the depth direction of the semiconductor substrate 10. That is, the end portion 66 of the first opening section 61 is arranged on an outer side relative to the end portion 67 of the second accumulation region 17 between the first accumulation region 16 and the second accumulation region 17. The outer side refers to the side closer to the adjacent gate trench section 40.

In this case, the intermediate region 62 is not exposed when viewed from the lower surface 23 side of the semiconductor substrate 10. For this reason, the carriers accumulated in the vicinity of the lower end of the gate trench section 40 can be suppressed from being extracted via the intermediate region 62. In the present example, the drift region 18 is formed in the whole inside of the first opening section 61. The drift region 18 may also be formed between the first accumulation region 16 and the second accumulation region 17.

In the present example, the shortest path connecting the upper end of the lower portion 47 of the gate trench section 40 and the intermediate region 62 has a portion 91 connecting the upper end of the lower portion 47 and the end portion 67 of the first opening section 61, a portion 92 detouring around the second accumulation region 17 along the end portion 67, and a portion 93 connecting the end portion 67 and the intermediate region 62.

Figure 7:
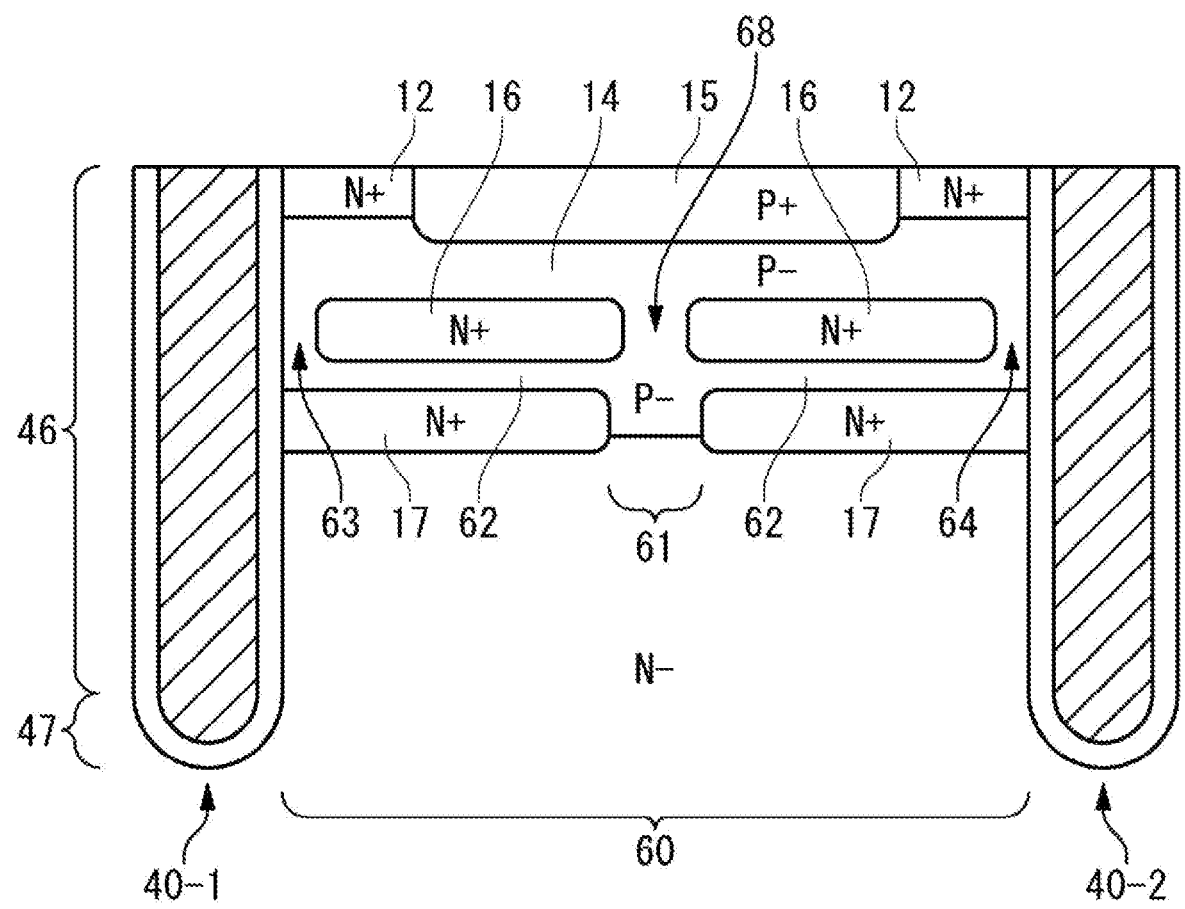
FIG. 7 is an enlarged view of another example of the Y-Z cross section of the mesa section 60.

FIG. 7 is an enlarged view of another example of the Y-Z cross section of the mesa section 60. The shape of the first accumulation region 16 of the mesa section 60 of the present example is different from that of the mesa section 60 shown in FIG. 4 to FIG. 6. The other structures may be the same as that of any mesa section 60 shown in FIG. 4 to FIG. 6.

The first accumulation region 16 of the present example has a second opening section 68 overlapping the first opening section 61 in the depth direction of the semiconductor substrate 10. The second opening section 68 passes through the first accumulation region 16. A region of the same conductivity type as that of the base region 14 is formed inside the second opening section 68. According to such a structure, during the period in which the semiconductor device 100 is turned off, and the like, the carriers such as holes can pass through the first opening section 61 and the second opening section 68 and be extracted. The first opening section 61 and the second opening section 68 may be formed in the region overlapping the contact region 15 in the depth direction of the semiconductor device 100.

In the Y-axis direction, the width of the second opening section 68 may be the same as, may also be larger than, and may also be smaller the width of the first opening section 61. Also, in the X-axis direction, the length of the second opening section 68 may be the same as, may also be larger than, and may also be smaller than the length of the first opening section 61.

Figure 8:
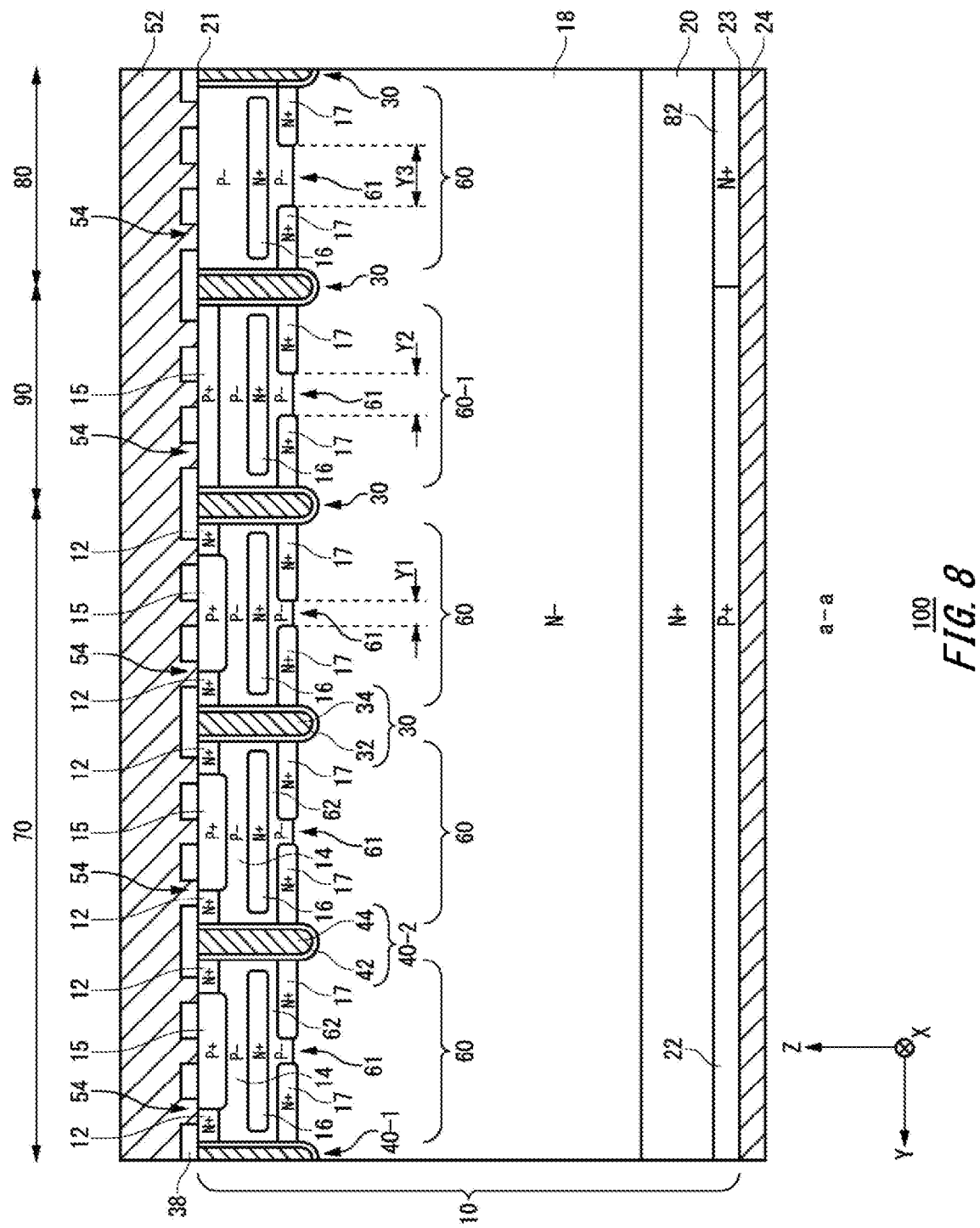
FIG. 8 is a drawing showing another example of the structure of the semiconductor device 100 at the cross section taken along line a-a of FIG. 1.

FIG. 8 is a drawing showing another example of the structure of the semiconductor device 100 at the cross section taken along line a-a of FIG. 1. The shape of the first opening section 61 of the semiconductor device 100 of the present example is different from the semiconductor device 100 described in FIG. 1 to FIG. 7. The other structures may be the same as that of any semiconductor device 100 described in FIG. 1 to FIG. 7.

In the present example, the width Y2 in the Y-axis direction of the first opening section 61 in the boundary mesa section 60-1 may be larger than a width Y1 of the first opening section 61 in any mesa section 60 of the transistor section 70. The width Y2 in the Y-axis direction of the first opening section 61 in the boundary mesa section 60-1 may be larger than the width Y1 of the first opening section 61 in any mesa section 60 of the transistor section 70. Accordingly, on the boundary between the transistor section 70 and the diode section 80, the carriers such as holes can be efficiently extracted. For this reason, the carriers in one of the transistor section 70 and the diode section 80 can be suppressed from affecting those in the other.

Also, the width Y3 in the Y-axis direction of the first opening section 61 in the diode section 80 may be larger than the width Y1 of the first opening section 61 in the mesa section 60 of the transistor section 70. The width Y3 of the first opening section 61 in the diode section 80 may be large as the mesa section 60 that is apart from the transistor section 70. Also, the width Y3 of the first opening section 61 of at least parts of the mesa sections 60 in the diode section 80 may be larger than the width Y2 of the first opening section 61 in the boundary mesa section 60-1. According to such a structure, in the diode section 80, inhibition of the movement of the carriers such as holes by the second accumulation region 17 can be suppressed.

Figure 9:
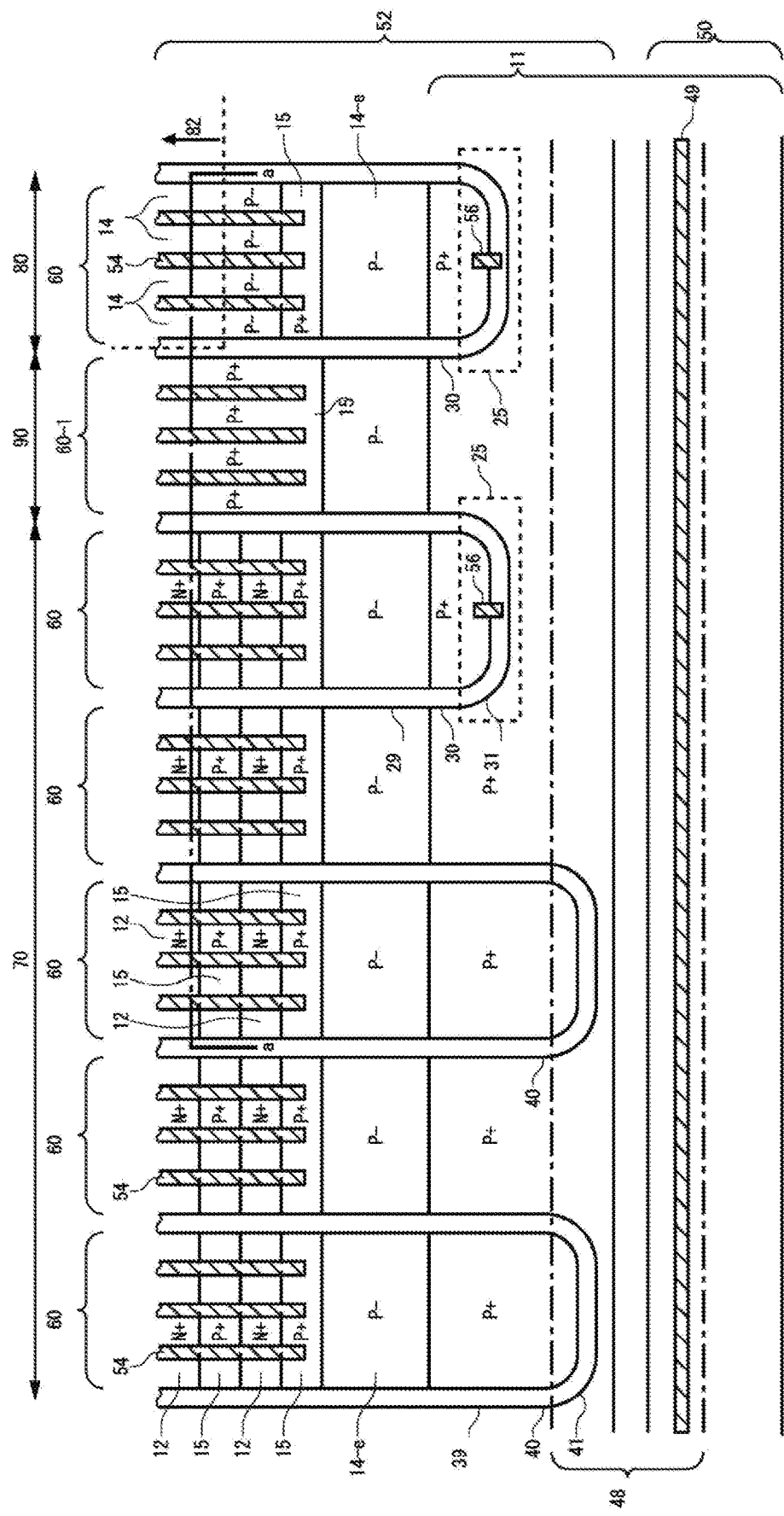
FIG. 9 is a drawing showing another example of an upper surface of the semiconductor device 100.

FIG. 9 is a drawing showing another example of the upper surface of the semiconductor device 100. In the present example, in a region sandwiched between the base regions 14-e of each of the mesa sections 60 of the transistor section 70, the contact region 15 and the emitter region 12 are alternately arranged along the X-axis direction. In the Y-axis direction, the width of the contact region 15 and the emitter region 12 is equal to the width of the mesa section 60. That is, the contact region 15 and the emitter region 12 are formed so as to be in direct contact with both of the two trench sections sandwiching the mesa section 60 in each of the mesa sections 60. The other structures are the same as those of the semiconductor device 100 shown in FIG. 1 and FIG. 2.

Figure 10:
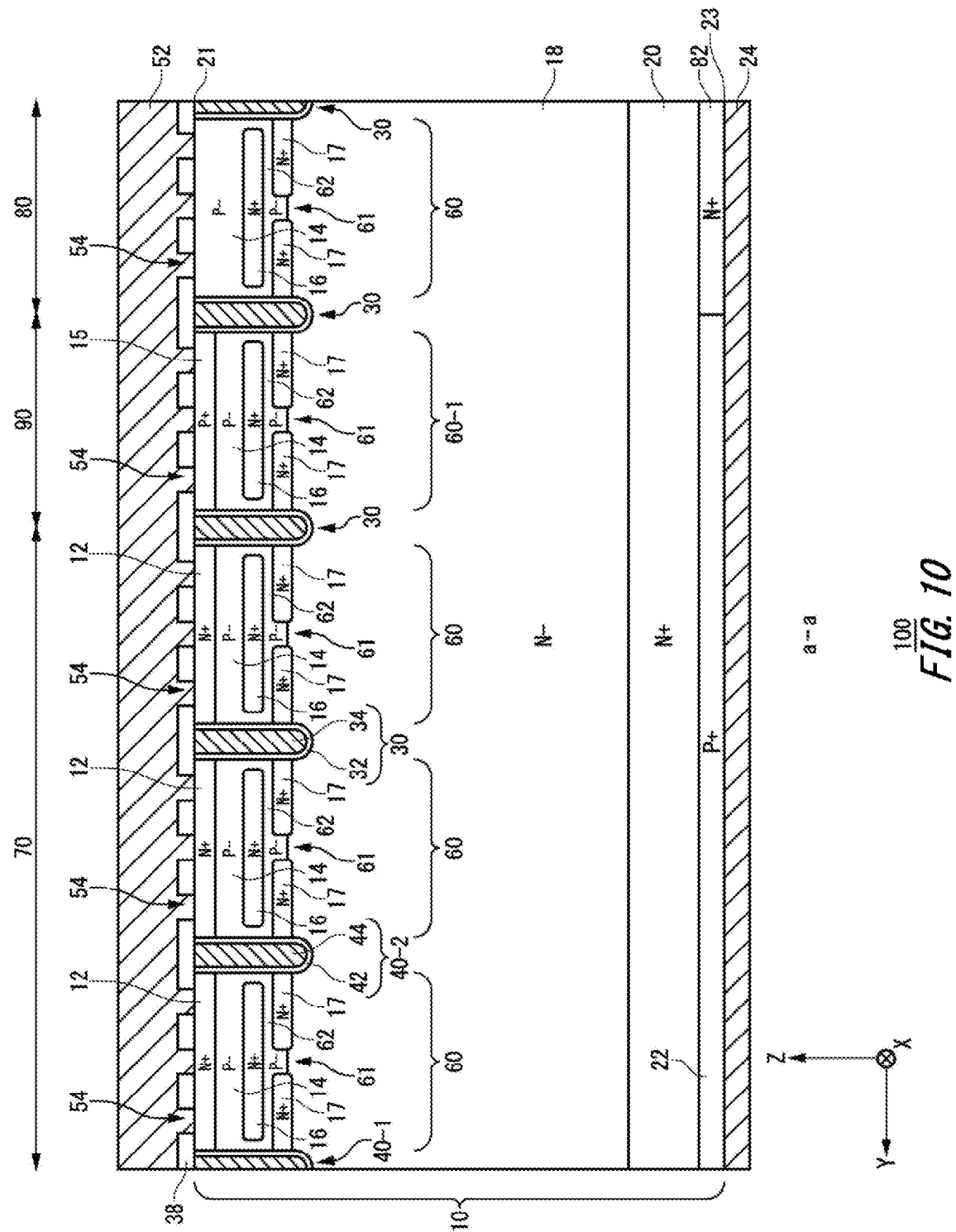
FIG. 10 is a drawing showing the cross section taken along line a-a in FIG. 9.

FIG. 10 is a drawing showing the cross section taken along line a-a in FIG. 9. The cross section taken along line a-a of the present example is the Y-Z plane passing through the emitter region 12 of the transistor section 70. The cross section taken along line a-a of the present example is different from that of the semiconductor device 100 shown in FIG. 1 to FIG. 8 in the following respect: the cross section taken along line a-a of the present example is arranged such that the emitter region 12 is in direct contact with two trench sections in the mesa section 60 of the transistor section 70. The other structures are the same as those of the semiconductor device 100 in any aspect shown in FIG. 1 to FIG. 8. According to such a structure as well, lowering of the ON voltage and reduction of the turn-off loss can both easily achieved.

Figure 11:
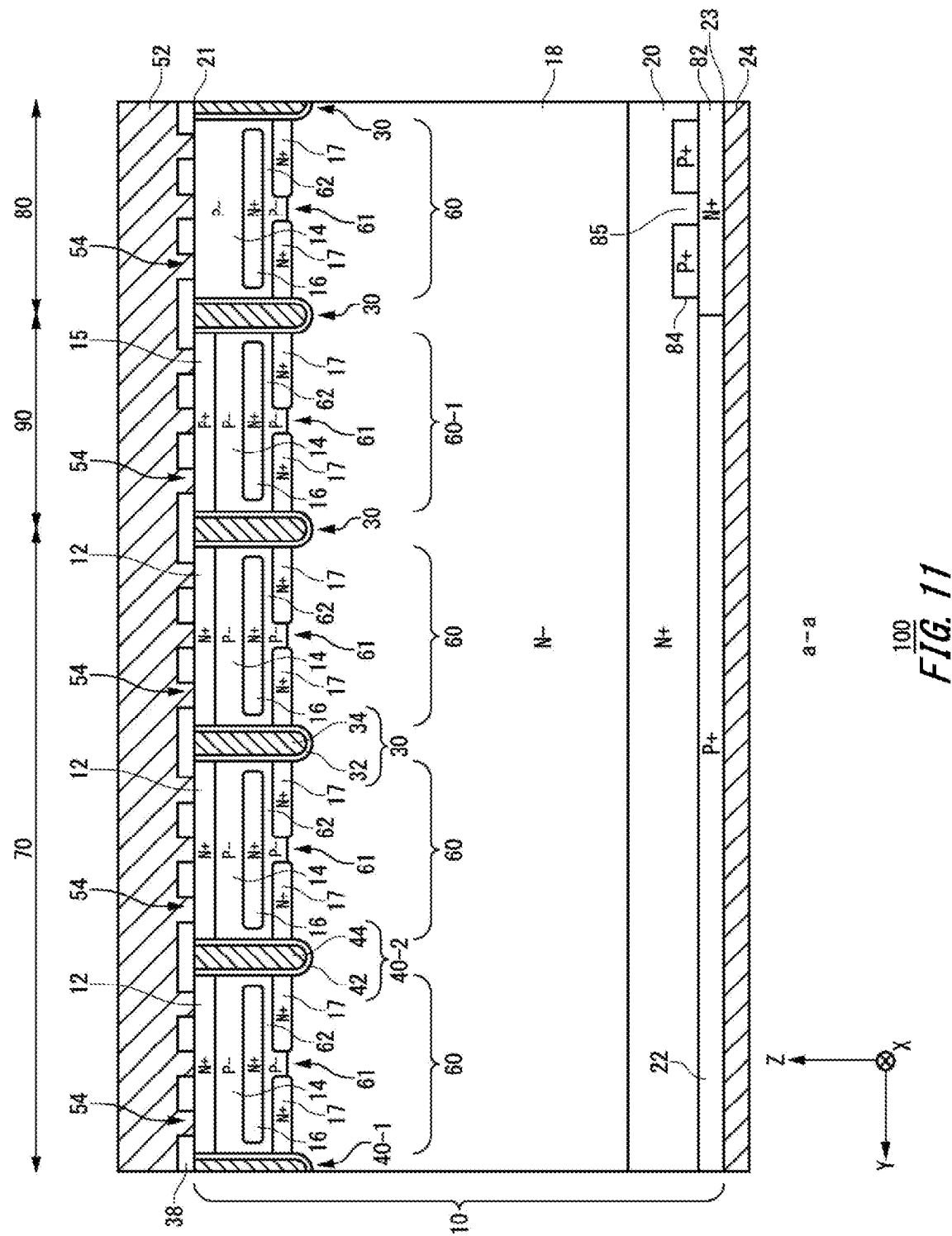
FIG. 11 is a drawing showing another example of the cross section taken along line a-a in FIG. 9.

FIG. 11 is a drawing showing another example of the cross section taken along line a-a in FIG. 9. The semiconductor device 100 of the present example further includes a floating region 84 in addition to the configuration of any semiconductor device 100 described in FIG. 1 to FIG. 10. The floating region 84 is formed above the cathode region 82 in the diode section 80.

The floating region 84 is a region of a second conductivity type (P+ type, in the present example) that is in an electrically floating state. The electrically floating state refers to a state in which the floating region 84 is not in contact with any of the collector electrode 24 and the emitter electrode 52. By providing the floating region 84, electron injection from the cathode region 82 can be suppressed. Accordingly, even if a lifetime killer is not formed on the lower surface side of the semiconductor substrate 10, the carrier distribution in the depth direction of the semiconductor substrate 10 can be adjusted. For this reason, manufacturing cost of the semiconductor device 100 can be reduced, and also, leak current resulted from the lifetime killer can be reduced.

Note that the floating region 84 is formed so as to partially cover the cathode region 82. The floating region 84 may be provided with the third opening section 85. That is, a part of the cathode region 82 is not covered by the floating region 84. Accordingly, even if the floating region 84 is provided, the diode section 80 can perform diode operation. To suppress the electron injection, the floating region 84 may be formed by covering a range larger than a half of the upper surface of the cathode region 82.

Note that the floating region 84 may not be arranged at a position overlapping the first opening section 61. That is, the third opening section 85 and the first opening section 61 may not be positioned so as to be overlapped with each other. In this case, electrons are injected right below the first opening section 61 from the cathode region 82.

Figure 12:
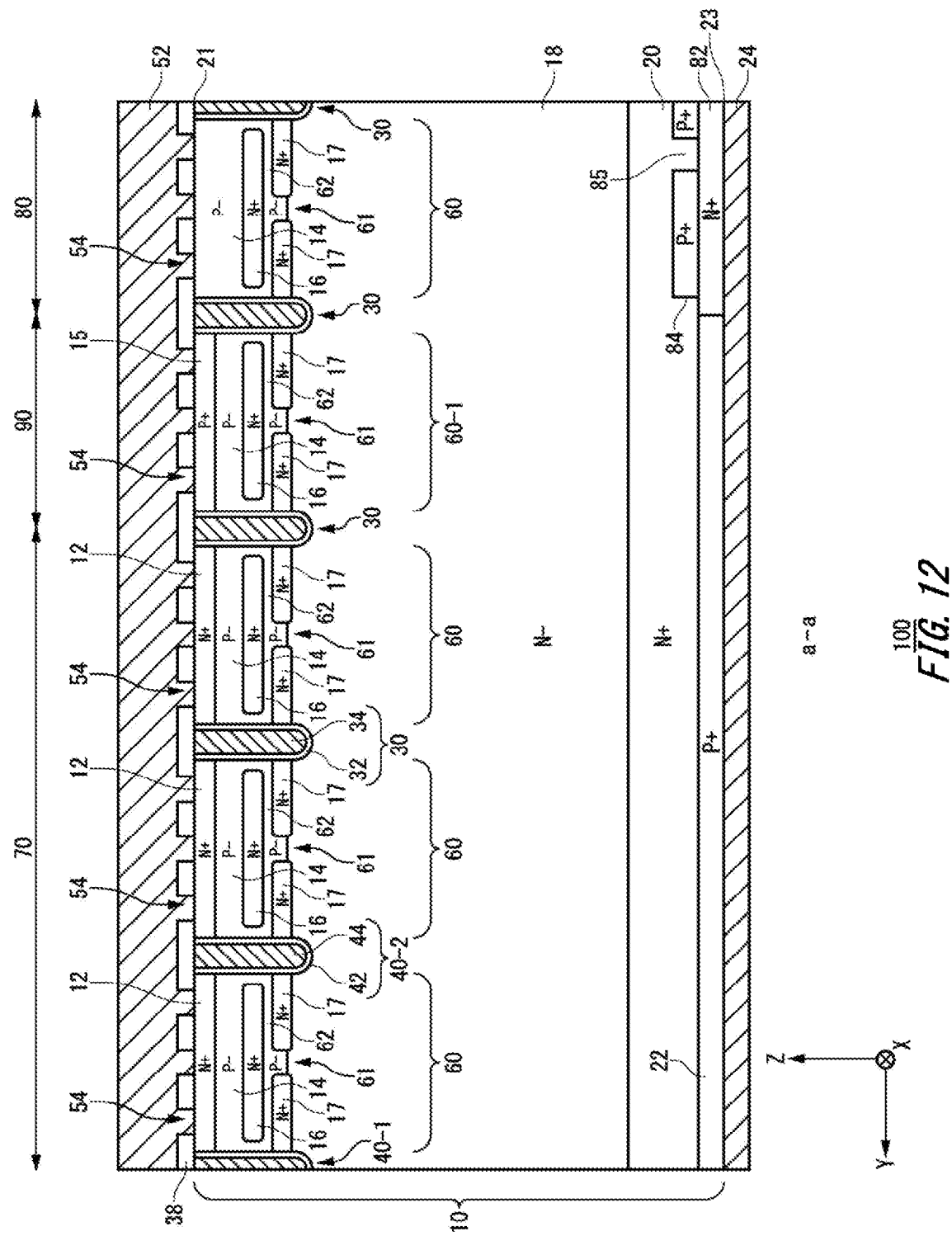
FIG. 12 is a drawing showing another example of the cross section taken along line a-a in FIG. 9.

FIG. 12 is a drawing showing another example of the cross section taken along line a-a in FIG. 9. In the semiconductor device 100 of the present example, the arrangement of the floating region 84 is different from that in the semiconductor device 100 shown in FIG. 11. The other structures are the same as those of the semiconductor device 100 shown in FIG. 11.

The floating region 84 of the present example is positioned so as to overlap the first opening section 61. That is, the floating region 84 is arranged such that the third opening section 85 and the first opening section 61 are not overlapped with each other. In this case, electrons are injected, from the cathode region 82, in a position deviating from the first opening section 61 in the Y-axis direction.

FIG. 13 is an enlarged view of another example of the Y-Z cross section of the mesa section 60. In the mesa section 60 of the present example, the structure of the gate trench section 40 is different from that of the gate trench section 40 in any semiconductor device 100 shown in FIG. 1 to FIG. 12. The other structures may be the same as those of any semiconductor device 100 shown in FIG. 1 to FIG. 12.

The gate trench section 40 of the present example has a thin film portion 72 having a thin gate insulating film 42, and a thick film section 74 having a thicker gate insulating film 42 than that of the thin film portion 72. A thickness of the gate insulating film 42 in the Y-axis direction may be used as the thickness of the gate insulating film 42. By providing the thick film section 74, the breakdown voltage of the gate trench section 40 on the lower end of the gate trench section 40 can be improved.

In the present example, because holes move in the Y-axis direction along the intermediate region 62, electron current is attracted to the holes and easily extends to the middle side of the mesa section 60 as well. In this case, a path length in which the electron current flows in the P type region becomes long and the ON voltage is increased. In the present example, it is preferable that the first accumulation region 16 and the intermediate region 62 are arranged facing the thin film portion 72. In the thin film portion 72, because electrons are strongly attracted to the gate conductive section 44, the electron current easily flows along the gate trench section 40. The second accumulation region 17 may be arranged facing the thin film portion 72, may be arranged facing the thick film section 74, and may also be arranged across both of the thin film portion 72 and the thick film section 74.

Figure 14:
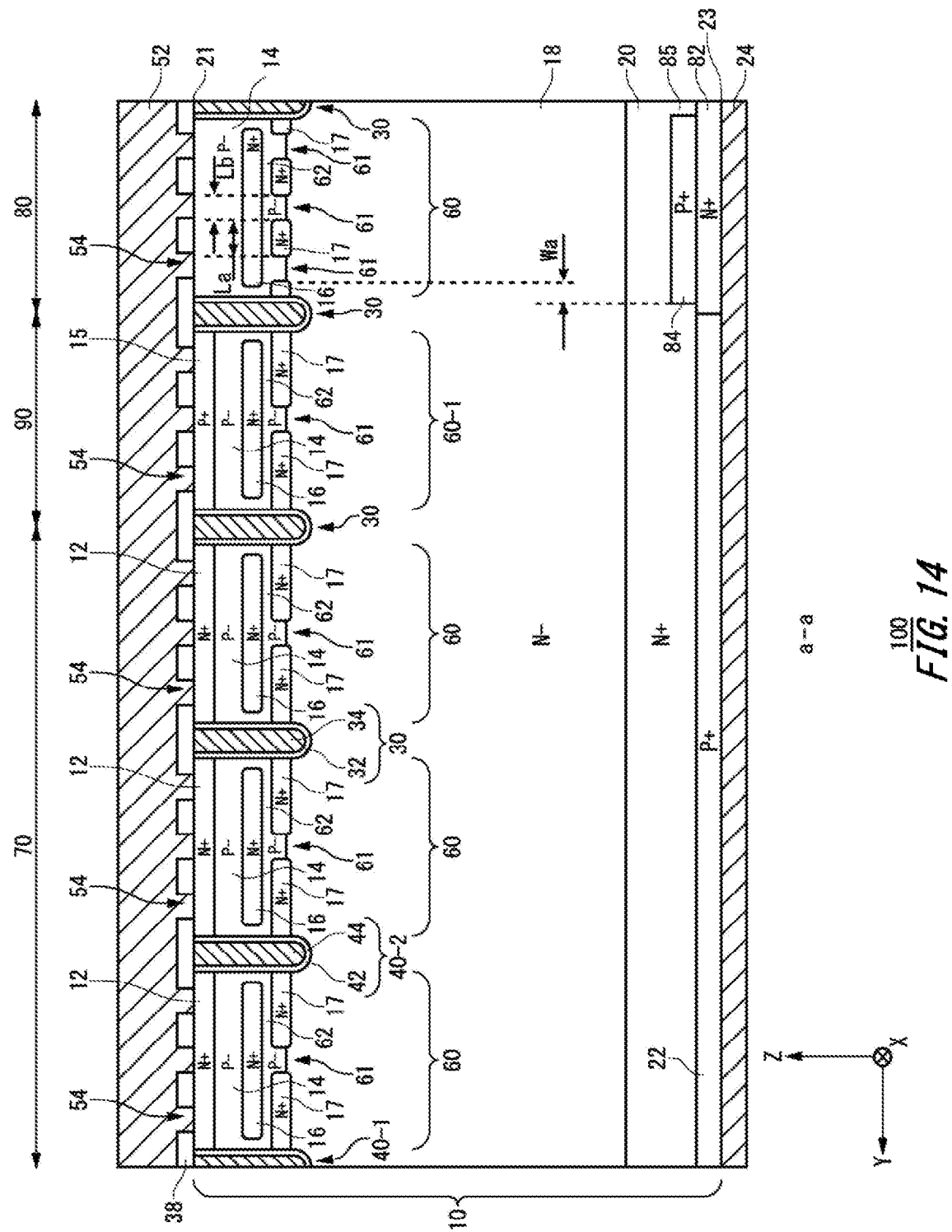
FIG. 14 is a drawing showing another example of the cross section taken along line a-a in the semiconductor device 100.

FIG. 14 is a drawing showing another example of the cross section taken along line a-a in the semiconductor device 100. In the semiconductor device 100 of the present example, the structure of the diode section 80 is different from that in the semiconductor device 100 described in FIG. 1 to FIG. 13. The transistor section 70 and the boundary section 90 may be the same as the transistor section 70 and the boundary section 90 in any aspect described in FIG. 1 to FIG. 13. The transistor section 70 and the boundary section 90 in the example of FIG. 14 are the same as the transistor section 70 and the boundary section 90 shown in FIG. 10.

In the diode section 80 of the present example, the structure of the second accumulation region 17 is different from that in the diode section 80 shown in FIG. 10. The other structures may be the same as those of the diode section 80 shown in FIG. 10. In the second accumulation regions 17 of the diode section 80 of the present example, the number of the first opening sections 61 arranged along the Y-axis direction (the mesa width direction) per mesa section 60 is larger than the number of the first opening sections 61 per mesa section 60 arranged in the transistor section 70 along the Y-axis direction. In the present example, each mesa section 60 of the transistor section 70 is provided with one first opening section 61, and each mesa section 60 of the diode section 80 is provided with a plurality of first opening sections 61 along the Y-axis direction.

Any first opening section 61 in each mesa section 60 of the diode section 80 may be arranged at a position corresponding to the first opening section 61 of each mesa section 60 of the transistor section 70. The corresponding position refers to that the position in the Y-axis direction within the mesa section 60 is the same. In the present example, the first opening section 61 of each mesa section 60 of the transistor section 70 is arranged at the middle of each mesa section 60 in the Y-axis direction, and any first opening section 61 of each mesa section 60 of the diode section 80 is also arranged at the middle of each mesa section 60 in the Y-axis direction. The arrangement of the first opening section 61 in the boundary mesa section 60-1 may be the same as that of the mesa section 60 of the transistor section 70, may be the same as that of the mesa section 60 of the diode section 80, and may also be different from that of the transistor section 70 and the diode section 80.

By setting the number of the first opening sections 61 in the second accumulation region 17 of the transistor section 70 to be relatively small, the carrier accumulation effect during the turned-on period can be maintained. Also, by providing further more first opening sections 61 in the second accumulation region 17 of the diode section 80, the injection amount of carriers from an anode side can be increased and a forward voltage of the diode section 80 can be smaller. Also, carriers during the turned-off period and the like can be easily extracted. Also, by distributing the first opening sections 61 in the second accumulation regions 17 of the diode section 80, the P-N junction can be distributed in the Y-axis direction and the start point where the depletion layer extends can be distributed. For this reason, the breakdown voltage of the semiconductor device 100 can be improved.

The width of each of the first opening sections 61 in the Y-axis direction in diode section 80 may be the same as and may also be different from the width of the first opening section 61 in the Y-axis direction in the transistor section 70. Also, the widths of the respective first opening sections 61 in the diode section 80 may be the same as each other and may also be different from each other.

Also, the numbers of the first opening sections 61 in the Y-axis direction in the respective mesa sections 60 of the diode section 80 may be the same as each other and may also be different from each other. As one example, the number of the first opening sections 61 of the mesa section 60 may decrease as the distance from the transistor section 70 to the mesa section 60 in the Y-axis direction increases.

The diode section 80 of the present example further has the floating region 84. The floating region 84 may be arranged such that the cathode region 82 is exposed at the boundary between the floating region 84 and the boundary mesa section 60-1. The floating region 84 may be provided so as to overlap the first opening section 61 of the diode section 80 in the Z-axis direction. The floating region 84 of the present example has a third opening section 85 below the dummy trench section 30 and does not have the third opening section 85 at the other positions. In the example of FIG. 14, although the floating region 84 is provided across one mesa section 60, the floating region 84 may also be continuously provided across a plurality of mesa sections 60 along the Y-axis direction.

In the diode section 80, a width La in the Y-axis direction of the second accumulation region 17 that is not in contact with the trench section may be longer than a width Lb of the first opening section 61. In this case, the injection amount of the carriers from the anode side of the diode section can be reduced and the reverse recovery loss of the diode section 80 can be made small.

In the diode section 80, the width La in the Y-axis direction of the second accumulation region 17 that is not in contact with the trench section may be shorter than the width Lb of the first opening section 61. In this case, the P-N junction between the drift region 18 and the base region 14 can be widely distributed in the Y-axis direction and the start point where the depletion layer extends can be widely provided. For this reason, the breakdown voltage of the semiconductor device 100 can be improved.

In the floating region 84 that is the closest to the boundary section 90, a length Wa from a position of the end portion on the boundary section 90 side to the end portion in the Y-axis direction of the second accumulation region 17 that is in contact with the dummy trench section 30 inside the mesa section 60 in which the end portion is projected on the upper surface 21 of the semiconductor substrate 10 may be equal to or less than 5 µm. Accordingly, the hole injection during the reverse recovery is ensured and surge voltage is suppressed.

Figure 15:
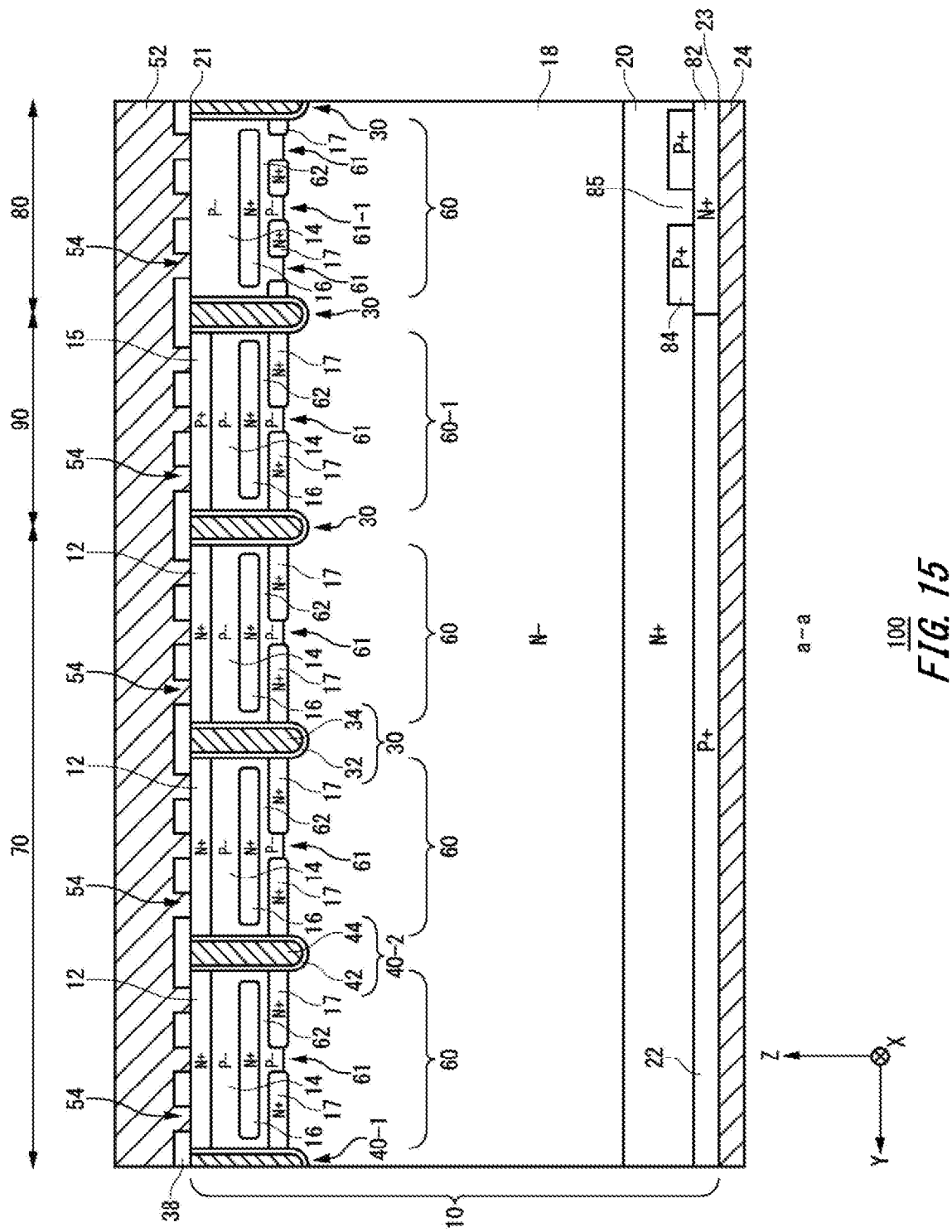
FIG. 15 is a drawing showing another example of the cross section taken along line a-a in the semiconductor device 100.

FIG. 15 is a drawing showing another example of the cross section taken along line a-a in the semiconductor device 100. In the semiconductor device 100 of the present example, the structure of the diode section 80 is different from that in the semiconductor device 100 described in FIG. 14. The transistor section 70 and the boundary section 90 may be the same as the transistor section 70 and the boundary section 90 in any aspect described in FIG. 14.

In the diode section 80 of the present example, the structure of the floating region 84 is different from that in the diode section 80 shown in FIG. 14. The other structures may be the same as those of the diode section 80 shown in FIG. 14. In the floating region 84, at least one third opening section 85 is positioned in the Z-axis direction so as to overlap any first opening section 61 provided in the second accumulation region 17 of the diode section 80.

In the example of FIG. 15, the floating region 84 has the third opening section 85 overlapping the first opening section 61-1 arranged at the middle in the Y-axis direction of the mesa section 60. In another example, the floating region 84 may also have a plurality of third opening sections 85 discretely arranged in the Y-axis direction within one mesa section 60 so as to overlap each of the first opening sections 61 of the mesa section 60. By overlapping the first opening section 61 and the third opening section 85 with each other, the carrier injection can be enhanced.

Figure 16:
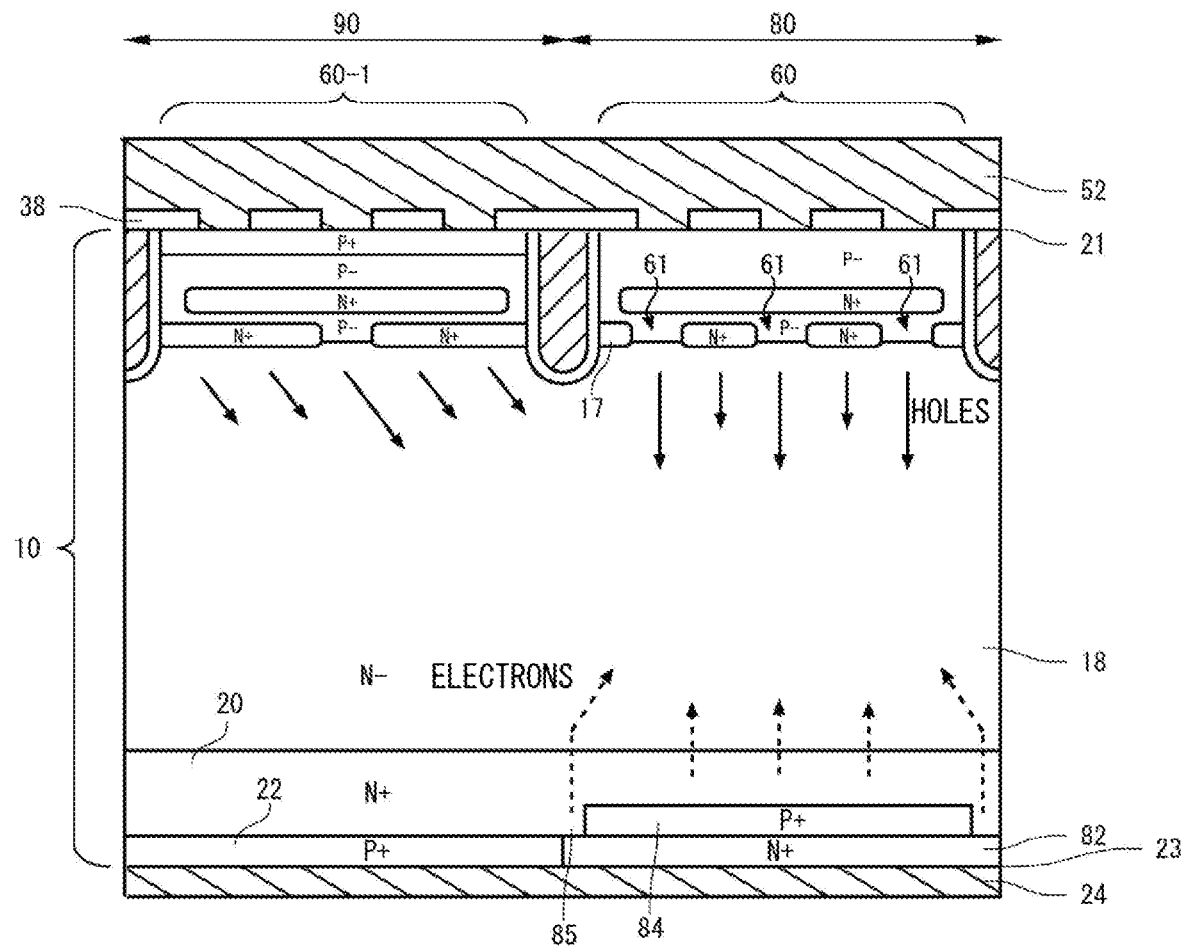
FIG. 16 is a drawing describing an exemplary operation of the semiconductor device 100 shown in FIG. 14.

FIG. 16 is a drawing describing an exemplary operation of the semiconductor device 100 shown in FIG. 14. FIG. 16 shows a state in which a forward bias is applied to the diode section 80. Also, in FIG. 16, the hole injection is shown by solid arrows and the electron injection is shown by dashed arrows.

In the present example, because the plurality of first opening sections 61 are provided in the diode section 80, during a period in which the forward bias is applied thereto, the hole injection amount from the anode side can be increased. For this reason, the forward bias of the diode section 80 can be made small.

Figure 17:
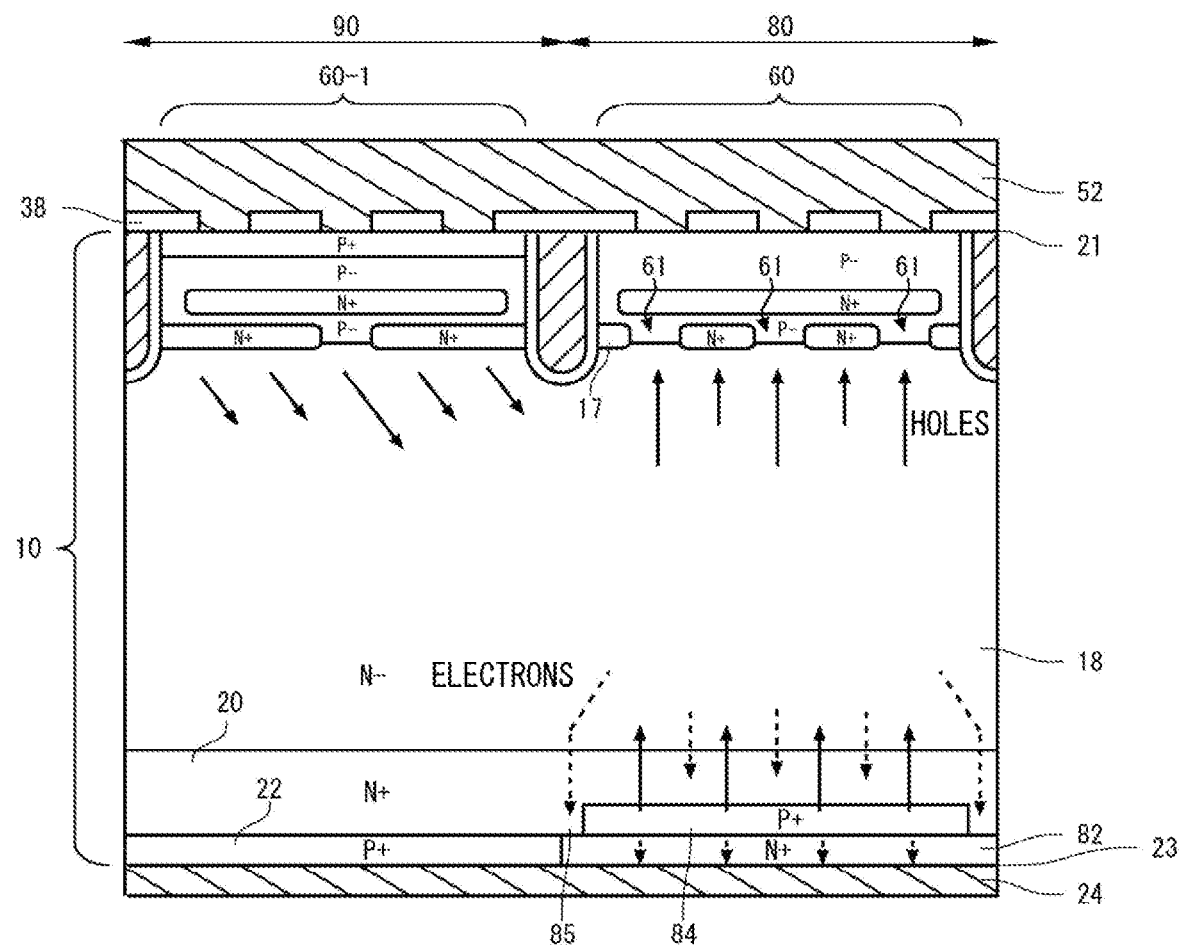
FIG. 17 is a drawing describing an exemplary operation of the semiconductor device 100 shown in FIG. 14.

FIG. 17 is a drawing describing the exemplary operation of the semiconductor device 100 shown in FIG. 14. FIG. 17 shows a state in which the diode section 80 is undergoing the reverse recovery. In the present example, because the plurality of first opening sections 61 are provided in the diode section 80, during the reverse recovery, the hole extracting amount from the anode side can be increased. For this reason, the reverse recovery time of the diode section 80 can be shortened.

During the reverse recovery, the p-n junction between the floating region 84 and the cathode region 82 is in a reverse bias state and avalanche current resulted from avalanche breakdown occurs. For that reason, holes flow toward the buffer region 20 and the drift region 18 from the p-n junction, and electrons flow toward the cathode region 82 from the p-n junction.

Note that a width in the Y-axis direction of the third opening section 85 at a boundary between the boundary section 90 and the diode section 80 may be equal to or less than 5 µm. Accordingly, the electrons can be suppressed from being rapidly extracted and the surge current during the reverse recovery can be made small.

Figure 18:
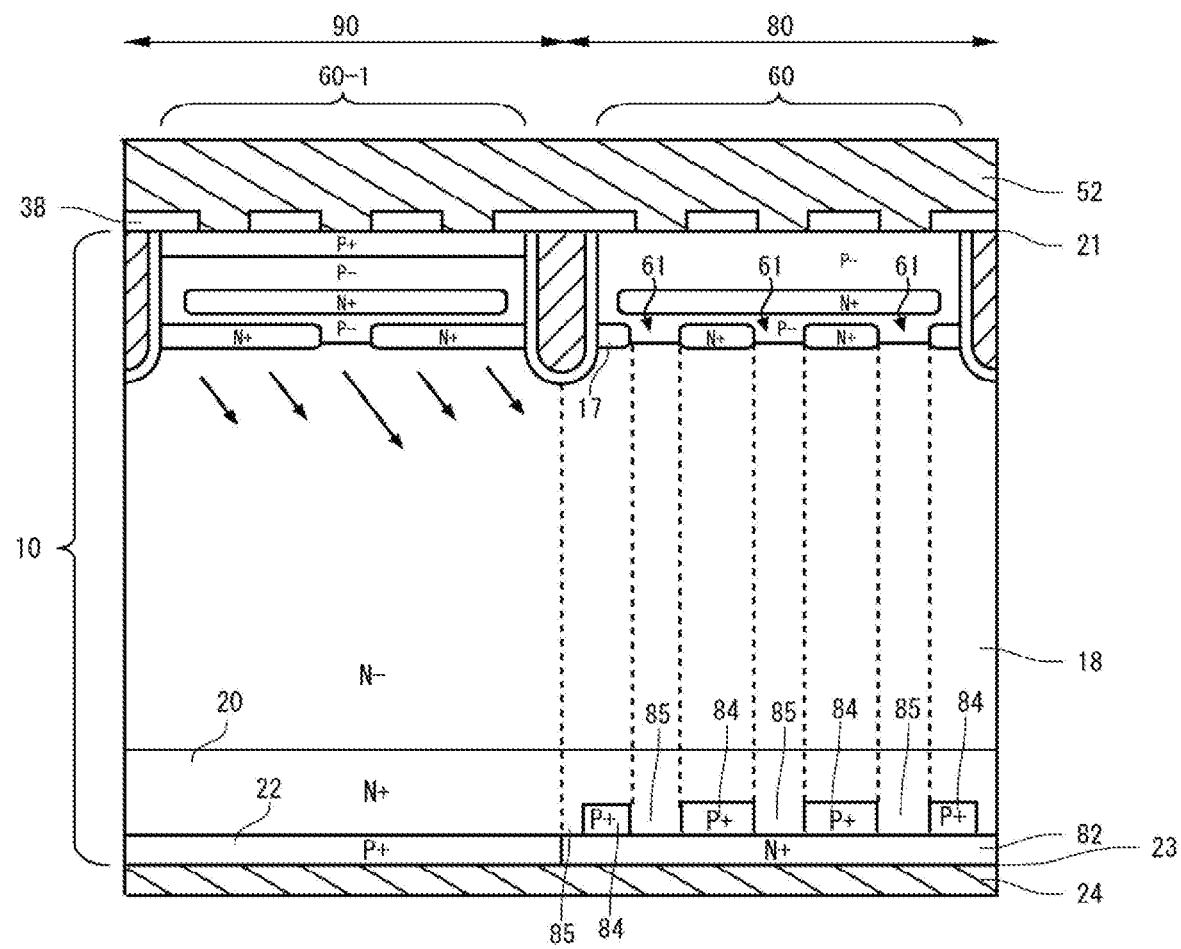
FIG. 18 is a drawing showing another example of the cross section taken along line a-a in the semiconductor device 100.

FIG. 18 is a drawing showing another example of the cross section taken along line a-a in the semiconductor device 100. In the semiconductor device 100 of the present example, the structure of the diode section 80 is different from that in the semiconductor device 100 described in FIG. 15. The transistor section 70 and the boundary section 90 may be the same as the transistor section 70 and the boundary section 90 in any aspect described in FIG. 15.

In the present example of the diode section 80, the structure of the floating region 84 is different from that in the diode section 80 shown in FIG. 15. The other structures may be the same as those of the diode section 80 shown in FIG. 15. The floating region 84 of the present example has a plurality of third opening sections 85 arranged discretely in the Y-axis direction so as to overlap each of the first opening sections 61 of the mesa section 60. Accordingly, the carrier injection during the period in which the forward bias is applied thereto can be enhanced and the forward voltage can be made further small. The corresponding first opening section 61 and third opening section 85 may be partially overlapped with each other and may also be entirely overlapped with each other.

Figure 19:
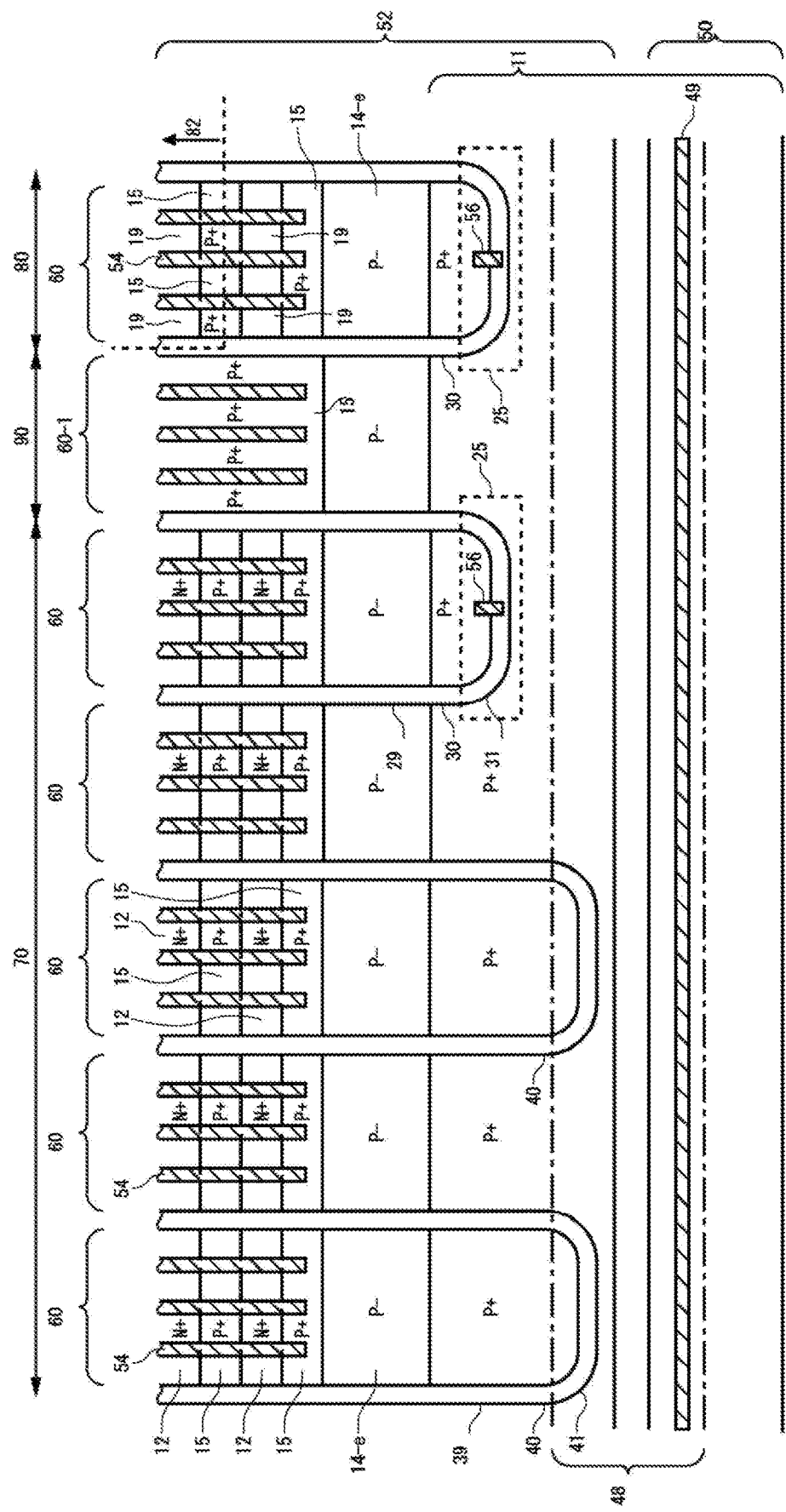
FIG. 19 is a drawing showing another example of the upper surface of the semiconductor device 100.

FIG. 19 is a drawing showing another example of the upper surface of the semiconductor device 100. In the semiconductor device 100 of the present example, the structure of the diode section 80 is different from that in the semiconductor device 100 in any aspect described in FIG. 1 to FIG. 18. The other structures may be the same as those of the semiconductor device 100 in any aspect described in FIG. 1 to FIG. 18. In the example shown in FIG. 19, the structures other than the diode section 80 are the same as those of the semiconductor device 100 shown in FIG. 9.

On the upper surface of the semiconductor substrate 10 in each mesa section 60 of the diode section 80 of the present example, the P+ type contact region 15 and the adjusting region 19 having smaller hole mobility than that of the contact region 15 are alternately arranged along a direction perpendicular to the mesa width direction (the X-axis direction). The adjusting region 19 may be a P type region having a lower doping concentration than the contact region 15. The doping concentration of the adjusting region 19 may be the same as and may also be different from that of the base region 14. In another example, the adjusting region 19 may also be an N type region. The doping concentration of the adjusting region 19 may be the same as and may also be different from that of the emitter region 12.

By providing the contact region 15 in the diode section 80, the carrier injection amount to the drift region 18 of the diode section 80 can be increased, and a forward voltage Vf of the diode section 80 can be small. Particularly, the forward voltage Vf during a high current operation can be set small. However, if an area of the contact region 15 is set large, a peak value Irp of reverse current flowing during the reverse recovery operation becomes large. By adjusting an area ratio of the contact region 15 formed on the upper surface of the mesa section 60 of the diode section 80 to the adjusting region 19, the forward voltage Vf of the diode section 80 and the peak value Irp of the reverse current can be adjusted.

As one example, the contact region 15 in the diode section 80 may be provided having the same width at the same position in the X-axis direction as those of the contact region 15 in the transistor section 70. The adjusting region 19 may be provided having the same width at the same position in the X-axis direction as those the emitter region 12 of the transistor section 70. These positions and widths may be the position and the width of the upper surface of the semiconductor substrate 10.

In another example, at least one of the width and the position in the X-axis direction of the contact region 15 in the diode section 80 may be different from those of the contact region 15 in the transistor section 70. At least one of the position and the width in the X-axis direction of the adjusting region 19 may be different from those of the emitter region 12 of the transistor section 70. By adjusting these positions and widths, the forward voltage Vf of the diode section 80 and the peak value Irp of the reverse current can be adjusted.

Although FIG. 19 shows an example in which the contact region 15 and the adjusting region 19 are alternately arranged along the X-axis direction, the arrangements of the contact region 15 and the adjusting region 19 are not limited to the example of FIG. 19. The arrangements of the contact region 15 and the adjusting region 19 can be changed under a condition that each of the contact regions 15 can be connected to the emitter electrode 52 via the contact hole 54.

Figure 20:
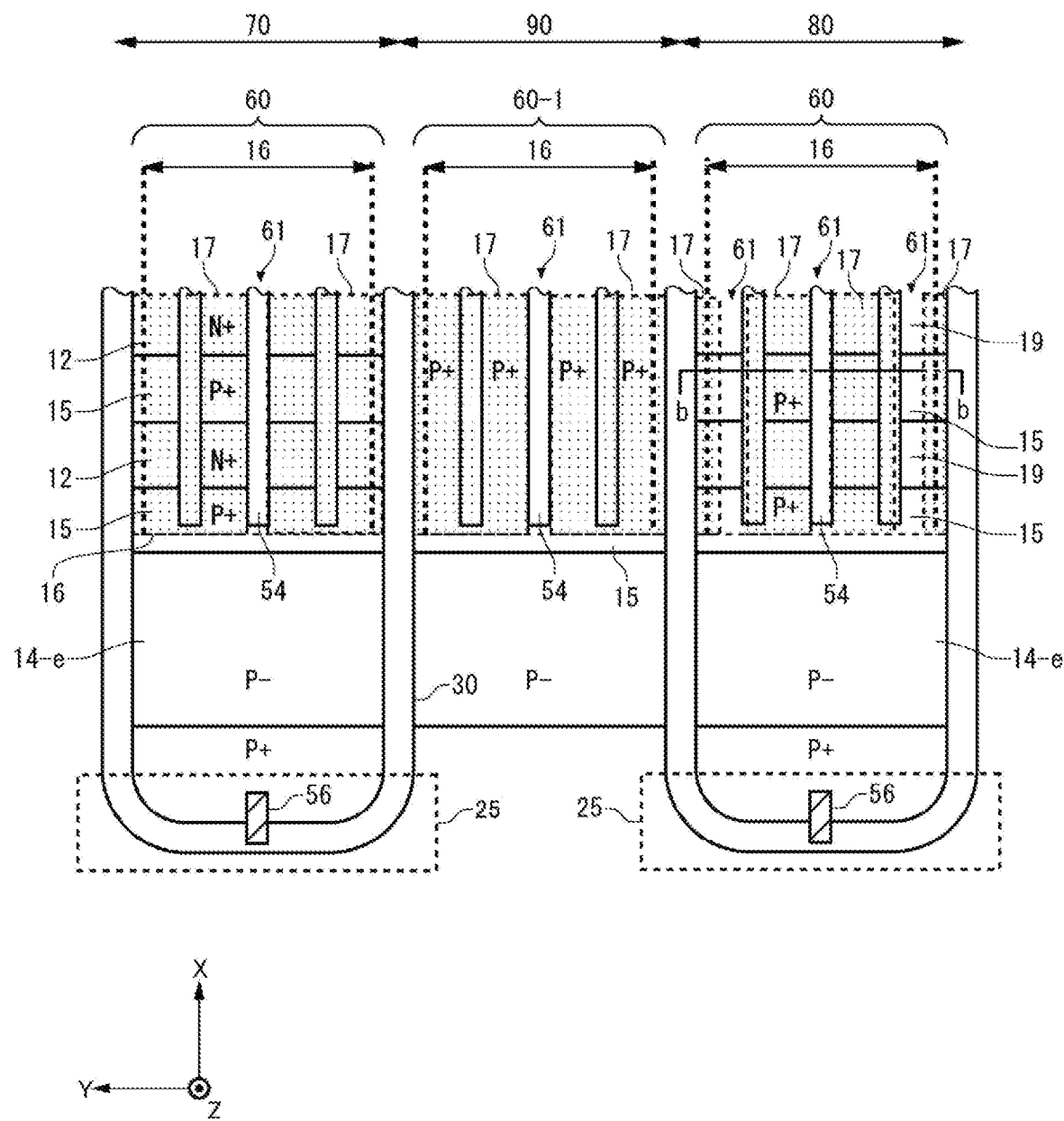
FIG. 20 is a top view showing an enlarged view of the mesa sections 60 in the transistor section 70, the diode section 80 and the boundary section 90 of the semiconductor device 100 shown in FIG. 19.

FIG. 20 is a top view showing enlarged upper surfaces of the mesa sections 60 in the transistor section 70, the diode section 80 and the boundary section 90 of the semiconductor device 100 shown in FIG. 19. In the present example, the region in which the second accumulation region 17 is provided is hatched by dots. Also, the hatching for the contact hole 54 is omitted.

In each of the mesa sections 60, similar to the example shown in FIG. 2, the first accumulation region 16, the second accumulation region 17, the first gap and the first opening section 61 are arranged in the stripe pattern along the X-axis direction. However, in the mesa section 60 of the diode section 80, a plurality of first opening sections 61 are arrayed along the Y-axis direction. Note that the end portion in the X-axis direction of the first accumulation region 16 and the second accumulation region 17 may be arranged closer to the base region 14-e (the negative side of the X axis) than the end portion of the contact hole 54, and may also be arranged at a position on the opposite side to the base region 14-e (the positive side of the X axis) relative to the end portion of the contact hole 54, similar to the example of FIG. 2.

Figure 21:
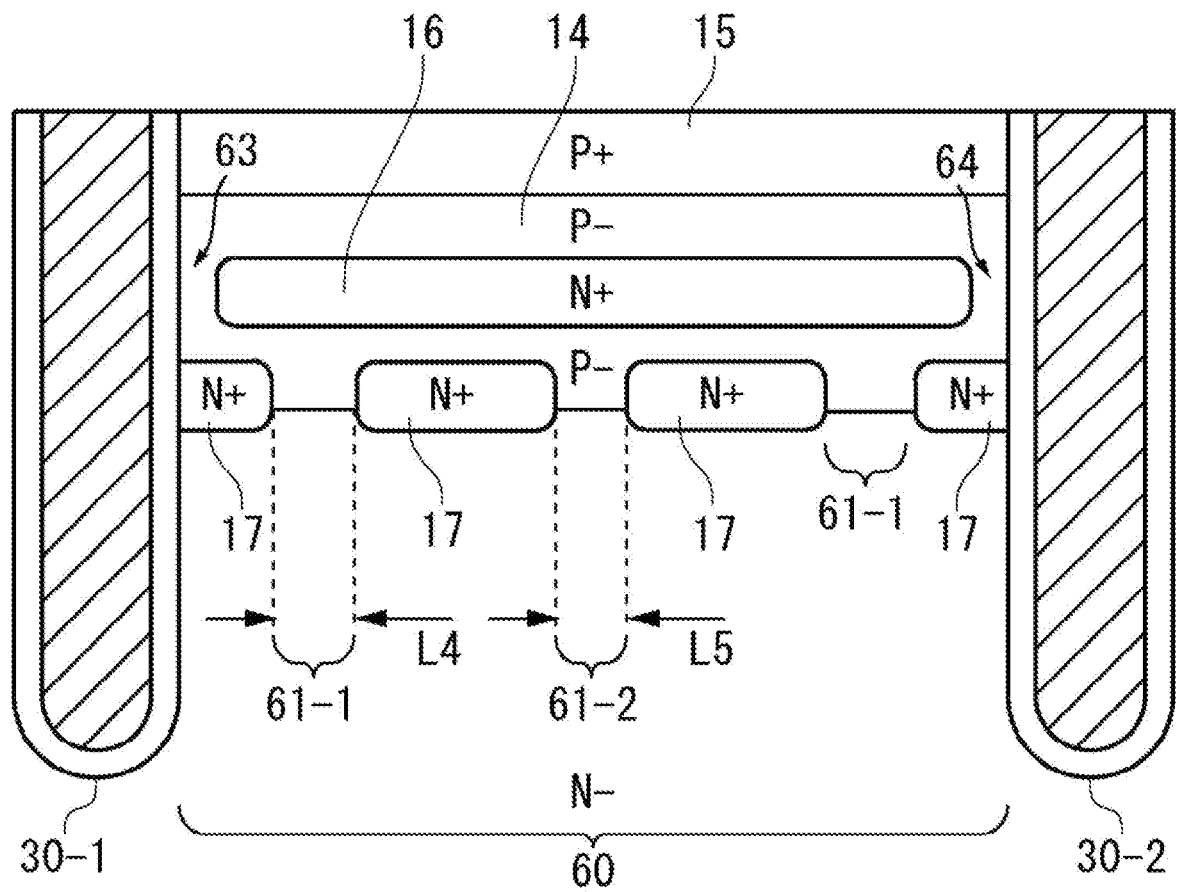
FIG. 21 is a drawing showing one example of a cross section taken along line b-b in the mesa section 60 of the diode section 80 shown in FIG. 20.

FIG. 21 is a drawing showing one example of the cross section taken along line b-b in the mesa section 60 of the diode section 80 shown in FIG. 20. As described above, the second accumulation region 17 is provided with the plurality of first opening sections 61.

In the present example, the first opening section 61-1 that is closest to the dummy trench section 30 among the plurality of first opening sections 61 is provided apart from the dummy trench section 30. The first opening section 61-1 may be provided so as not to overlap the first gaps 63, 64 in the Z-axis direction. A distance in the Y-axis direction between the first opening section 61-1 and the dummy trench section 30 may be two or more times as and may also be three or more times as large as a width in the Y-axis direction of the first gap 63.

Note that holes injected in the base region 14 from the contact region 15 become to pass through the first gaps 63, 64 more easily than passing through the first accumulation region 16. Most of the holes passing through the first gaps 63, 64 are injected in the drift region 18 via the first opening section 61-1 that is closest to the dummy trench section 30. For this reason, the holes passing through the first opening section 61-2 that is farthest from the dummy trench section 30 become less than the holes passing through the first opening section 61-1.

However, by providing the first opening section 61-2, the P-N junction in which the depletion layer extends can be distributed in the Y-axis direction. For this reason, the breakdown voltage of the diode section 80 can be improved. Note that because the amount of the holes passing through the first opening section 61-2 is relatively small, a width of the first opening section 61-2 in the Y-axis direction may also be small. Even if the width in the Y-axis direction is small, the first opening section 61-2 can serve as the start point where the depletion layer extends. On the other hand, it is preferable that the first opening section 61-1 has a width in certain degree to efficiently pass the holes therethrough. A width L4 in the Y-axis direction of the first opening section 61-1 that is closest to the dummy trench section 30 may be larger than a width L5 in the Y-axis direction of the first opening section 61-2 farthest from the dummy trench section 30. The width L4 may be 1.2 or more times as, may be 1.5 or more times as and may also be two or more times as large as the width L5.

Figure 22:
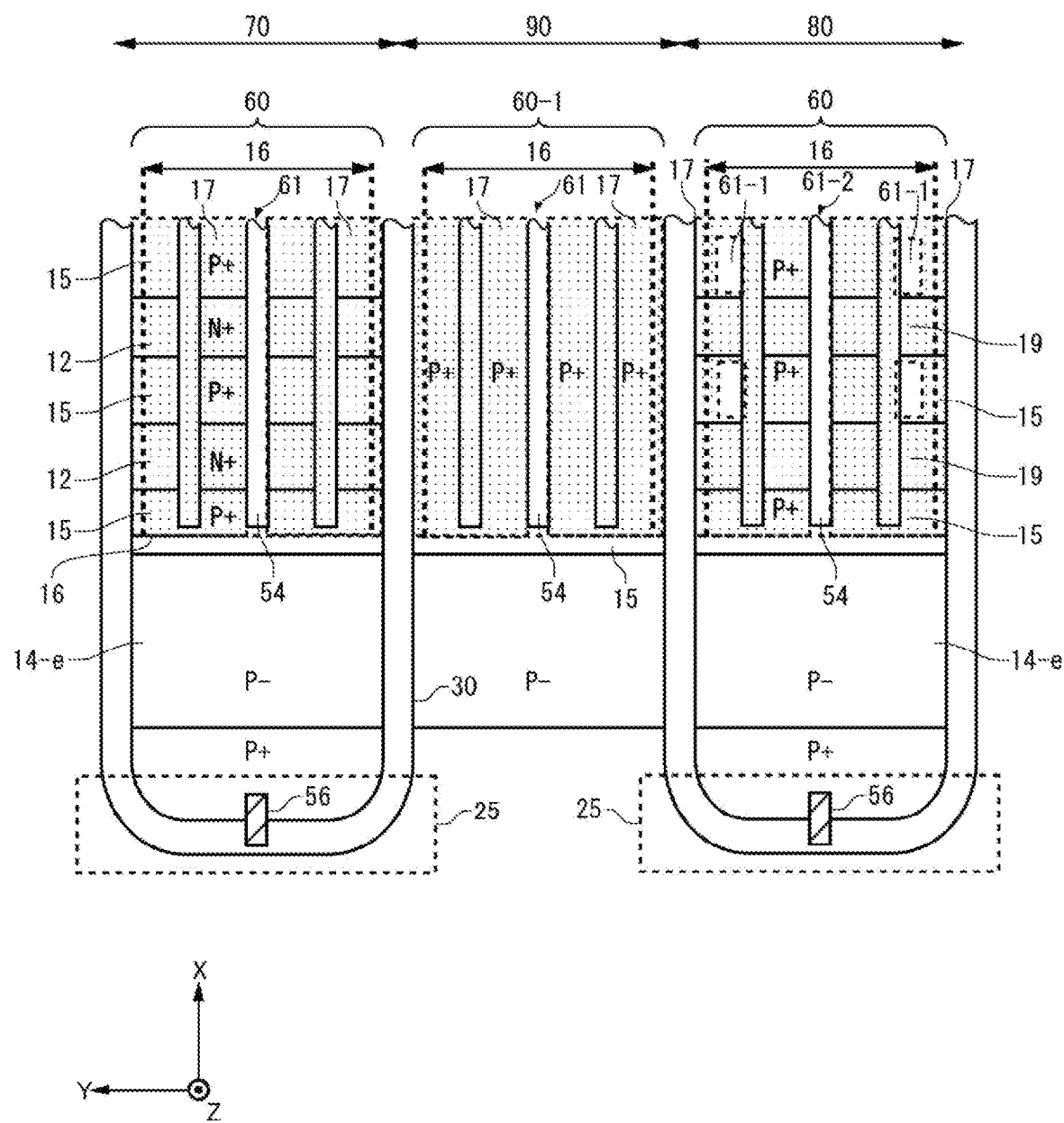
FIG. 22 is a drawing showing an exemplary arrangement of the first opening section 61 in an upper surface of the mesa section 60 of the diode section 80.

FIG. 22 is a drawing showing an exemplary arrangement of the first opening section 61 on the upper surface of the mesa section 60 of the diode section 80. In the example shown in FIG. 20, each of the first opening sections 61 in the mesa section 60 of the diode section 80 has been continuously formed in the X-axis direction. In the present example, in the mesa section 60 of the diode section 80, the first opening section 61-1 that is closest to the dummy trench section 30 is discretely arranged in the X-axis direction. The first opening section 61-2 may be continuously provided in the stripe pattern along the X-axis direction. The first opening section 61-2 may be formed longer than the first opening section 61-1 in the X-axis direction. The first opening section 61-2 may be continuously formed between two contact regions 15 arranged on both ends of the X-axis direction in the mesa section 60.

The first opening section 61-1 may be provided in a region overlapping the contact region 15 in a top view. The first opening section 61-1 may be provided in a region in which the whole first opening section 61-1 overlaps the contact region 15, and may also be provided in a region in which a partial region of the first opening section 61-1 may overlap the adjusting region 19. That is, a length in the X-axis direction of the first opening section 61-1 may be smaller than the length in the X-axis direction of the contact region 15, and may also be equal to or more than the length in the X-axis direction of the contact region 15.

By discretely providing the first opening section 61-1, the area of the first opening section 61-1 can be easily adjusted and the hole injection amount can be adjusted. For this reason, the forward voltage of the diode section 80 can be easily adjusted. Also, by continuously forming the first opening sections 61-2 along the X-axis direction, the start point where the depletion layer extends can be continuously formed along the X-axis direction. For this reason, the breakdown voltage of the diode section 80 can be improved.

Figure 23:
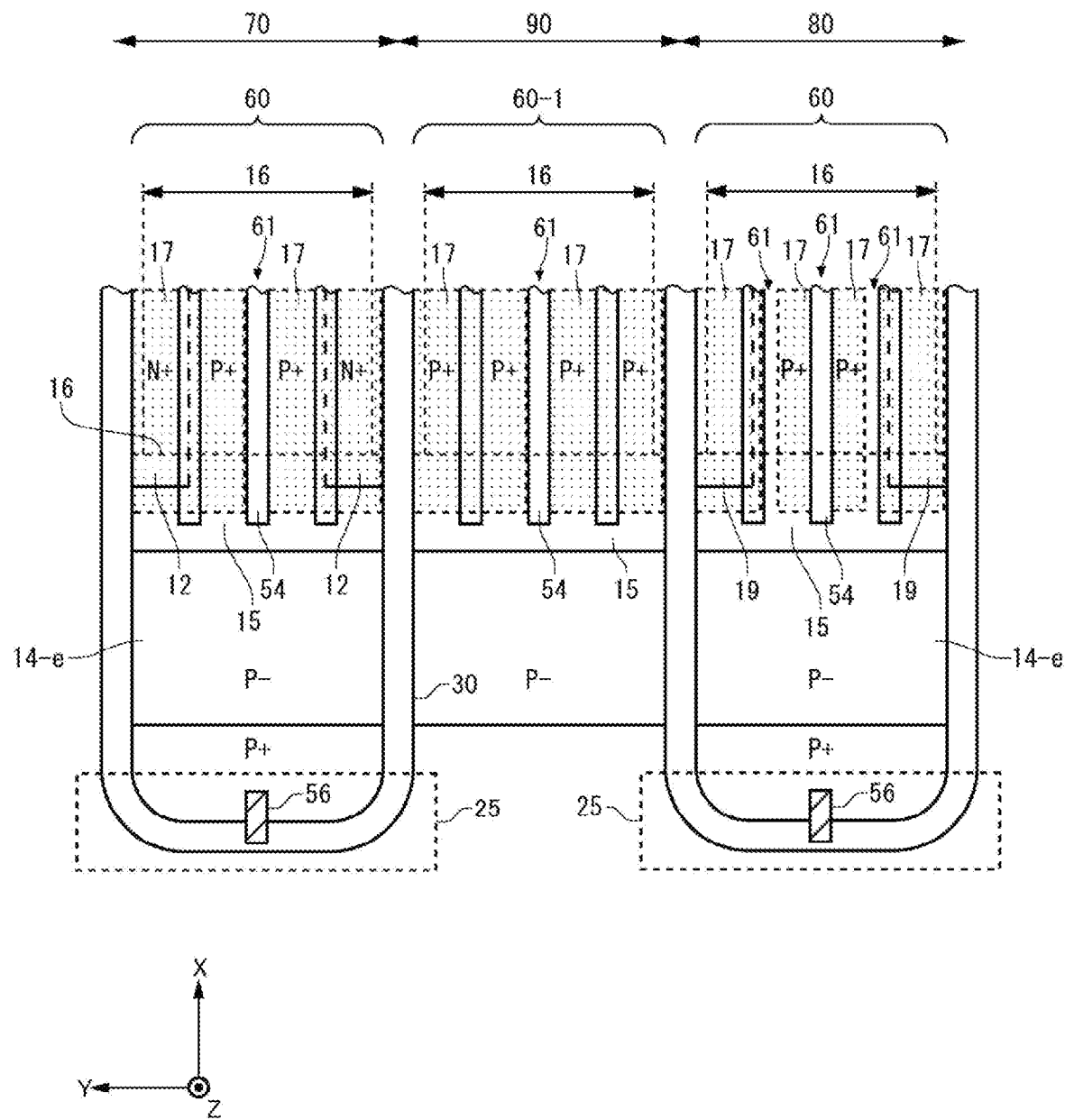
FIG. 23 is a drawing showing another example of upper surface structures of the mesa sections 60 in the transistor section 70, the diode section 80 and the boundary section 90.

FIG. 23 is a drawing showing another example shown of the upper surface structures of the mesa sections 60 in the transistor section 70, the diode section 80 and the boundary section 90. In the diode section 80 of the present example, the adjusting region 19 is formed in the stripe pattern along the X-axis direction. The shape of the adjusting region 19 may be the same as and may also be different from that of the emitter region 12 of the transistor section 70 shown in FIG. 2.

As one example, the width in the Y-axis direction of the adjusting region 19 may be the same as, may be thinner than and may also be thicker than the width in the Y-axis direction of the emitter region 12. By adjusting the shape of the adjusting region 19, the area of the contact region 15 can be adjusted.

The structures of the transistor section 70 and the boundary section 90 may be the same as those of the transistor section 70 and the boundary section 90 of the semiconductor device 100 in any aspect described in FIG. 1 to FIG. 22. The transistor section 70 and the boundary section 90 in the example of FIG. 23 have the same structures as those of the transistor section 70 and the boundary section 90 shown in FIG. 2.

FIG. 24 is a drawing showing another example of the cross section taken along line b-b of the semiconductor device 100. In the mesa section 60 of the diode section 80 of the present example, the contact region 15 is discretely provided along the Y-axis direction. Each of the contact regions 15 may be provided in the stripe pattern along the X-axis direction and may also be discretely provided. Each of the contact regions 15 is provided below the contact hole 54. On the upper surface of the mesa section 60 of the diode section 80, an adjusting region other than the contact region 15 may be the base region 14.

A metal plug 94 may be provided inside the contact hole 54. The metal plug 94 may be formed of the same material as that of the emitter electrode 52 and may also be formed of tungsten. By forming the metal plug 94 with tungsten, a plurality of metal plugs 94 can be easily formed in the fine mesa section 60.

In each of the contact regions 15, a P type high concentration region 95 may be formed in a region that is in contact with the metal plug 94. The doping concentration of the high concentration region 95 is higher than the doping concentration of the contact region 15. Accordingly, contact resistance between the contact region 15 and the metal plug 94 can be reduced.

At least one first opening section 61 may be provided at a position at least partially overlapping any contact region 15 in the Z-axis direction. In the example of FIG. 24, all first opening sections 61 at least partially overlap any contact region 15.

Figure 25:
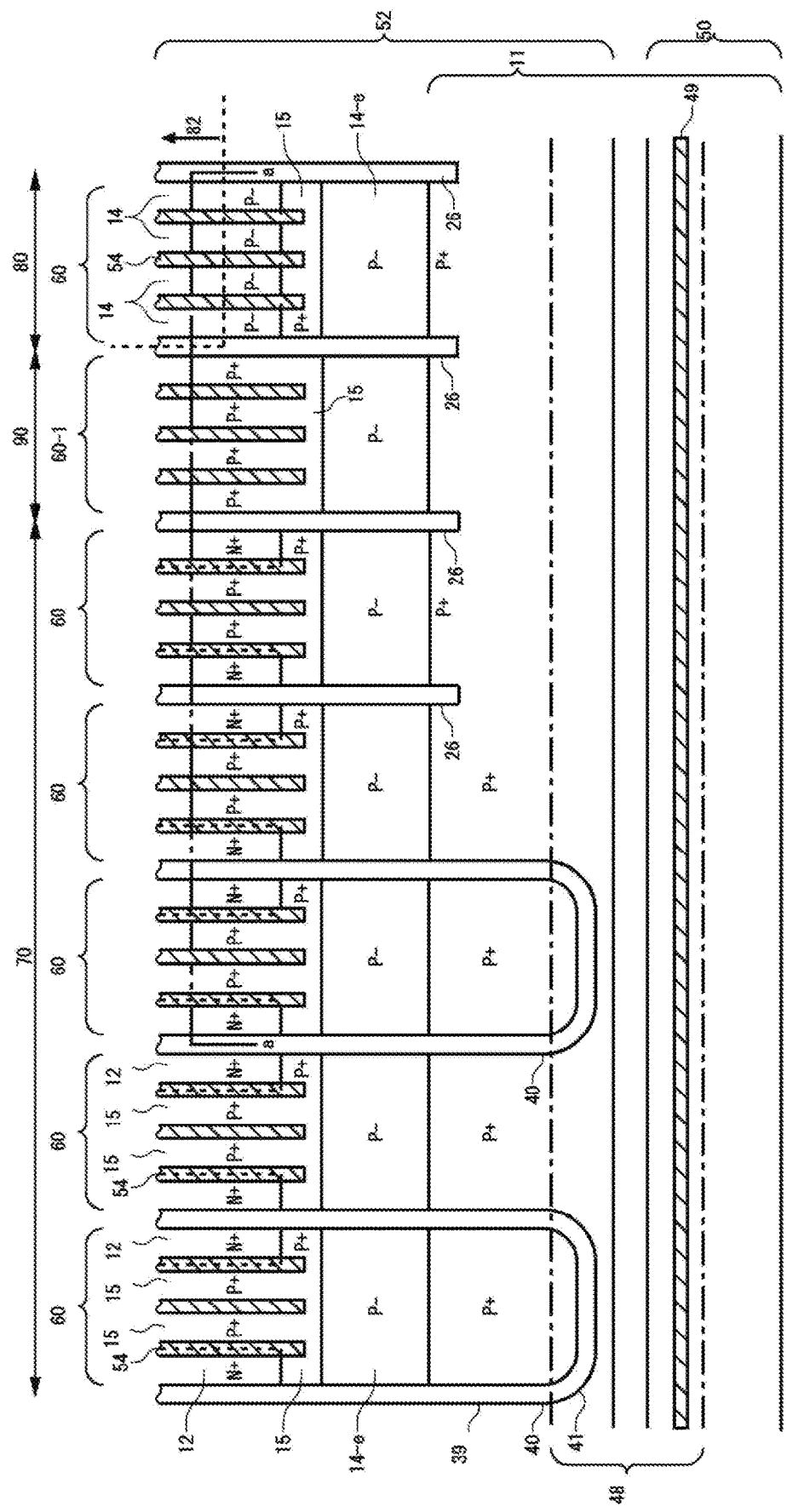
FIG. 25 is a drawing showing another example of the upper surface structure of the semiconductor device 100.

FIG. 25 is a drawing showing another example of the upper surface structure of the semiconductor device 100. The semiconductor device 100 of the present example includes a pillar region 26 instead of the dummy trench section 30 relative to the semiconductor device 100 described in FIG. 1 to FIG. 24. The pillar region 26 is a P type region formed inside the semiconductor substrate 10. The other structures may be the same as those of the semiconductor device 100 in any aspect described in FIG. 1 to FIG. 24. FIG. 25 shows a configuration in which the pillar region 26 is provided, instead of the dummy trench section 30, in the semiconductor device 100 shown in FIG. 1.

The pillar regions 26 are arrayed along the Y-axis direction. An interval in the Y-axis direction between the pillar regions 26 of the present example is the same as an interval between the extension portions 29 of the dummy trench section 30 described in FIG. 1 to FIG. 24. In another example, the interval in the Y-axis direction between the pillar regions 26 may be larger than and may also be smaller than the interval of the extension portions 39 of the gate trench section 40. The width in the Y-axis direction of the pillar region 26 may be the same as and may also be different from the width of the extension portion 39 of the gate trench section 40.

The shape in the pillar region 26 in the top view is a straight-line shape extending along the X-axis direction, as one example. The end portion in the X-axis direction of the pillar region 26 may be provided in the well region 11. In another example, the shape of the pillar region 26 in the top view may also be a U shape, similar to the dummy trench section 30.

Figure 26:
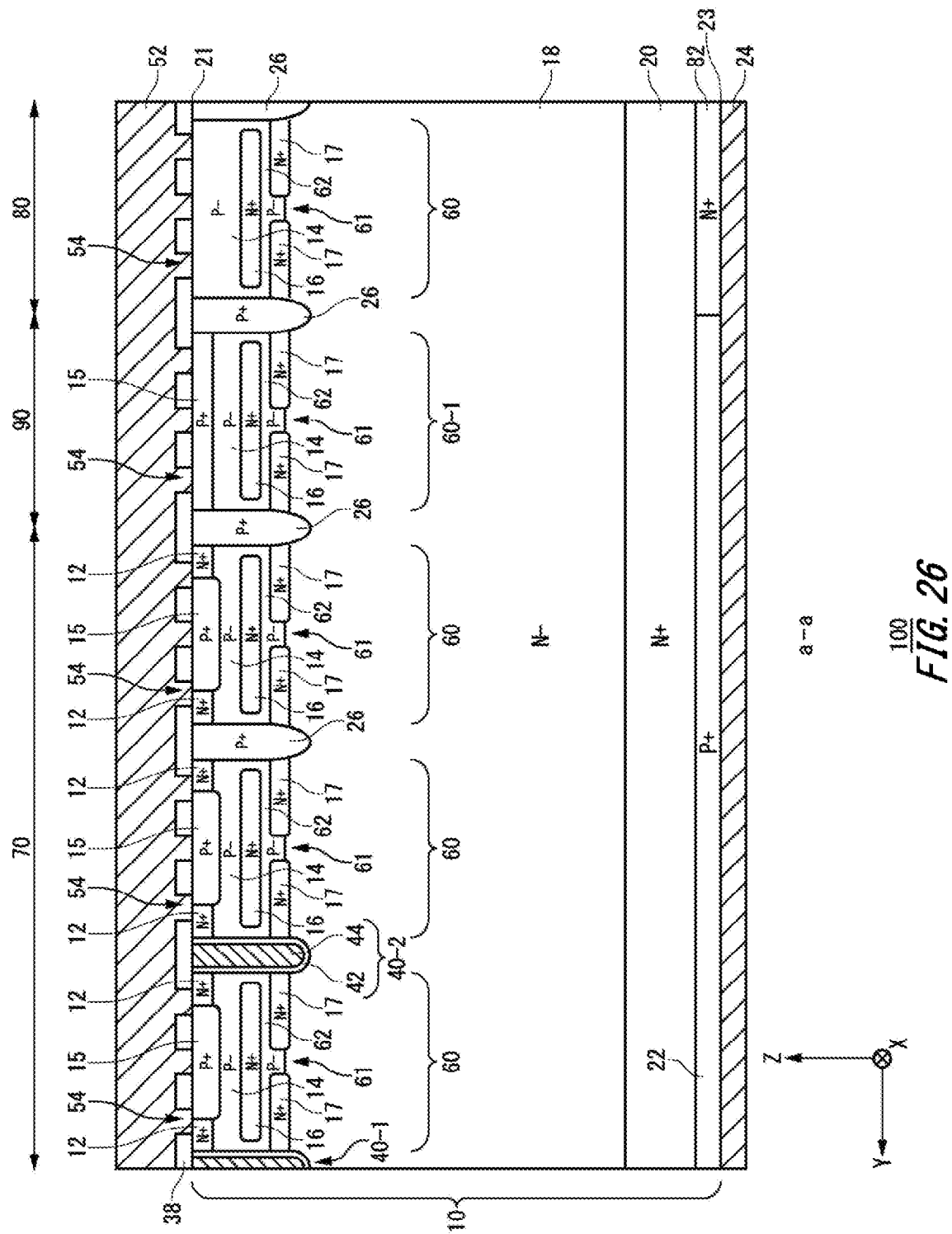
FIG. 26 is a drawing showing one example of the cross section taken along line a-a in FIG. 25.

FIG. 26 is a drawing showing one example of the cross section taken along line a-a in FIG. 25. In the semiconductor device 100 of the present example is, structures other than the pillar region 26 are the same as those in the semiconductor device 100 in any aspect described in FIG. 1 to FIG. 24.

The pillar region 26 is formed reaching the drift region 18 from the upper surface 21 of the semiconductor substrate 10. An upper end of the pillar region 26 may be covered by the interlayer dielectric film 38. That is, the pillar region 26 may not be connected to the emitter electrode 52.

At least a partial region of the pillar region 26 may be in contact with the base region 14. The pillar region 26 provided in the transistor section 70 may be sandwiched between N type high concentration regions having a higher doping concentration than the drift region 18 in the upper surface of the semiconductor substrate 10. The high concentration region in the present example is the emitter region 12. The pillar region 26 provided on the boundary between the transistor section 70 and the boundary section 90 may be in contact with the emitter region 12 on the transistor section 70 side and may be in contact with the contact region 15 on the boundary section 90 side.

The pillar region 26 may be formed to a position at the same depth as, may be formed at a position deeper than, and may also be formed to a position shallower than that of the gate trench section 40. A length in the Z-axis direction of the pillar region 26 may be equal to or more than 80% of and may be equal to or more than 120% of the length in the Z-axis direction of the gate trench section 40. However, it is preferable that the pillar region 26 is formed to a position deeper than the second accumulation region 17.

The pillar region 26 of the present example is P+ type and has a higher doping concentration than the base region 14. A peak value of the doping concentration of the pillar region 26 may be equal to or more than $5.0 \times 10^{17}/cm^3$ and may be equal to or less than $1.0 \times 10^{20}/cm^3$. The peak value of the doping concentration of the pillar region 26 may be the same as the peak value of the doping concentration of the contact region 15.

Even in such a configuration, the ON voltage of the transistor section 70 can be set lower, similar to the case where the dummy trench section 30 is provided. Also, by adjusting the ratio of the gate trench section 40 to the pillar region 26, the switching speed can also be adjusted. Also, because the dummy trench section 30 is not present, the screening test of the insulating film and the like of the dummy trench section 30 may not be performed. For this reason, the testing cost can be reduced.

Also, because wiring and pads for screening the dummy trench section 30 may not be formed on the semiconductor substrate 10, element regions such as the transistor section 70 and the diode section 80 in the semiconductor substrate 10 can be enlarged. Also, by sandwiching the pillar region 26 by high-concentration N type regions such as the emitter region 12, impedance of the pillar region 26 against holes can be increased and the holes can be suppressed from being extracted.

Figure 27:
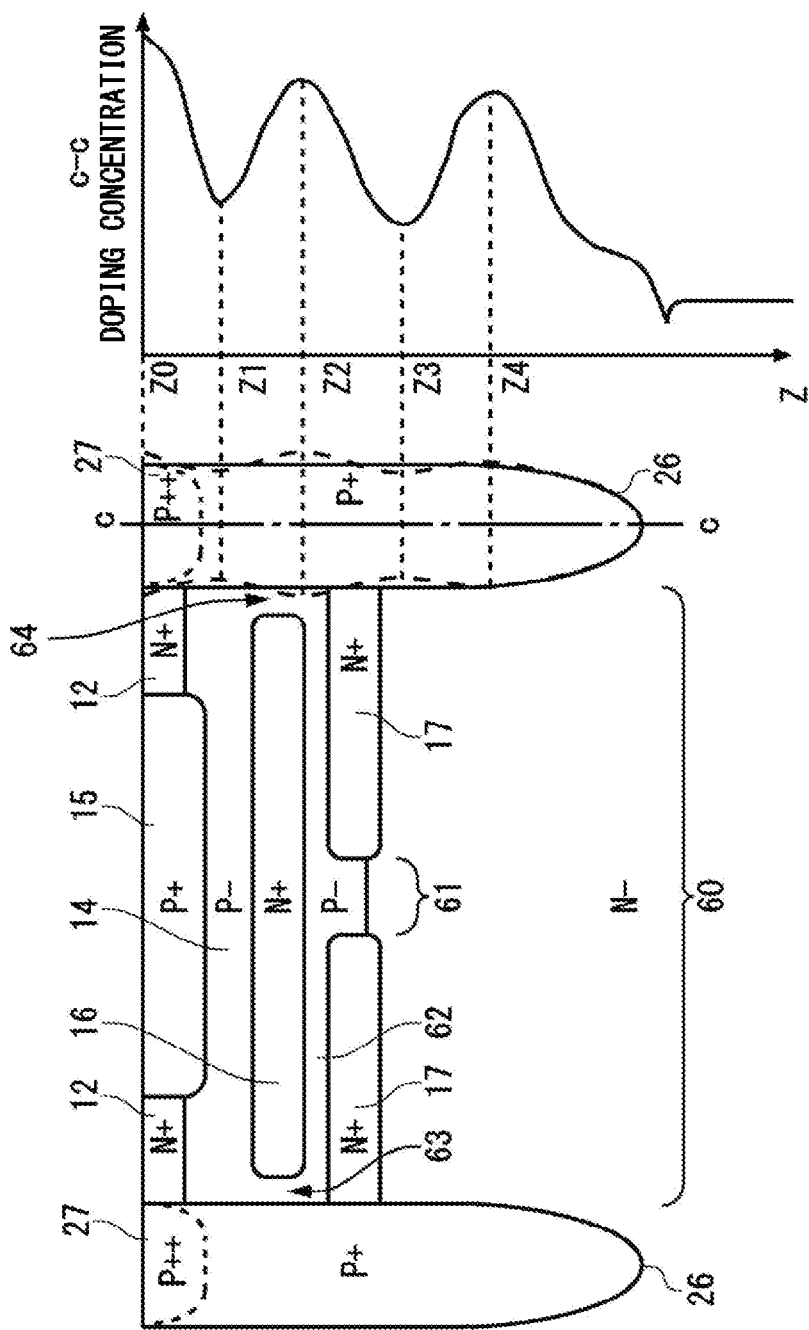
FIG. 27 is a drawing showing one example of the mesa section 60 of the transistor section 70 and a doping concentration distribution of the pillar region 26 in a Z-axis direction.

FIG. 27 is a drawing showing one example of the mesa section 60 of the transistor section 70, and the doping concentration distribution in the Z-axis direction of the pillar region 26. In the present example, the first gaps 63, 64 are provided between the first accumulation region 16 and the pillar region 26.

FIG. 27 shows the doping concentration distribution at a cross section c-c passing through a middle of the pillar region 26 in the Y-axis direction. The doping concentration distribution in the Z-axis direction of the pillar region 26 may have a plurality of peaks. In the example of FIG. 26, the doping concentration distribution has peaks at depth positions Z0, Z2 and Z4. The pillar region 26 may be formed by injecting P type impurities in different depth positions and performing thermal treatment. Accordingly, the pillar region 26 that is long in the depth direction can be easily formed.

Any of depth positions Z1, Z3 at which the doping concentration distribution of the pillar region 26 takes local minimum values may not overlap the emitter region 12, the first accumulation region 16 and the second accumulation region 17. That is, none of the depth positions Z1, Z3 is included in a range of the depth positions from the upper end to the lower end of the high-concentration N type region.

At least one of the depth positions Z0, Z2 and Z4 at which the doping concentration distribution are peak values may be positioned so as to overlap the emitter region 12, the first accumulation region 16 and the second accumulation region 17. That is, at least one of the depth positions Z0, Z2 and Z4 is included in the range of the depth positions from the upper end to the lower end of high-concentration N type region.

In the pillar region 26, by arranging a region having a low doping concentration so as not to face the high-concentration N type region, N type impurities can be suppressed from being diffused within the pillar region 26. For this reason, the width in the Y-axis direction of the pillar region 26 can be maintained at a certain value or more.

The maximum value of the doping concentration of the pillar region 26 may be arranged at the position facing the emitter region 12. In the upper end of the pillar region 26, the high concentration region 27 having a higher doping concentration than those of the other regions may be provided. The pillar region 26 may not be in contact with the first accumulation region 16 and the second accumulation region 17. In this case, the base region 14 is provided between the pillar region 26 and each accumulation region. As the distance from the upper surface of the semiconductor substrate 10 to the pillar region 26 is large, the peak value of the doping concentration of the pillar region 26 may be small. In another example, the peak values of the doping concentration of the pillar region 26 may also be the same.

As the pillar region 26 shown by the dashed line in FIG. 27, the width in the Y-axis direction of the pillar region 26 may be locally wide in accordance with the peak positions of the doping concentration. Also, in accordance with the positions of the local minimum values of the doping concentration, the width in the Y-axis direction of the pillar region 26 may be locally narrow. The phrase "locally narrow" may mean that the width in the Y-axis direction of the pillar region 26 is narrower compared to the width of the depth of the peak position of the doping concentration. Note that each of the pillar regions 26 may have a shape as shown by the dashed line in FIG. 27.

Furthermore, the depths of the second accumulation region 17 and the first accumulation region 16 may be set to be approximately the same as a depth at which the width of the pillar region 26 is locally narrow. Accordingly, the first or second accumulation region having a relatively high doping concentration and the peak position of the pillar region 26 having a relatively high doping concentration can be prevented from forming the p-n junction. As a result, a local electric field strength increase at the p-n junction can be suppressed and the breakdown voltage can be highly ensured.

Figure 28:
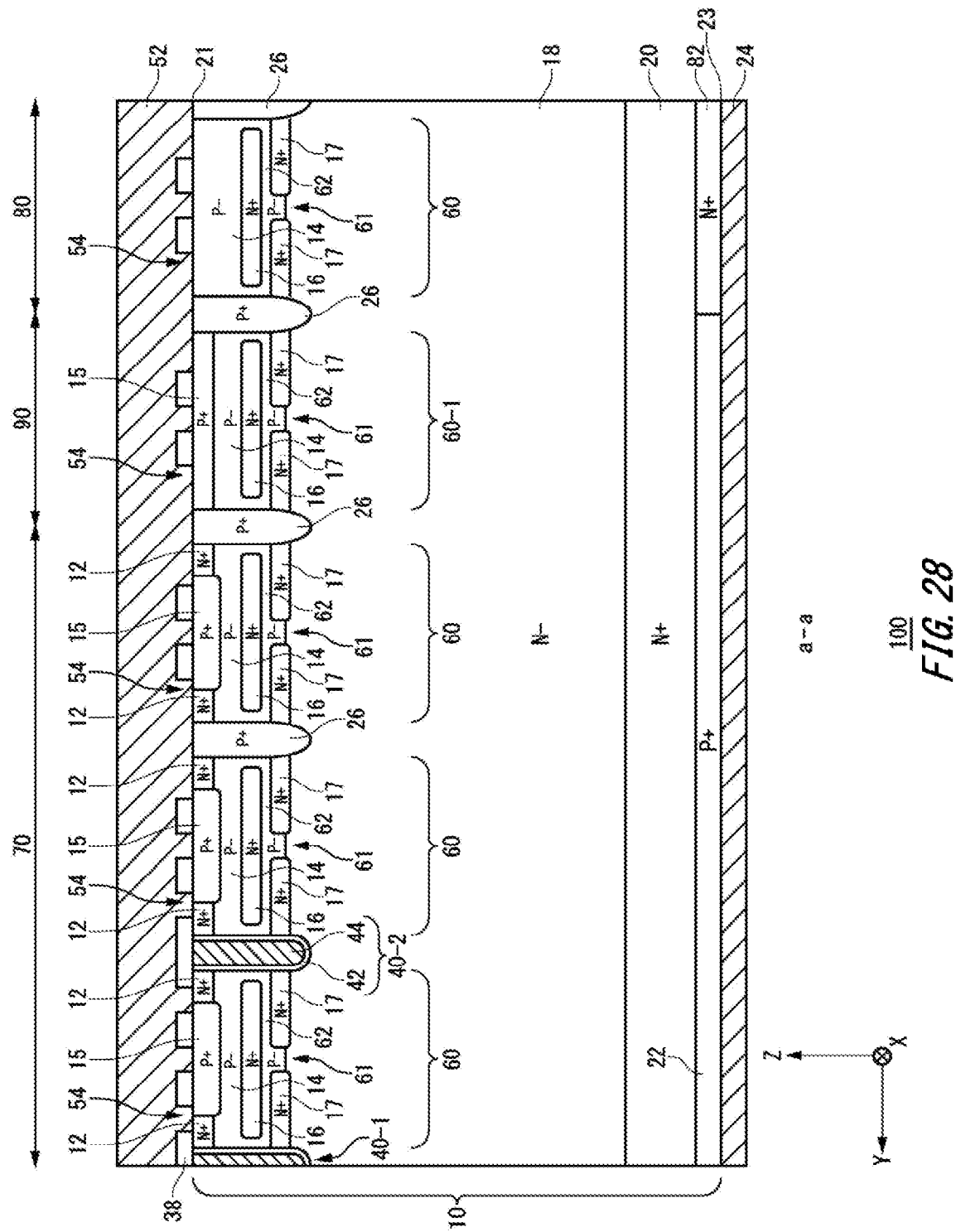
FIG. 28 is a drawing showing another example of the cross section taken along line a-a in FIG. 25.

FIG. 28 is a drawing showing another example of the cross section taken along line a-a in FIG. 25. The semiconductor device 100 of the present example is different from the example of FIG. 26 in the following respect: the upper end of the pillar region 26 is not covered by the interlayer dielectric film 38. The other structures may be the same as those of the semiconductor device 100 in any aspect described in FIG. 26 and FIG. 27. In this case, the holes can be injected in and extracted from the drift region 18 via the pillar region 26.

Figure 29:
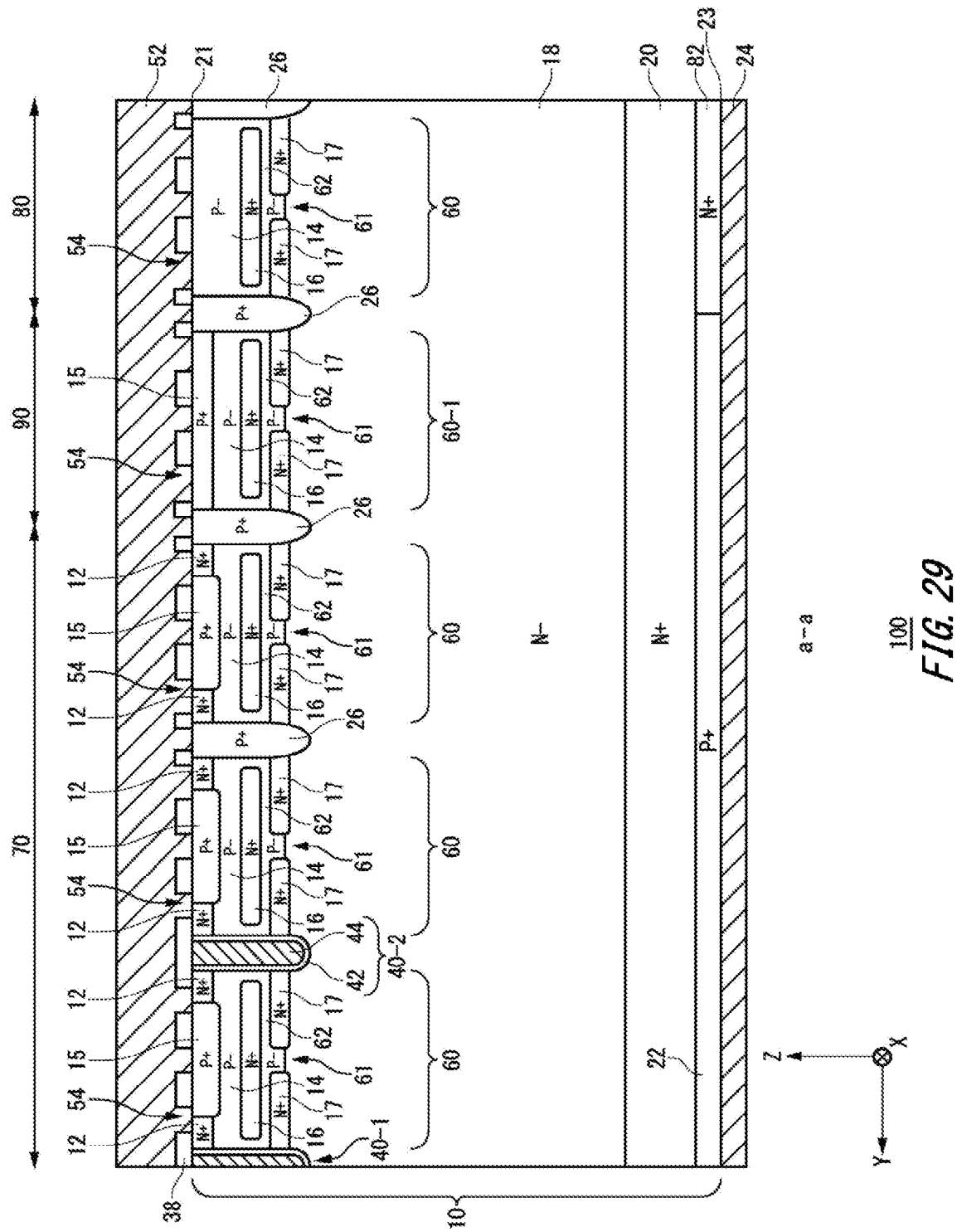
FIG. 29 is a drawing showing another example of the cross section taken along line a-a in FIG. 25.

FIG. 29 is a drawing showing another example of the cross section taken along line a-a in FIG. 25. The semiconductor device 100 of the present example is different from the example of FIG. 26 in the following respect: a part of the upper end of the pillar region 26 is not covered by the interlayer dielectric film 38. That is, the upper end of the pillar region 26 is connected to the emitter electrode 52. The other structures may be the same as those of the semiconductor device 100 in any aspect described in FIG. 26 and FIG. 27. In this case as well, the holes can be injected in and extracted from the drift region 18 via the pillar region 26.

Figure 30:
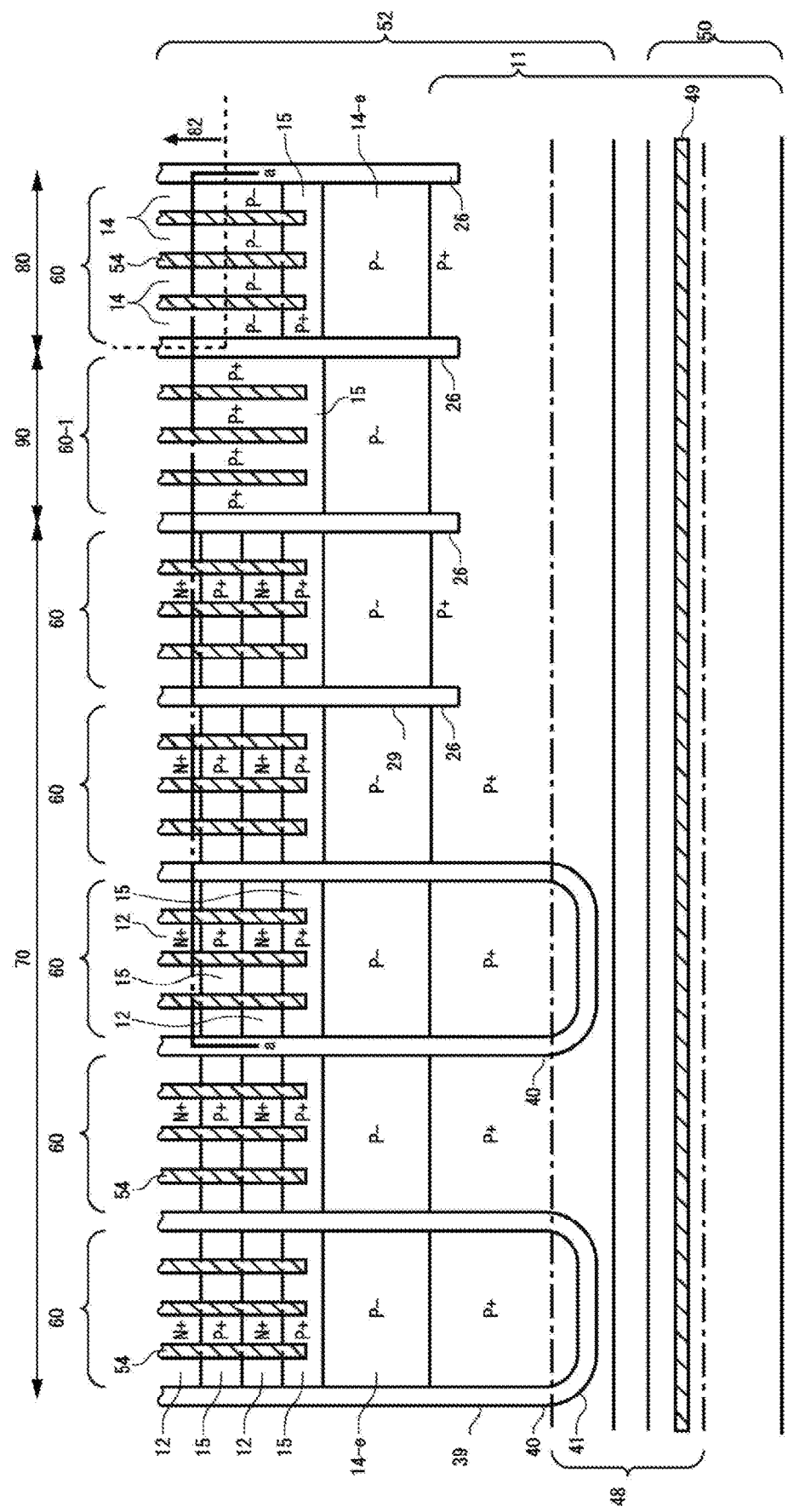
FIG. 30 is a drawing showing another example of the upper surface structure of the semiconductor device 100.

FIG. 30 is a drawing showing another example of the upper surface structure of the semiconductor device 100. In the semiconductor device 100 of the present example, the structure of the transistor section 70 is different from that in the semiconductor device 100 shown in FIG. 25. The structure of the transistor section 70 of the present example is the same as that of the transistor section 70 shown in FIG. 9. The structures other than the transistor section 70 are the same as those in the semiconductor device 100 described in FIG. 25 to FIG. 29.

Figure 31:
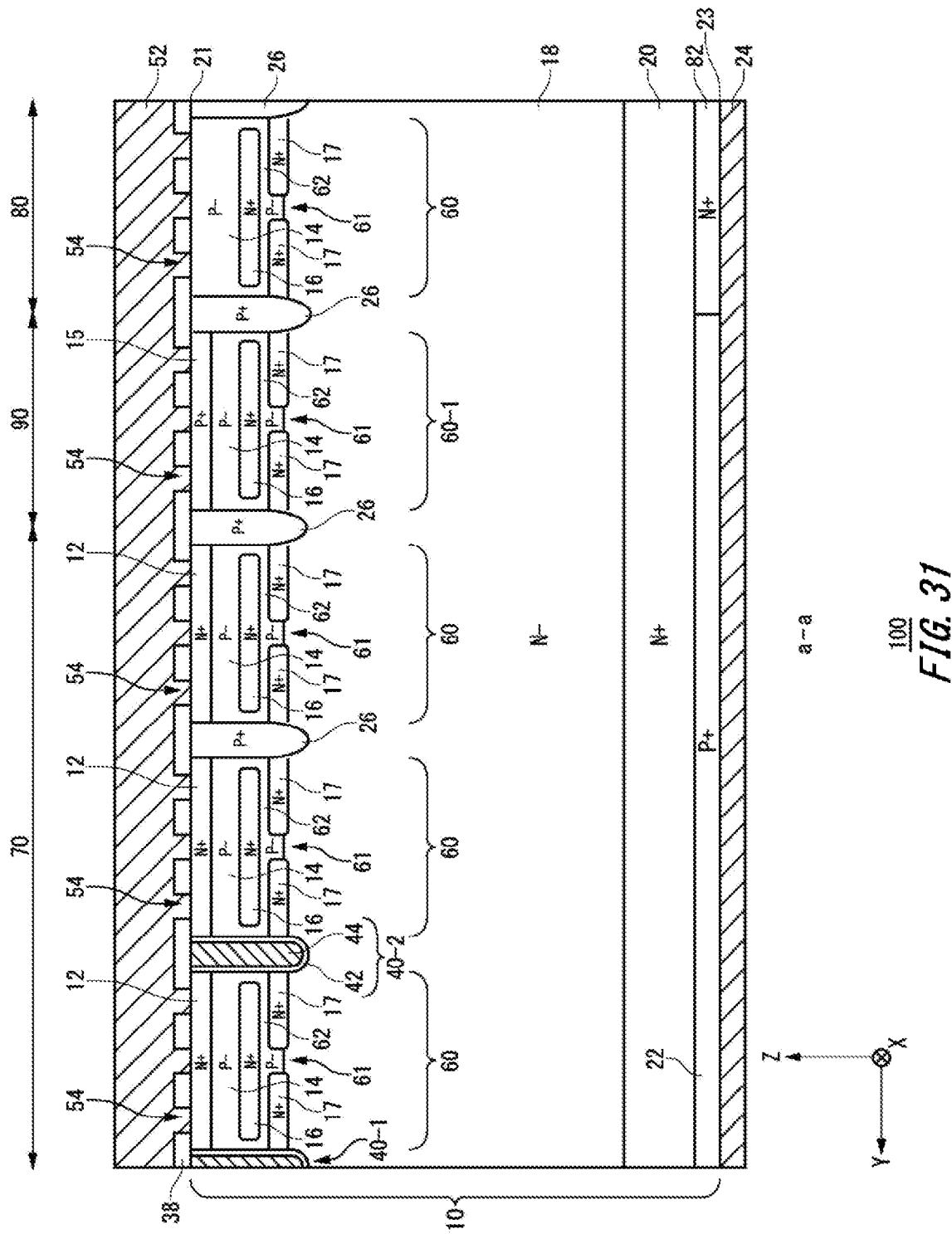
FIG. 31 is a drawing showing one example of the cross section taken along line a-a in FIG. 30.

FIG. 31 is a drawing showing one example of the cross section taken along line a-a in FIG. 30. In the semiconductor device 100 of the present example, the structure of the transistor section 70 is different from that of the semiconductor device 100 shown in FIG. 26. The structure of the transistor section 70 of the present example is the same as that of the transistor section 70 shown in FIG. 10. The structures other than the transistor section 70 are the same as those in the semiconductor device 100 described in FIG. 26. Note that the semiconductor device 100 described in FIG. 25 to FIG. 31 may not include the first accumulation region 16 and the second accumulation region 17.

Figure 32:
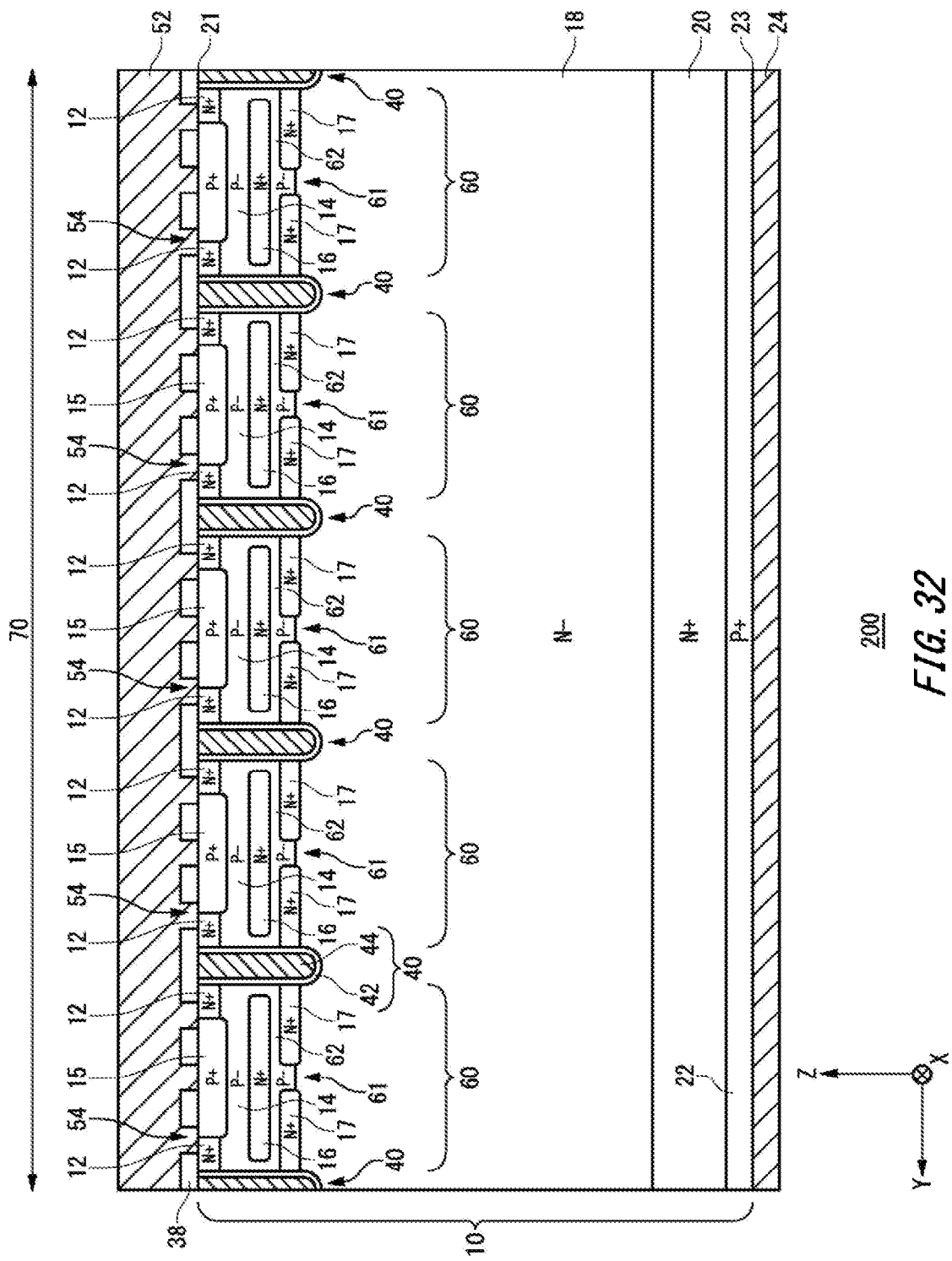
FIG. 32 is a drawing showing the Y-Z cross section of one example of a semiconductor device 200 according to an embodiment of the present invention.

FIG. 32 is a drawing showing the Y-Z cross section of one example of the semiconductor device 200 according to an embodiment of the present invention. The semiconductor device 200 includes the transistor section 70 described in FIG. 1 to FIG. 31. The semiconductor device 200 does not include the diode section 80 and the boundary section 90. The transistor section 70 is the same as the transistor section 70 in any aspect described in FIG. 1 to FIG. 31.

Figure 33:
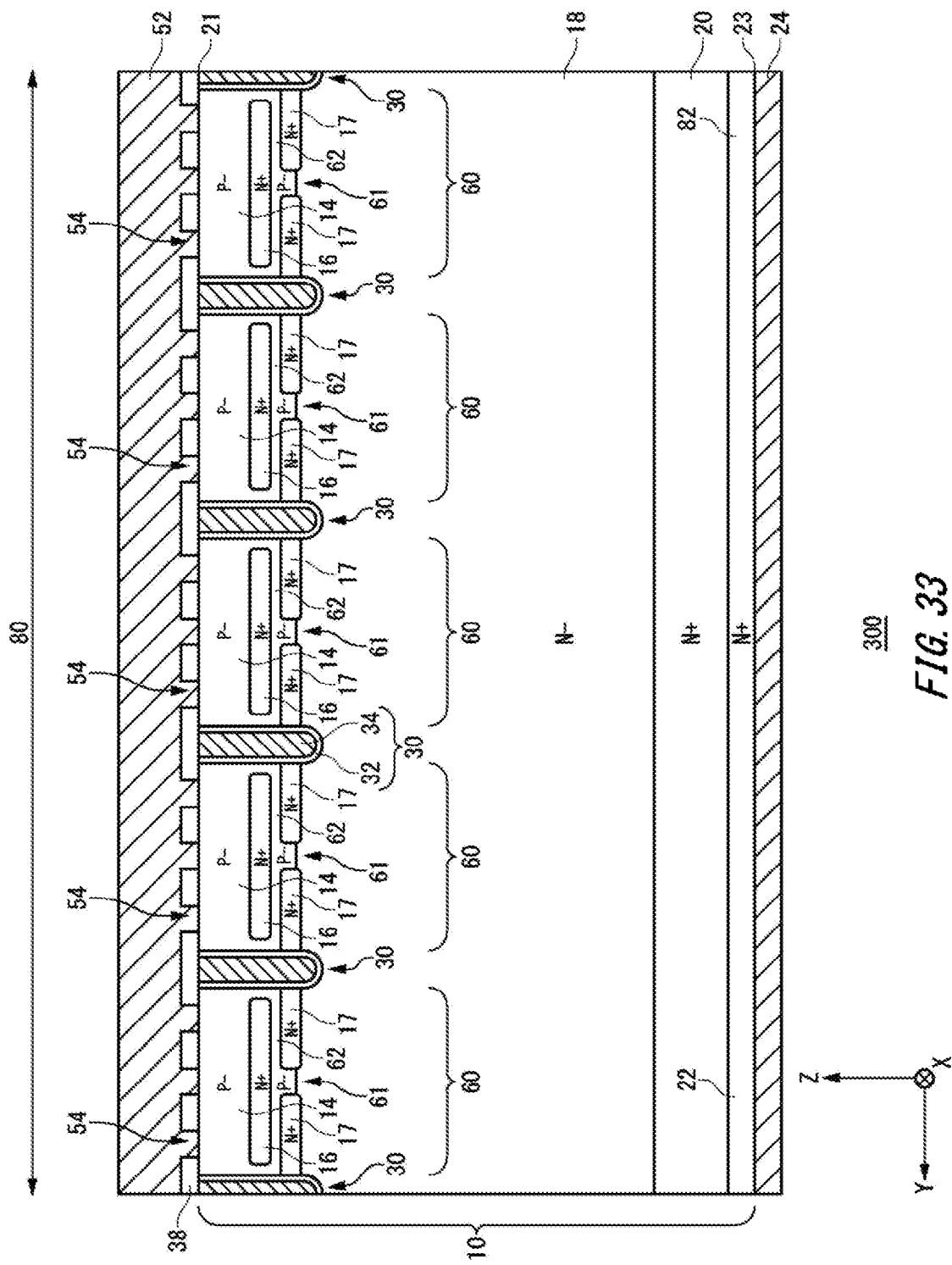
FIG. 33 is a drawing showing the Y-Z cross section of one example of a semiconductor device 300 according to an embodiment of the present invention.

FIG. 33 is a drawing showing the Y-Z cross section of one example of the semiconductor device 300 according to an embodiment of the present invention. The semiconductor device 300 includes the diode section 80 described in FIG. 1 to FIG. 31. The semiconductor device 300 does not include the transistor section 70 and the boundary section 90. The diode section 80 is the same as the diode section 80 in any aspect described in FIG. 1 to FIG. 31.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . semiconductor substrate; 11 . . . well region; 12 . . . emitter region; 14 . . . base region; 15 . . . contact region; 16 . . . first accumulation region; 17 . . . second accumulation region; 18 . . . drift region; 19 . . . adjusting region; 20 . . . buffer region; 21 . . . upper surface; 22 . . . collector region; 23 . . . lower surface; 24 . . . collector electrode; 25 . . . connecting section; 26 . . . pillar region; 27 . . . high concentration region; 29 . . . extension portion; 30 . . . dummy trench section; 31 . . . connected portion; 32 . . . dummy insulating film; 34 . . . dummy conductive section; 38 . . . interlayer dielectric film; 39 . . . extension portion; 40 . . . gate trench section; 41 . . . connected portion; 42 . . . gate insulating film; 44 . . . gate conductive section; 46 . . . upper portion; 47 . . . lower portion; 48 . . . gate runner; 49 . . . contact hole; 50 . . . gate metal layer; 52 . . . emitter electrode; 54 . . . contact hole; 56 . . . contact hole; 60 . . . mesa section; 61 . . . first opening section; 62 . . . intermediate region; 63 . . . first gap; 64 . . . second gap; 65 . . . shortest path; 66 . . . end portion; 67 . . . end portion; 68 . . . second opening section; 70 . . . transistor section; 72 . . . thin film portion; 74 . . . thick film section; 80 . . . diode section; 82 . . . cathode region; 84 . . . floating region; 85 . . . third opening section; 90 . . . boundary section; 91, 92, 93 . . . portion; 94 . . . metal plug; 95 . . . high concentration region; 100 . . . semiconductor device; 200 . . . semiconductor device; 300 . . . semiconductor device

What is claimed is:

1. A semiconductor device comprising:
a semiconductor substrate that has a drift region of a first conductivity type;
a first trench section that is provided from an upper surface of the semiconductor substrate to inside the semiconductor substrate;
a second trench section that is provided from an upper surface of the semiconductor substrate to inside the semiconductor substrate that faces the first trench section;
a mesa width direction M refers to a direction connecting the first trench section and the second trench section;
a first emitter region and a second emitter region of the first conductivity type provided along the upper surface of the semiconductor substrate;
a contact region of a second conductivity type provided along the upper surface of the semiconductor substrate; wherein
the contact region is sandwiched between the first emitter region and the second emitter region, such that the contact region, the first emitter region and the second emitter region are between the first trench section and the second trench section along the upper surface of the semiconductor substrate, in the mesa width direction M;
a base region of the second conductivity type that is provided in direct contact with the first trench section between the upper surface of the semiconductor substrate and the drift region;
a first accumulation region of the first conductivity type that is provided between the base region and the drift region and that has a higher doping concentration than the drift region; and a second accumulation region of the first conductivity type that is provided at a position deeper than the first accumulation region and that has a higher doping concentration than the drift region; and
an intermediate region of the second conductivity type that is provided between the first accumulation region and the second accumulation region,
the second accumulation region has a first opening section that is provided at a position deeper than the first accumulation region, wherein
the first accumulation region is located above the first opening section;
a first gap between the first accumulation region and the second trench section, where the first gap is smaller than a width of the first emitter region;
a second gap between the first accumulation region and the first trench section, where the second gap is smaller than a width of the second emitter region;
a width of the first opening section is smaller than a width of the contact region and,
the width of the first opening section is smaller than a width of the first accumulation region in the mesa width direction;
the first accumulation region is located above the second accumulation region such that the first gap, the first accumulation region, and the second gap, altogether extend across the entire mesa width M.

2. The semiconductor device according to claim 1, wherein
the second accumulation region overlaps the first gap in a depth direction of the semiconductor substrate, and
the first opening section is provided at a position so as not to overlap the first gap.

3. The semiconductor device according to claim 2, wherein
the second accumulation region overlaps the second gap in the depth direction of the semiconductor substrate, and
the first opening section is provided at a position so as not to overlap the second gap in the depth direction of the semiconductor substrate.

4. The semiconductor device according to claim 3, wherein
the first trench section and the second trench section are gate trench sections, and
the first emitter region is in direct contact with the second gate trench section;
the second emitter region is in direct contact with the first gate trench section; and
the first emitter region and the second emitter region have a higher doping concentration than the drift region.

5. The semiconductor device according to claim 3, wherein
when a mesa section refers to a region that is sandwiched between the first trench section and the second trench section and is inside the semiconductor substrate, and
a width of the first opening section is smaller than a width of the second accumulation region in the mesa width direction.

6. The semiconductor device according to claim 5, wherein
the first opening section is arranged such that a middle in the mesa width direction of the mesa section is positioned within the first opening section.

7. The semiconductor device according to claim 1, wherein
the intermediate region overlaps the first opening section in a depth direction of the semiconductor substrate.

8. The semiconductor device according to claim 7, wherein
the intermediate region is also provided inside the first opening section.

9. The semiconductor device according to claim 7, wherein
the intermediate region is provided passing through the first opening section and protruding downward beyond the second accumulation region.

10. The semiconductor device according to claim 1, wherein
the intermediate region is arranged so as not to overlap the first opening section in a depth direction of the semiconductor substrate.

11. The semiconductor device according to claim 1, wherein
the second accumulation region is provided in contact with both of the first trench section and the second trench section, and
the first accumulation region has a second opening section in a region overlapping the first opening section.

12. The semiconductor device according to claim 5, wherein
when in the mesa width direction, L1 refers to a width of the first gap and M refers to a width of the mesa section, $0<L1/M\leq0.1$.

13. The semiconductor device according to claim 5, wherein
the first trench section is provided extending along a predetermined extension direction in the upper surface of the semiconductor substrate,
the first trench section has, on a cross section perpendicular to the extension direction, an upper portion that has a side wall formed in a straight-line shape, and a lower portion that is provided below the upper portion and that has a side wall formed in a curved shape, and
when X refers to a distance of a shortest path connecting an upper end of the lower portion of the first trench section and the intermediate region not passing through the second accumulation region on a cross section perpendicular to the extension direction, and M refers to a width of the mesa section, $M/2<X$.

14. The semiconductor device according to claim 5, wherein
when in the mesa width direction, L1 refers to a width of the first gap and L2 refers to a width of the first opening section, $L1<L2$.

15. The semiconductor device according to claim 5, wherein
when in the mesa width direction, L3 refers to a distance between the first gap and the first opening section and M refers to a width of the mesa section, $0.9\times M/2\leq L3$.

16. The semiconductor device according to claim 5, wherein
a width of the first opening section in the mesa width direction is larger than a thickness of the intermediate region in the depth direction perpendicular to the upper surface of the semiconductor substrate.

17. The semiconductor device according to claim 4, wherein
in a depth direction perpendicular to the upper surface of the semiconductor substrate, a thickness of the base region provided below the emitter region is larger than a thickness of the intermediate region.

18. The semiconductor device according to claim 1, wherein
in a depth direction perpendicular to the upper surface of the semiconductor substrate, a thickness of the first accumulation region is larger than a thickness of the intermediate region.

19. The semiconductor device according to claim 1, wherein
in a depth direction perpendicular to the upper surface of the semiconductor substrate, a thickness of the second accumulation region is larger than a thickness of the intermediate region.

20. The semiconductor device according to claim 4, wherein
the semiconductor substrate includes a transistor section that includes the gate trench section, and a diode section in which a diode is formed,
the diode section has a plurality of dummy trench sections provided from the upper surface of the semiconductor substrate to inside the semiconductor substrate, and
when a mesa section refers to a region sandwiched between the dummy trench sections and inside the semiconductor substrate of the diode section, the mesa section of the diode section has the base region, the first accumulation region, the second accumulation region and the intermediate region.

21. The semiconductor device according to claim 20, wherein
the semiconductor substrate further comprises a boundary mesa section that is arranged between the transistor section and the diode section,
the boundary mesa section has the base region, the first accumulation region, the second accumulation region and the intermediate region, and
a width of the first opening section in the boundary mesa section is larger than a width of the first opening section in any one of the mesa sections of the transistor section.

22. The semiconductor device according to claim 20, wherein
a width of the first opening section in the mesa section of the diode section is larger than a width of the first opening section in the mesa section of the transistor section.

23. The semiconductor device according to claim 20, further comprising:
a collector electrode arranged on a lower surface of the semiconductor substrate;
a collector region of the second conductivity type that is provided inside the semiconductor substrate of the transistor section and is electrically connected to the collector electrode;
a cathode region of the first conductivity type that is provided inside the semiconductor substrate of the diode section and is electrically connected to the collector electrode; and
a floating region of the second conductivity type that is formed inside the semiconductor substrate above the cathode region and not in contact with the collector electrode.

24. The semiconductor device according to claim 23, wherein
the floating region has a third opening section, and
the third opening section is positioned so as to overlap the first opening section that is provided in the second accumulation region of the diode section.

25. The semiconductor device according to claim 20, wherein
a number of the first opening section provided in the second accumulation region of the diode section is larger than a number of the first opening section provided in the second accumulation region of the transistor section.

26. The semiconductor device according to claim 25, wherein
when a mesa section refers to a region sandwiched between two of the dummy trench sections inside the semiconductor substrate, and a mesa width direction refers to a direction connecting two of the dummy trench sections,
a plurality of first opening sections are arranged along the mesa width direction in the second accumulation region of the diode section.

27. The semiconductor device according to claim 26, wherein
among the plurality of first opening sections arranged along the mesa width direction in the second accumulation region of the diode section, a width of the first opening section that is closest to the dummy trench section is larger than a width of the first opening section that is farthest from the dummy trench section.

28. The semiconductor device according to claim 26, wherein
on the upper surface of the semiconductor substrate in the mesa section of the diode section, a contact region of the second conductivity type and an adjusting region having a smaller hole mobility than the contact region are alternately arranged along a direction perpendicular to the mesa width direction, and
the first opening section that is, among the plurality of first opening sections arranged along the mesa width direction in the second accumulation region of the diode section, closest to the dummy trench section is arranged discretely along a direction perpendicular to the mesa width direction so as to overlap the contact region.

29. The semiconductor device according to claim 1, wherein
the semiconductor substrate further comprises a diode section in which a diode is formed, and
the diode section has:
the base region;
the first accumulation region;
the second accumulation region;
the intermediate region; and
a pillar region of the second conductivity type that is in contact with the base region, which is formed from the upper surface of the semiconductor substrate to the drift region, and that has a higher doping concentration than the base region.

30. The semiconductor device according to claim 29, wherein
in the upper surface of the semiconductor substrate, the pillar region is sandwiched between high concentration regions having a higher doping concentration than the drift region.

31. The semiconductor device according to claim 29, wherein
a doping concentration distribution of the pillar region in a depth direction of the semiconductor substrate has a plurality of peaks.

32. The semiconductor device according to claim 31, wherein
a depth position at which the doping concentration distribution of the pillar region takes a local minimum value does not overlap the second accumulation region.

33. The semiconductor device according to claim 29, wherein
- a peak value of a doping concentration of the pillar region is equal to or more than $5.0 \times 10^{17}/cm^3$ and equal to or less than $1.0 \times 10^{20}/cm^3$.

34. The semiconductor device according to claim 1, wherein
- a mesa section refers to a region sandwiched between the first trench section and the second trench section inside the semiconductor substrate, and a direction connecting the first trench section and a mesa width direction refers to the second trench section,
- the first opening section is arranged such that a middle in the mesa width direction of the mesa section is positioned within the first opening section, and
- the first accumulation region and the second accumulation region are overlapped with each other between the first opening section and the first gap.

* * * * *